United States Patent
Sugioka et al.

(10) Patent No.: US 11,764,164 B2
(45) Date of Patent: Sep. 19, 2023

(54) SEMICONDUCTOR DEVICE AND METHOD OF FORMING THE SAME

(71) Applicant: MICRON TECHNOLOGY, INC., Boise, ID (US)

(72) Inventors: Shigeru Sugioka, Higashihiroshima (JP); Keizo Kawakita, Higashihiroshima (JP); Hidenori Yamaguchi, Higashihiroshima (JP); Bang Ning Hsu, Tainan (TW)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 16/902,007

(22) Filed: Jun. 15, 2020

(65) Prior Publication Data
US 2021/0391279 A1 Dec. 16, 2021

(51) Int. Cl.
*H01L 23/00* (2006.01)
*H01L 21/311* (2006.01)
*H10B 12/00* (2023.01)

(52) U.S. Cl.
CPC ...... *H01L 23/562* (2013.01); *H01L 21/31144* (2013.01); *H10B 12/31* (2023.02)

(58) Field of Classification Search
CPC .... H01L 21/3043; H01L 21/78; H01L 23/562
See application file for complete search history.

(56) References Cited

U.S. PATENT DOCUMENTS

| | | | | |
|---|---|---|---|---|
| 7,417,304 | B2* | 8/2008 | Tsutsue | H01L 23/564 |
| | | | | 257/E21.523 |
| 7,453,128 | B2* | 11/2008 | Tsutsue | H01L 23/3192 |
| | | | | 257/E23.142 |
| 2002/0055256 | A1 | 5/2002 | Jiang | |
| 2003/0143819 | A1* | 7/2003 | Hedler | H01L 21/78 |
| | | | | 257/E21.599 |
| 2010/0059895 | A1* | 3/2010 | Wakisaka | H01L 21/78 |
| | | | | 257/E23.145 |
| 2010/0181650 | A1* | 7/2010 | Shigihara | H01L 24/11 |
| | | | | 257/E23.179 |
| 2013/0181329 | A1* | 7/2013 | Wada | H01L 23/585 |
| | | | | 257/620 |
| 2015/0287687 | A1* | 10/2015 | Farrens | H01L 21/2855 |
| | | | | 257/737 |
| 2016/0079204 | A1* | 3/2016 | Matsubara | H01L 21/565 |
| | | | | 438/114 |

(Continued)

OTHER PUBLICATIONS

U.S. Appl. No. 17/230,772, titled "Scribe Structure for Memory Device", filed Apr. 14, 2021.

(Continued)

*Primary Examiner* — Bac H Au
(74) *Attorney, Agent, or Firm* — Dorsey & Whitney LLP

(57) ABSTRACT

A semiconductor device includes a semiconductor substrate; and a multilevel wiring structure on the semiconductor substrate, the multilevel wiring structure including at least an intermediate metal layer over the semiconductor substrate and an uppermost metal layer over the intermediate metal layer, and the multilevel wiring structure being divided into a main circuit portion and a scribe portion surrounding the main circuit portion; wherein the scribe portion of the multilevel wiring layer includes at least a metal pad exposed in the intermediate metal layer.

14 Claims, 50 Drawing Sheets

(56) References Cited

U.S. PATENT DOCUMENTS

| | | | |
|---|---|---|---|
| 2016/0365340 A1* | 12/2016 | Tajima | H01L 23/5389 |
| 2017/0256638 A1* | 9/2017 | MacElwee | H01L 21/3043 |
| 2019/0035750 A1* | 1/2019 | Han | H01L 22/34 |
| 2020/0312715 A1* | 10/2020 | Choi | H01L 23/3157 |

OTHER PUBLICATIONS

U.S. Appl. No. 17/230,827, titled "Scribe Structure for Memory Device", filed Apr. 14, 2021.

* cited by examiner

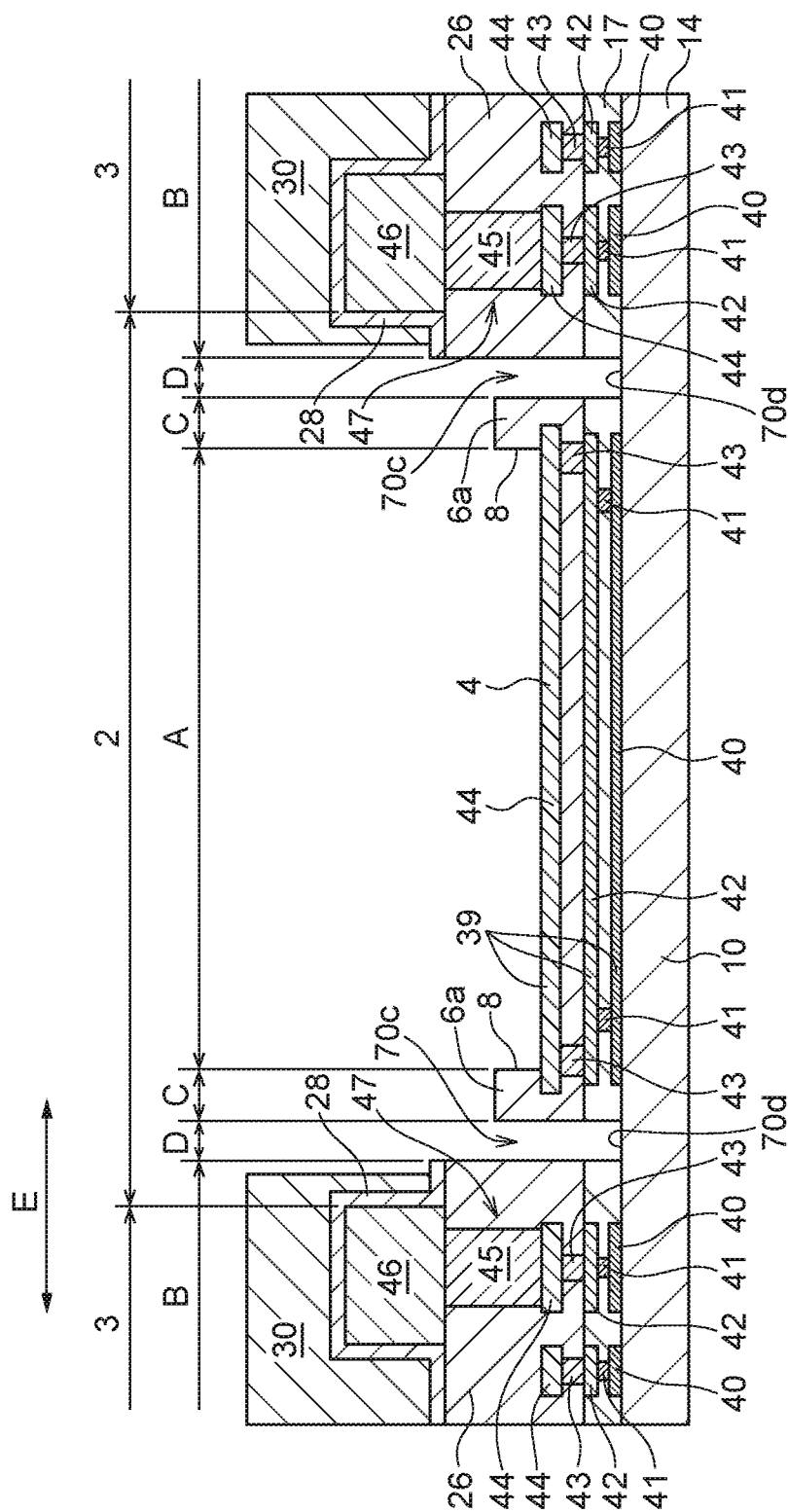

SEMICONDUCTOR DEVICE AND METHOD OF FORMING THE SAME

BACKGROUND

For example, in a semiconductor device such as dynamic random-access memory (hereinafter referred to as DRAM), a low-k insulating film having a low dielectric constant between metal interconnects is provided in some cases to reduce the capacitance between interconnects and achieve high-speed operation of the electric circuit. SiOC and SiCN for example are used as films with a low dielectric constant. In the following description, these films with a low dielectric constant are referred to as low-k insulating films. Low-k insulating films have lower adhesion than silicon oxide films and silicon nitride films, and the material is also brittle. For these reasons, when a semiconductor wafer on which semiconductor elements such as DRAM are formed is diced to separate the semiconductor elements into individual semiconductor chips, cracks produced by dicing sometimes propagate in the low-k insulating film and the film interface (SiO2/SiOC, SiOC/SiCN, SiCN/SiO2) and reach the main circuit portion of the semiconductor device, thereby reducing the yield of the semiconductor device.

BRIEF DESCRIPTION OF THE DRAWINGS

FIG. 4A is a longitudinal section illustrating a schematic configuration of the portion along the line S-S in FIG. 3, and FIG. 4B is a longitudinal section illustrating a schematic configuration of the portion along the line T-T in FIG. 3. In addition, FIGS. 4A and 4B are longitudinal sections illustrating a method of forming the semiconductor device according to the first embodiment, and are diagrams illustrating one example of a step following FIGS. 11A and 11B.

FIG. 6A is a longitudinal section illustrating a schematic configuration of the portion along the line S-S in FIG. 3, and FIG. 6B is a longitudinal section illustrating a schematic configuration of the portion along the line T-T in FIG. 3.

FIG. 7A is a longitudinal section illustrating a schematic configuration of the portion along the line S-S in FIG. 3, and FIG. 7B is a longitudinal section illustrating a schematic configuration of the portion along the line T-T in FIG. 3. FIGS. 7A and 7B are diagrams illustrating one example of a step following FIGS. 6A and 6B.

FIG. 9A is a longitudinal section illustrating a schematic configuration of the portion along the line S-S in FIG. 3, and FIG. 9B is a longitudinal section illustrating a schematic configuration of the portion along the line T-T in FIG. 3. FIGS. 9A and 9B are diagrams illustrating one example of a step following FIGS. 8A and 8B.

FIG. 10A is a longitudinal section illustrating a schematic configuration of the portion along the line S-S in FIG. 3, and FIG. 10B is a longitudinal section illustrating a schematic configuration of the portion along the line T-T in FIG. 3. FIGS. 10A and 10B are diagrams illustrating one example of a step following FIGS. 9A and 9B.

FIG. 11A is a longitudinal section illustrating a schematic configuration of the portion along the line S-S in FIG. 3, and FIG. 11B is a longitudinal section illustrating a schematic configuration of the portion along the line T-T in FIG. 3. FIGS. 11A and 11B are diagrams illustrating one example of a step following FIGS. 10A and 10B.

FIG. 12A is a longitudinal section illustrating a schematic configuration of the portion along the line S-S in FIG. 3, and FIG. 12B is a longitudinal section illustrating a schematic configuration of the portion along the line T-T in FIG. 3. In addition, FIGS. 12A and 12B are longitudinal sections illustrating a method of forming the semiconductor device according to the second embodiment, and are diagrams illustrating one example of a step following FIGS. 15A and 15B.

FIG. 13A is a longitudinal section illustrating a schematic configuration of the portion along the line S-S in FIG. 3, and FIG. 13B is a longitudinal section illustrating a schematic configuration of the portion along the line T-T in FIG. 3. FIGS. 13A and 13B are diagrams illustrating one example of a step following FIGS. 6A and 6B.

FIG. 14A is a longitudinal section illustrating a schematic configuration of the portion along the line S-S in FIG. 3, and FIG. 14B is a longitudinal section illustrating a schematic configuration of the portion along the line T-T in FIG. 3. FIGS. 14A and 14B are diagrams illustrating one example of a step following FIGS. 13A and 13B.

FIG. 15A is a longitudinal section illustrating a schematic configuration of the portion along the line S-S in FIG. 3, and FIG. 15B is a longitudinal section illustrating a schematic configuration of the portion along the line T-T in FIG. 3. FIGS. 15A and 15B are diagrams illustrating one example of a step following FIGS. 14A and 14B.

FIG. 16A is a longitudinal section illustrating a schematic configuration of the portion along the line S-S in FIG. 3, and FIG. 16B is a longitudinal section illustrating a schematic configuration of the portion along the line T-T in FIG. 3. In addition, FIGS. 16A and 16B are longitudinal sections illustrating a method of forming the semiconductor device according to the third embodiment, and are diagrams illustrating one example of a step following FIGS. 20A and 20B.

FIG. 17A is a longitudinal section illustrating a schematic configuration of the portion along the line S-S in FIG. 3, and FIG. 17B is a longitudinal section illustrating a schematic configuration of the portion along the line T-T in FIG. 3. FIGS. 17A and 17B are diagrams illustrating one example of a step following FIGS. 6A and 6B.

FIG. 18A is a longitudinal section illustrating a schematic configuration of the portion along the line S-S in FIG. 3, and FIG. 18B is a longitudinal section illustrating a schematic configuration of the portion along the line T-T in FIG. 3. FIGS. 18A and 18B are diagrams illustrating one example of a step following FIGS. 17A and 17B.

FIG. 19A is a longitudinal section illustrating a schematic configuration of the portion along the line S-S in FIG. 3, and FIG. 19B is a longitudinal section illustrating a schematic configuration of the portion along the line T-T in FIG. 3. FIGS. 19A and 19B are diagrams illustrating one example of a step following FIGS. 18A and 18B.

FIGS. 20A and 20B are longitudinal sections illustrating one example of a step partway through a method of forming the semiconductor device according to the third embodiment. FIG. 20A is a longitudinal section illustrating a schematic configuration of the portion along the line S-S in FIG. 3, and FIG. 20B is a longitudinal section illustrating a schematic configuration of the portion along the line T-T in FIG. 3. FIGS. 20A and 20B are diagrams illustrating one example of a step following FIGS. 19A and 19B.

FIG. 21A is a longitudinal section illustrating a schematic configuration of the portion along the line S-S in FIG. 3, and FIG. 21B is a longitudinal section illustrating a schematic configuration of the portion along the line T-T in FIG. 3. FIGS. 21A and 21B are diagrams illustrating one example of a step following FIGS. 19A and 19B.

FIG. 22A is a longitudinal section illustrating a schematic configuration of the portion along the line S-S in FIG. 3, and FIG. 22B is a longitudinal section illustrating a schematic configuration of the portion along the line T-T in FIG. 3. FIGS. 22A and 22B are diagrams illustrating one example of a step following FIGS. 21A and 21B.

FIG. 23A is a longitudinal section illustrating a schematic configuration of the portion along the line S-S in FIG. 3, and FIG. 23B is a longitudinal section illustrating a schematic configuration of the portion along the line T-T in FIG. 3. In addition, FIGS. 23A and 23B are longitudinal sections illustrating a method of forming the semiconductor device according to the fourth embodiment, and are diagrams illustrating one example of a step following FIGS. 26A and 26B.

FIG. 24A is a longitudinal section illustrating a schematic configuration of the portion along the line S-S in FIG. 3, and FIG. 24B is a longitudinal section illustrating a schematic configuration of the portion along the line T-T in FIG. 3. FIGS. 24A and 24B are diagrams illustrating one example of a step following FIGS. 6A and 6B.

FIG. 25A is a longitudinal section illustrating a schematic configuration of the portion along the line S-S in FIG. 3, and FIG. 25B is a longitudinal section illustrating a schematic configuration of the portion along the line T-T in FIG. 3. FIGS. 25A and 25B are diagrams illustrating one example of a step following FIGS. 24A and 24B.

FIG. 26A is a longitudinal section illustrating a schematic configuration of the portion along the line S-S in FIG. 3, and FIG. 26B is a longitudinal section illustrating a schematic configuration of the portion along the line T-T in FIG. 3. FIGS. 26A and 26B are diagrams illustrating one example of a step following FIGS. 25A and 25B.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, several embodiments will be described with reference to the drawings. In the following description, DRAM is given as an example of a semiconductor device. In the following description, elements that are the same or similar to previously-described elements will be denoted with the same or similar signs or will be referred to by the same or similar names, and further description may be omitted.

First Embodiment

Figure 1:
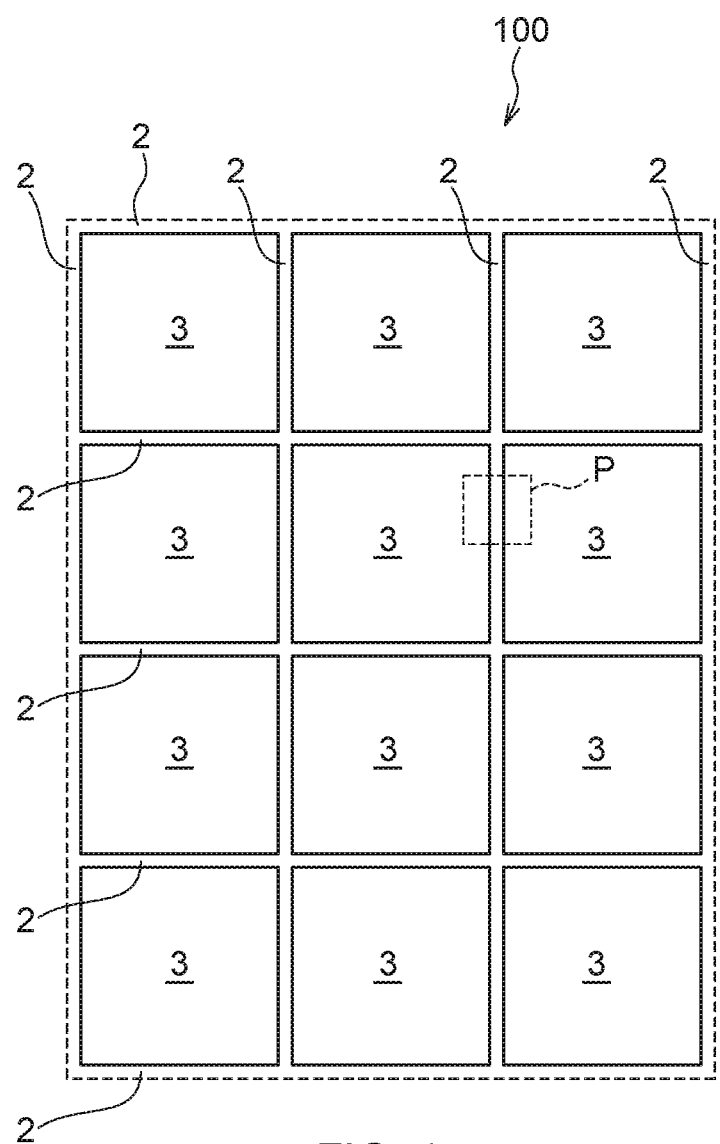
FIG. 1 is a plan view illustrating one example of a schematic configuration of the layout of a semiconductor device according to an embodiment.

FIG. 1 is a plan view illustrating a schematic configuration of a semiconductor wafer 100. The semiconductor wafer 100 is provided with a main surface on which various elements, insulating films, conductive films, and the like are formed. FIG. 1 illustrates the layout of a plurality of main circuit portions 3 and a scribe portion 2 included on the main surface of the semiconductor wafer 100.

The semiconductor wafer 100 illustrated in FIG. 1 is schematically illustrated in the state before the semiconductor wafer is cut by a dicing step, or in other words, the state before the semiconductor wafer is separated into individual semiconductor chips. The main surface of the semiconductor wafer 100 includes a plurality of main circuit portions 3 in which circuit elements such as transistors or conductive interconnects forming DRAM are formed. Each main circuit portion 3 has a rectangular shape. The main circuit portions 3 are arranged in a matrix. The scribe portion 2 is disposed around each of the main circuit portions 3. In each main circuit portion 3, components such as a plurality of memory cells, a data-related circuit that reads and writes memory cell data, and a control circuit that controls the data-related circuit are provided.

Figure 2:
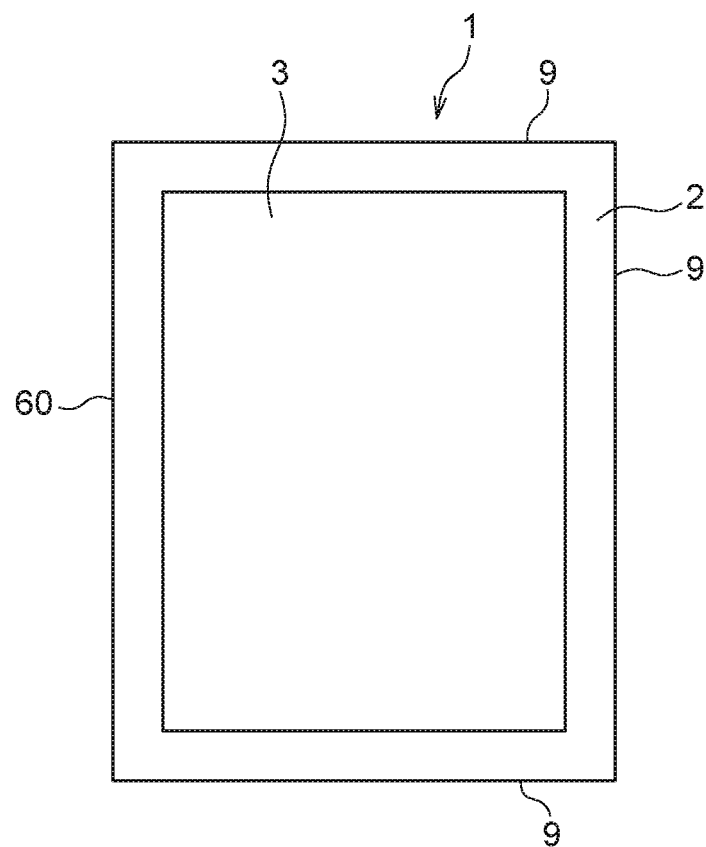
FIG. 2 is a plan view illustrating one example of a schematic configuration of a semiconductor device according to an embodiment.
Figure 3:
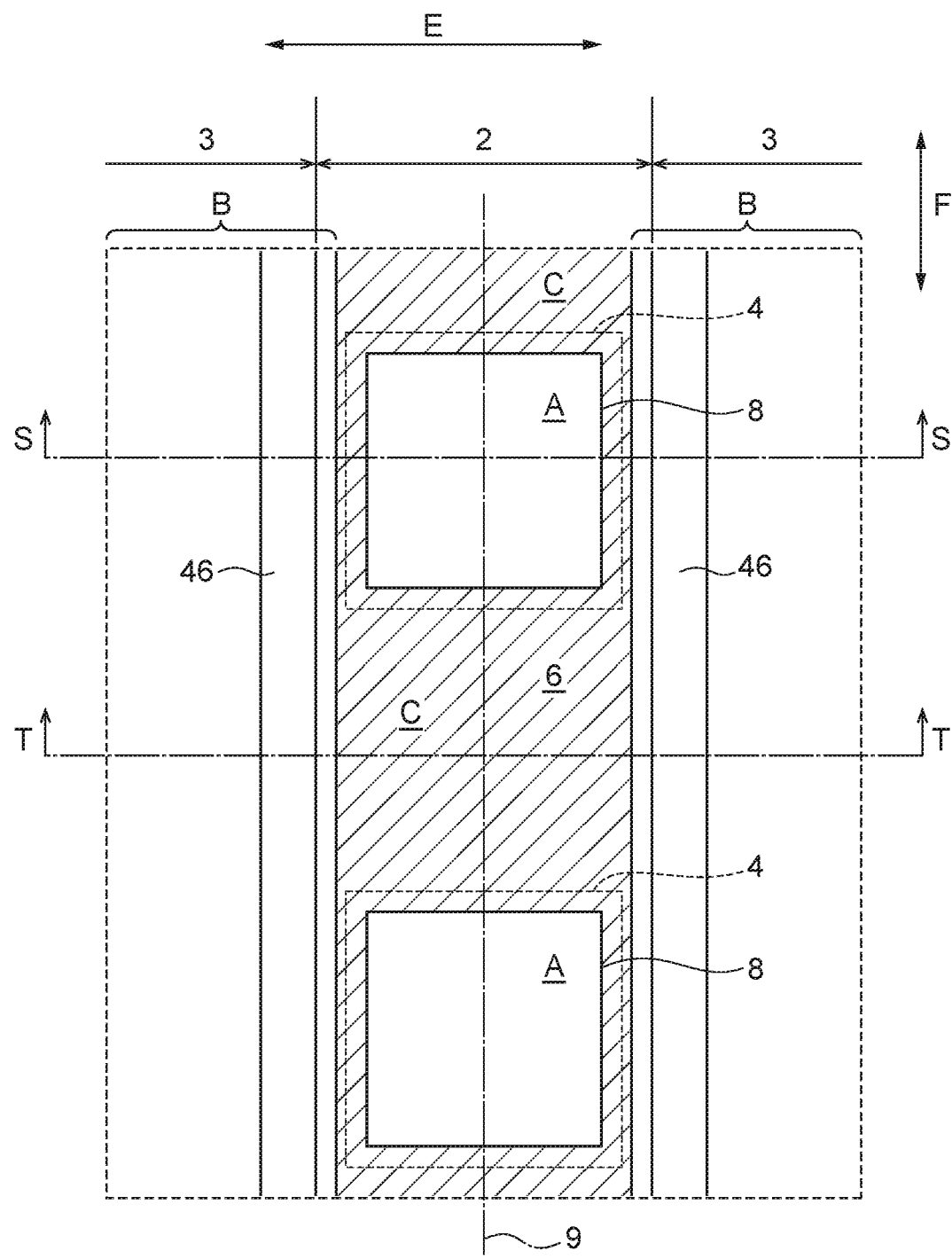
FIG. 3 is a plan view illustrating one example of a schematic configuration of a scribe portion of a semiconductor device according to an embodiment, and is an enlarged view of the region P in FIG. 1.

The scribe portion 2 corresponds to a cutting region for separating the semiconductor wafer 100 into individual semiconductor devices 1 like the one illustrated in FIG. 2. As illustrated in FIG. 3, the direction spanning the width of the scribe portion 2 is referred to as the width direction E. The scribe portion 2 is provided with a predetermined width defining the width direction E. The scribe portion 2 extends in a direction orthogonal to the width direction E. In the scribe portion 2, the direction at a right angle to the width direction E is referred to as the longitudinal direction F.

In FIG. 3, a cut portion 9 is illustrated in a central part of the scribe portion 2. The cut portion 9 is formed in a later dicing step. The cut portion 9 is formed in the approximate center in the width direction E of the scribe portion 2.

FIG. 3 is an enlarged view of the region P in FIG. 1, and is a plan view illustrating one example of a schematic configuration of the scribe portion 2 and the main circuit portions 3 adjacent to the scribe portion 2 exemplified in the first embodiment.

Figure 4A:
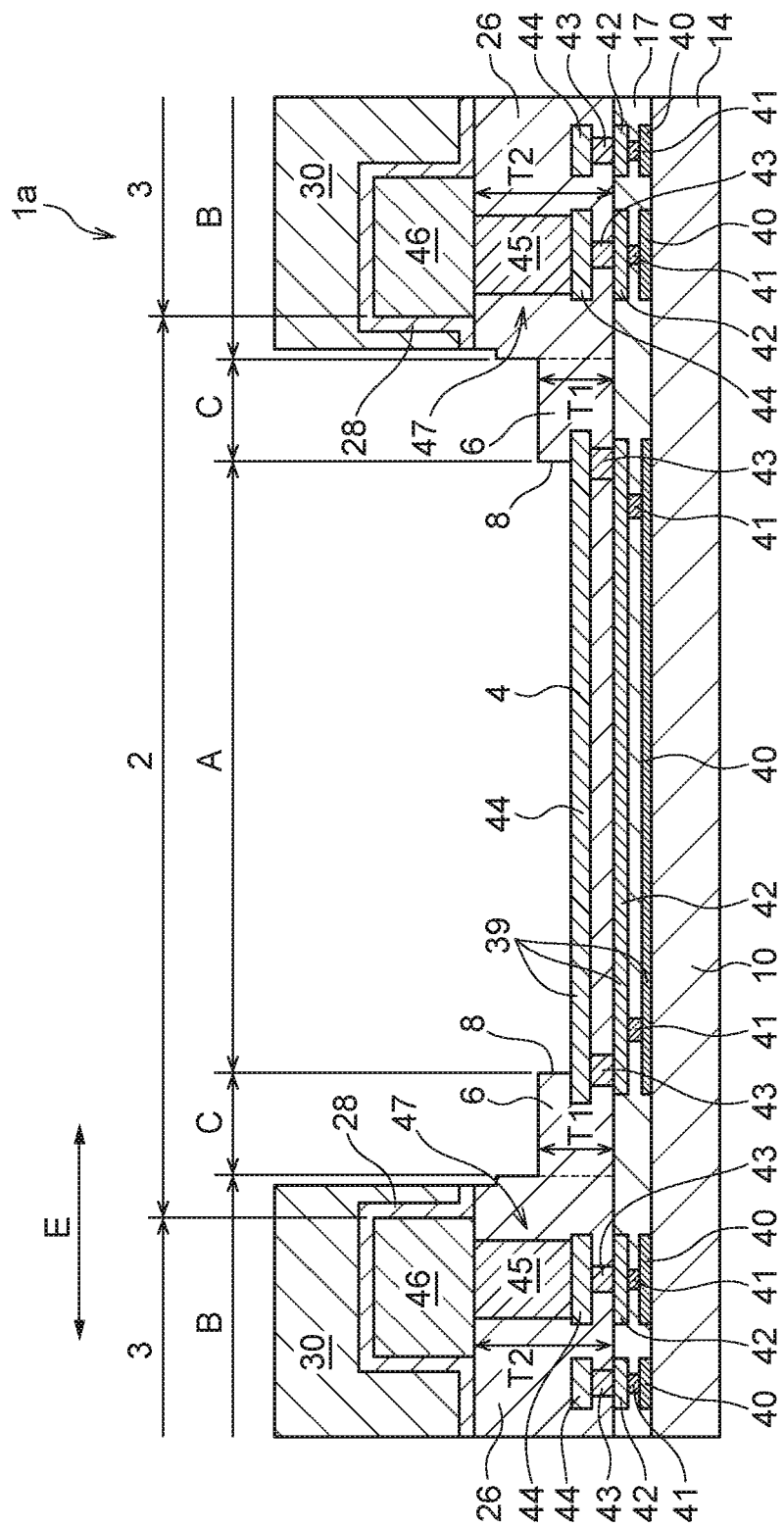
FIGS. 4A and 4B are diagrams illustrating one example of a schematic configuration of a scribe portion of a semiconductor device according to a first embodiment.

As illustrated in FIGS. 3 and 4A, metal pads 4 are provided in the scribe portion 2. The scribe portion 2 includes test element groups (hereinafter referred to as TEGs) not illustrated for measuring properties such as the electrical characteristics of the manufactured semiconductor devices 1. The metal pads 4 are electrically connected to the TEGs to measure the electrical characteristics of the TEGs. During a measurement of a TEG, the electrical characteristics of the TEG are measured by causing a measuring probe connected to a measuring instrument to abut the metal pads 4. The metal pads 4 contain a conductive material. The metal pads 4 contain a metal such as aluminum (Al), for example. The metal pads 4 may also contain a barrier metal provided above and below a metal electrode. The metal pads 4 are contained in an intermediate metal layer 39 described later. In the embodiment, the metal pads 4 are contained in a third metal wiring layer 44 included in an uppermost layer of the intermediate metal layer 39.

Figure 4B:
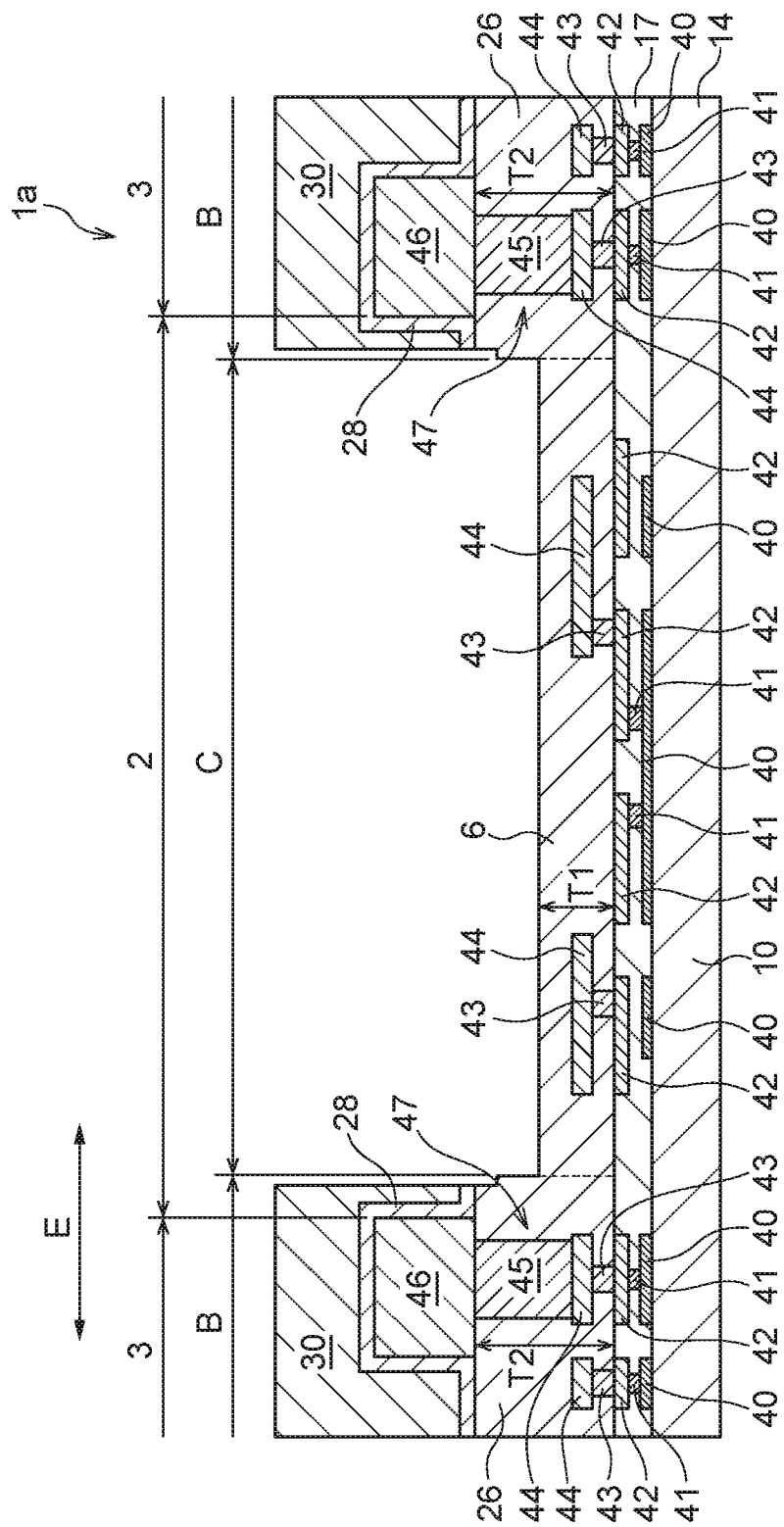

FIG. 4A illustrates a longitudinal section of the scribe portion 2 in the portion where one of the metal pads 4 are disposed. FIG. 4B illustrates a longitudinal section of the scribe portion 2 in the portion where one of the metal pads 4 are not disposed. As illustrated in FIGS. 4A and 4B, a semiconductor device 1 is provided with a semiconductor substrate 14, a low-k insulating film 17 provided on the semiconductor substrate 14, a first metal wiring layer 40 and a second metal wiring layer 42 provided so as to be surrounded by the low-k insulating film 17 on the respective bottom and sides thereof, and a first connecting portion 41 that connects the first metal wiring layer 40 and the second metal wiring layer 42. Note that the semiconductor substrate 14 herein is assumed to include various elements and conductive interconnects forming DRAM provided on the semiconductor wafer, as well as an insulating film covering these elements.

Additionally, on the low-k insulating film 17, the semiconductor device 1 is provided with a third metal wiring layer 44, a second connecting portion 43 that connects the second metal wiring layer 42 and the third metal wiring layer 44, an uppermost metal layer 46, and a second connecting portion 45 that connects the third metal wiring layer 44 and the uppermost metal layer 46. The first metal wiring layer 40, the first connecting portion 41, the second metal wiring layer 42, the second connecting portion 43, and the third metal wiring layer 44 contain metal.

Each main circuit portion 3 is provided with a stacked structure 47 formed by stacking the first metal wiring layer 40, the first connecting portion 41, the second metal wiring layer 42, the second connecting portion 43, the third metal wiring layer 44, the second connecting portion 45, and the uppermost metal layer 46. Laser grooving is used to remove the metal wiring layers 40, 42, 43, and 44, the connecting portions 41 and 43, and the low-k insulating film 17 in the dicing region before dicing. At this time, the stacked structure 47 is disposed to protect the main circuit portions 3 from heat and shock. Furthermore, a function of suppressing the propagation of cracks produced during dicing into the main circuit portions 3 is also provided. The stacked structure 47 is disposed in the main circuit portions 3. The stacked structure 47 is disposed in a straight line along the boundary between the scribe portion 2 and each main circuit portion 3.

The uppermost metal layer 46 is a redistribution layer for example, and contains interconnects added to redistribute terminals in a case of configuring a package with solder bumps and flip chip connections, for example. The redistribution layer is normally disposed in the uppermost part of the semiconductor device 1. The redistribution layer needs low resistance values, and is therefore thick. The uppermost metal layer 46 contains a metal such as aluminum (Al) for example.

On the semiconductor substrate 14 in the scribe portion 2, the low-k insulating film 17 and an insulating film 6 are stacked in the above order proceeding upward from the semiconductor substrate 14. Herein, a low-k insulating film means a film having a lower dielectric constant (k) than a silicon oxide film used between Cu interconnects and a silicon nitride film that is deposited on the Cu interconnects to prevent Cu diffusion. The insulating film 6 is disposed in the scribe portion 2 and has a thickness T1. The insulating film 6 is disposed to at least include the cut portion 9 disposed in the central part of the scribe portion 2. A portion of the insulating film 6 covers a peripheral part of the metal pads 4. The region where the insulating film 6 is provided is referred to as the portion C. An opening 8 is formed in a central part of each metal pad 4. The top face of the opening 8 is exposed and not covered by the insulating film 6. The region where the opening 8 is formed is referred to as the portion A.

In each main circuit portion 3, an insulating film 26 that covers the low-k insulating film 17 is provided. Additionally, the third metal wiring layer 44, the uppermost metal layer 46, and the second connecting portion 45 that connects the third metal wiring layer 44 and the uppermost metal layer 46 are provided above the low-k insulating film 17. The uppermost metal layer 46 is provided on the insulating film 26. The top face of the insulating film 26 is positioned at the bottom face of the uppermost metal layer 46. The insulating film 26 has a thickness T2. The insulating film 26 covers each main circuit portion 3. The region where the insulating film 26 is provided is referred to as the portion B. The thickness T1 of the insulating film 6 is smaller than the thickness T2 of the insulating film 26. In each main circuit portion 3, an insulating film 28 that covers the upper part of the uppermost metal layer 46 included in the stacked structure 47 and the insulating film 26, and a polyimide film 30 that covers the top face of the insulating film 28 are provided. The insulating film 28 includes a silicon nitride film, for example.

Figure 5A:
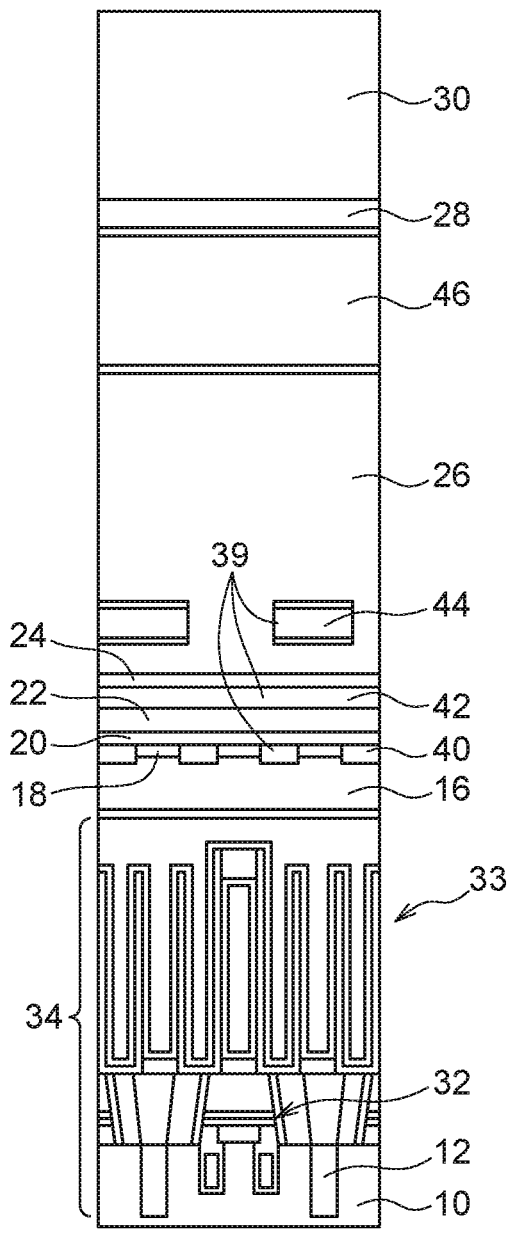
FIG. 5A is a longitudinal section illustrating one example of a schematic configuration of a memory cell region of a semiconductor device according to an embodiment.
Figure 5B:
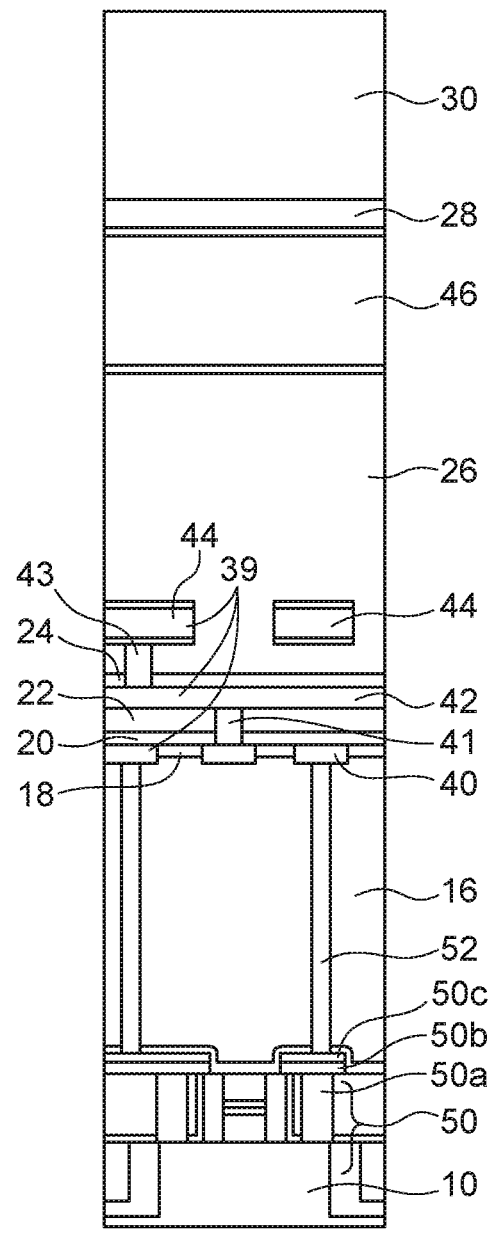
FIG. 5B is a longitudinal section illustrating one example of a schematic configuration of a peripheral circuit part of a semiconductor device according to an embodiment.

FIG. 5A is a longitudinal section illustrating one example of a schematic configuration of a DRAM memory cell region in one of the main circuit portions 3. FIG. 5B is a longitudinal section illustrating one example of a schematic configuration of a DRAM peripheral circuit region in one of the main circuit portions 3. As illustrated in FIGS. 5A and 5B, the main circuit portion 3 is provided with various elements and conductive interconnects forming the DRAM.

In FIG. 5A, components such as an insulating film 12, a memory element 34, an insulating film 16, the first metal wiring layer 40, the second metal wiring layer 42, low-k insulating films 18, 20, 22, and 24, the third metal wiring layer 44, the insulating film 26, the uppermost metal layer 46, the insulating film 28, and the polyimide film 30 are provided on a silicon substrate 10.

The low-k insulating films 18, 20, 22, and 24 are provided between, alongside, below, and above the first metal wiring layer 40 and the second metal wiring layer 42. The memory element 34 includes components such as a select transistor 32 and a capacitor 33.

In FIG. 5B, components such as the insulating film 12, a peripheral circuit transistor 50, a contact 50a, a metal film 50b, a metal film 50c, a connecting electrode 52, the insulating film 16, the first metal wiring layer 40, the first connecting portion 41, the second metal wiring layer 42, the low-k insulating films 18, 20, 22, and 24, the second connecting portion 43, the third metal wiring layer 44, the insulating film 26, the uppermost metal layer 46, the insulating film 28, and the polyimide film 30 are provided on the silicon substrate 10. The low-k insulating films 18, 20, 22, and 24 are provided between and alongside the first metal wiring layer 40 and the second metal wiring layer 42. The peripheral circuit transistor 50 is electrically connected to the first metal wiring layer 40 through the contact 50a, the metal film 50b, the metal film 50c, and the connecting electrode 52.

The insulating film 16 is an interlayer insulating film disposed between the memory element 34 and the peripheral circuit transistor 50, and the first metal wiring layer 40. The insulating film 26 is an interlayer insulating film disposed between the third metal wiring layer 44 and the uppermost metal layer 46. Herein, the first metal wiring layer 40, the second metal wiring layer 42, and the third metal wiring layer 44 are referred to as the intermediate metal layer 39 with respect to the uppermost metal layer 46. In the scribe portion 2, the metal pads 4 are included in the third metal wiring layer 44. The metal pads 4 are included in the uppermost layer of the intermediate metal layer 39, namely the third metal wiring layer 44.

In the first embodiment, the low-k insulating film 17 includes, for example, a laminated film of a first low-k insulating film 18, a second low-k insulating film 20, a third low-k insulating film 22, and a fourth low-k insulating film 24. The first low-k insulating film 18 and the third low-k insulating film 22 contain a carbon-doped silicon oxide film (SiOC film) for example. The second low-k insulating film 20 and the fourth low-k insulating film 24 are films capable of preventing the diffusion of Cu, and contain a nitrogen-doped silicon carbide film (SiCN film) for example. SiOC and SiCN are given as examples, and some other low-k insulating material having a low dielectric constant can be used as the low-k insulating film 17. Also, the low-k insulating film 17 is not necessarily limited to the above configuration, and may also be a laminated film containing even more low-k insulating films. The above configuration is also similar in the second, third, and fourth embodiments described later.

The semiconductor device 1 comprises a semiconductor substrate 14. The semiconductor device 1 comprises a multilevel wiring structure on the semiconductor substrate 14. The multilevel wiring structure includes an intermediate metal layer 39 over the semiconductor substrate 14 and an uppermost metal layer 46 over the intermediate metal layer 39. The multilevel wiring structure is divided into a main circuit portion 3 and a scribe portion 2 surrounding the main circuit portion 3. The scribe portion 2 of the multilevel wiring layer includes, in the intermediate metal layer 39, a metal pad 4 exposed on the surface. The metal pad 4 is included in the third metal layer 44 as the uppermost layer of the intermediate metal layer 39.

Figure 6A:
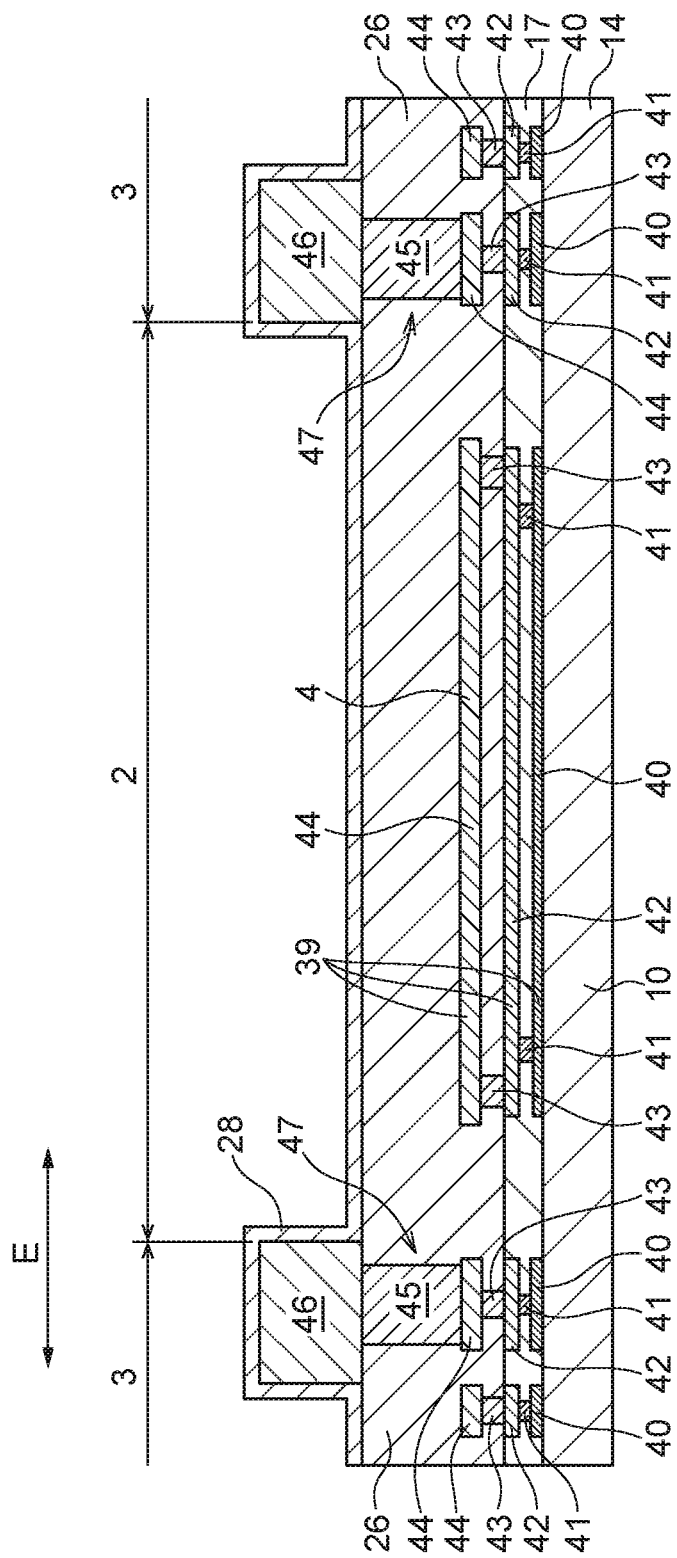
FIGS. 6A and 6B are longitudinal sections illustrating one example of a step partway through a method of forming the semiconductor device according to the first embodiment.
Figure 6B:
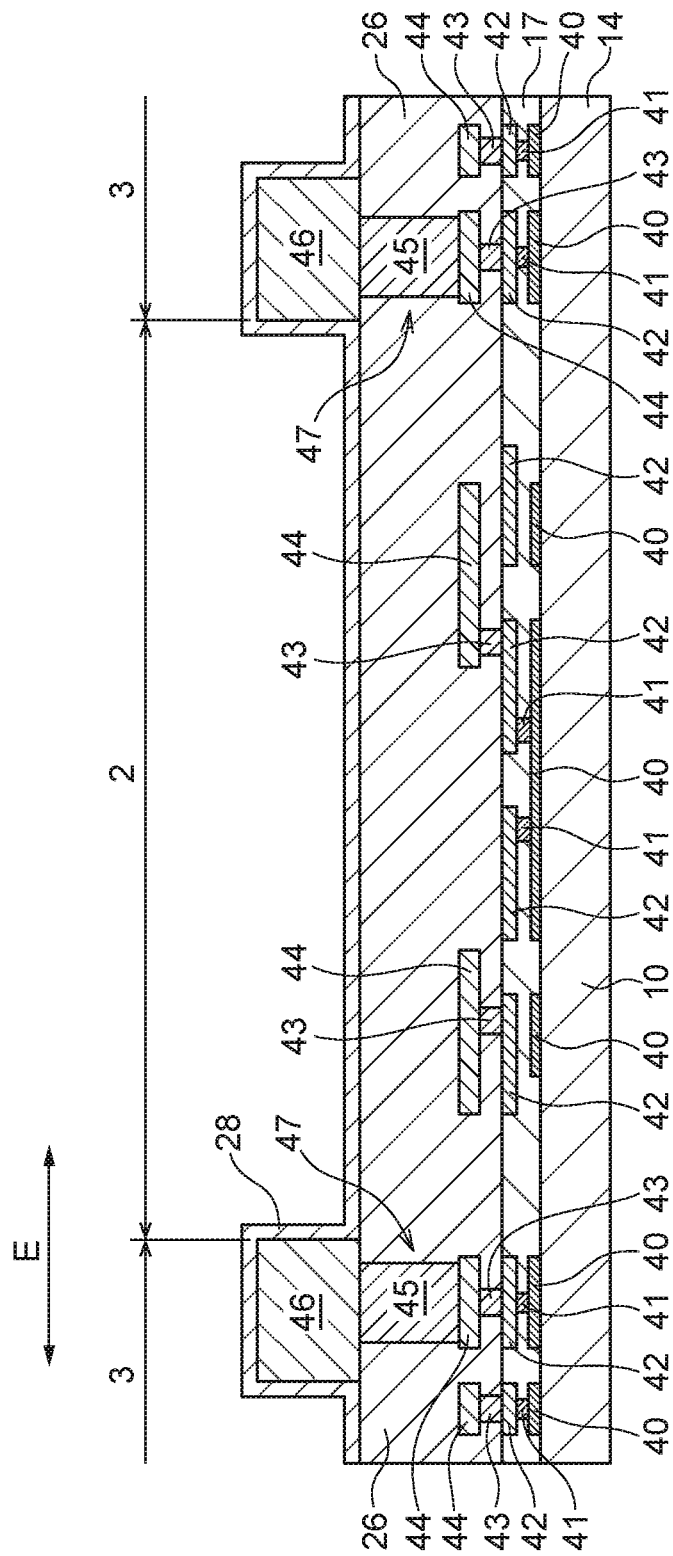

Next, a method of forming the semiconductor device 1 according to the first embodiment will be described with reference to FIGS. 4A and 4B as well as FIGS. 6A and 6B to FIGS. 11A and 11B. The following describes a case in which a negative photoresist is used. First, as illustrated in FIGS. 6A and 6B, the first metal wiring layer 40, the first connecting portion 41, the second metal wiring layer 42, and the low-k insulating film 17 covering these layers are formed above the semiconductor substrate 14 including the scribe portion 2 and the main circuit portions 3. The low-k insulating film 17 is a laminated film of the low-k insulating films 18, 20, 22, and 24 illustrated in FIGS. 5A and 5B. As described above, the semiconductor substrate 14 includes various elements and conductive interconnects forming DRAM provided on a semiconductor wafer, as well as an insulating film covering these elements.

In the scribe portion 2, the metal pads 4 containing the second connecting portion 43 and the third metal wiring layer 44 are formed on top of the low-k insulating film 17. In each main circuit portion 3, the second connecting portion 43 and the third metal wiring layer 44 included in the stacked structure 47 are formed. Next, after forming the insulating film 26, in each main circuit portion 3, the second connecting portion 45 is formed to reach the third metal wiring layer 44, and the uppermost metal layer 46 is formed on the second connecting portion 45. Furthermore, the insulating film 28 is formed to cover the top face of the scribe portion 2 and the insulating film 26 on the main circuit portions 3 as well as the uppermost metal layer 46 of the main circuit portions 3.

These metal wiring layers and insulating films are formed by chemical vapor deposition, for example. The insulating film 26 contains a silicon oxide (SiO2) film, for example. The first metal wiring layer 40, the first connecting portion 41, and the second metal wiring layer 42 contain copper (Cu), for example. The second connecting portion 45 and the uppermost metal layer 46 contain aluminum (Al), for example. The main circuit portions 3 are disposed on either side of the scribe portion 2.

Figure 7A:
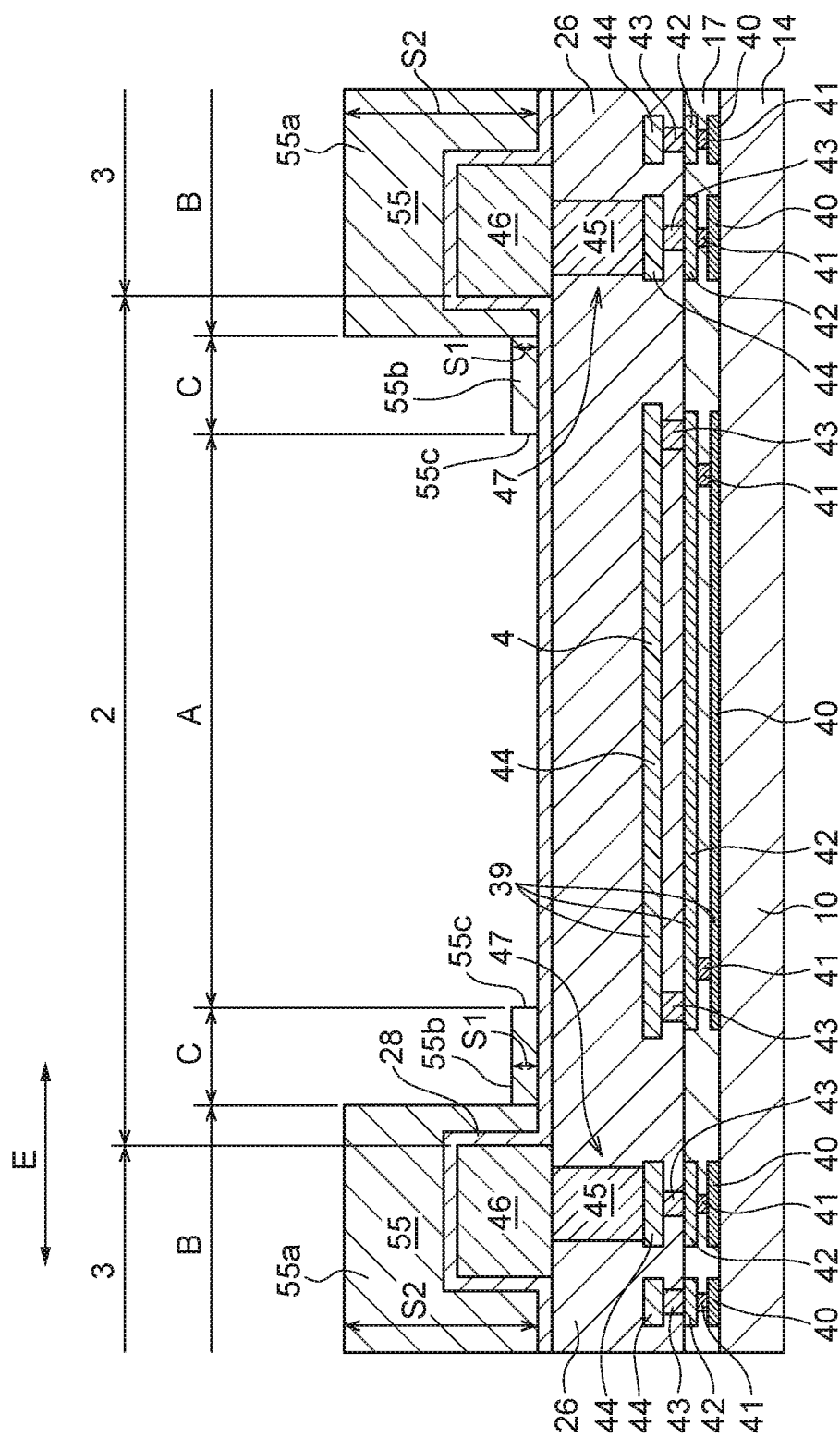
FIGS. 7A and 7B are longitudinal sections illustrating one example of a step partway through a method of forming the semiconductor device according to the first embodiment.
Figure 7B:
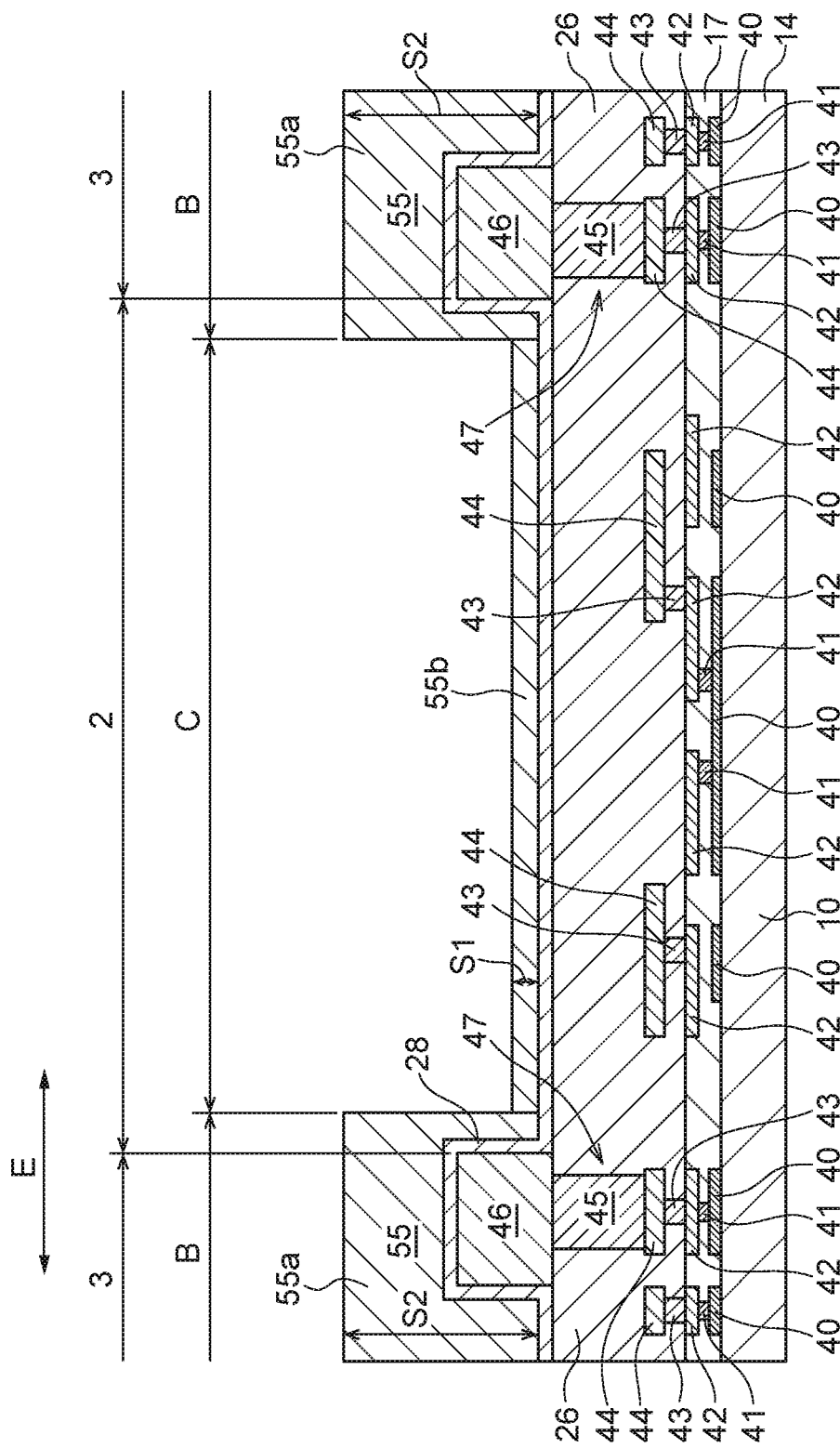

Next, as illustrated in FIGS. 7A and 7B, by applying a photoresist and then performing exposure and development processes, a photoresist pattern 55 in which an opening 55c is patterned is formed. The photoresist pattern 55 also comprises a photoresist pattern 55a having a large resist thickness and a photoresist pattern 55b having a small resist thickness.

The opening 55c is formed to correspond to the opening 8 of the metal pads 4, and the resist is removed in the opening 55c. The photoresist pattern 55 contains a negative photosensitive resin, for example. When the negative photoresist pattern 55 is irradiated with light of a predetermined exposure value or greater in a lithography step, all or almost all of the applied photoresist is cured, and the photoresist pattern 55a having a thickness S2 is formed. On the other hand, when the negative photoresist pattern 55 is irradiated with light of less than the predetermined exposure value in the lithography step, the thickness of the cured photoresist is reduced, and the photoresist pattern 55b having a thickness S1 is formed. The thickness S2 is larger than the thickness S1.

By controlling the exposure value in this way, the thickness of the photoresist can be controlled. In the case where the photoresist is the negative type, reducing the exposure value causes the thickness of the photoresist to become smaller than the applied thickness.

Figure 8:
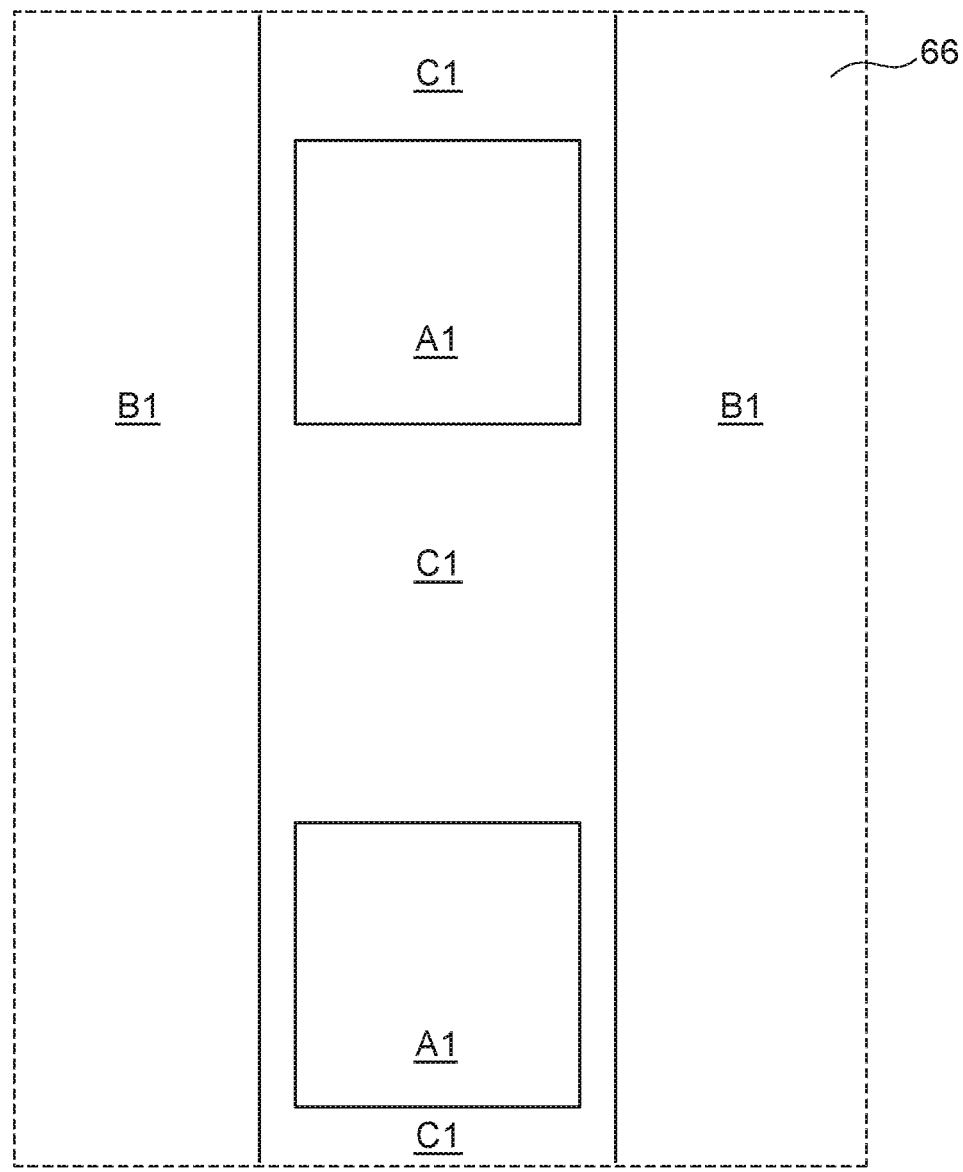
FIG. 8 is an enlarged partial plan view illustrating a schematic configuration of a photomask used in the step illustrated in FIGS. 7A and 7B.
Figure 8A:
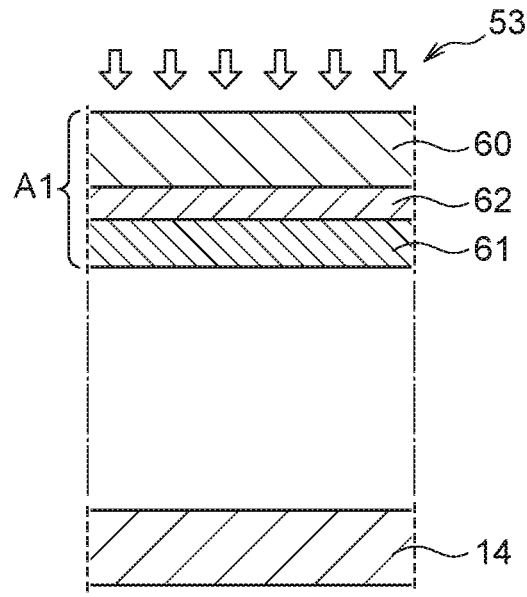
FIGS. 8A, 8B, 8C, and 8D are partial longitudinal sections illustrating a schematic configuration of the photomask.
Figure 8B:
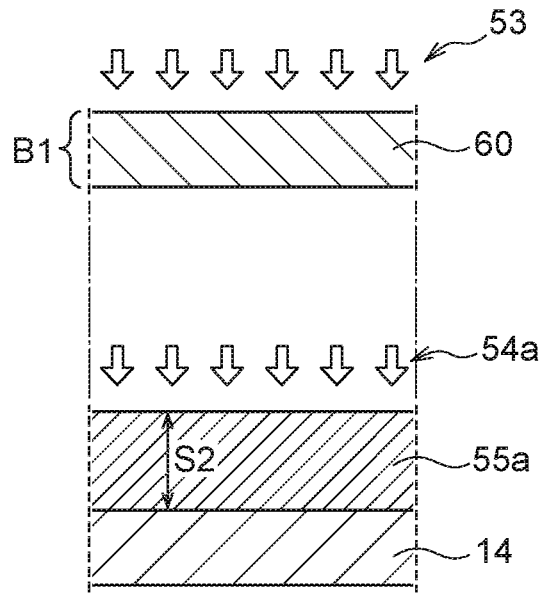
Figure 8C:
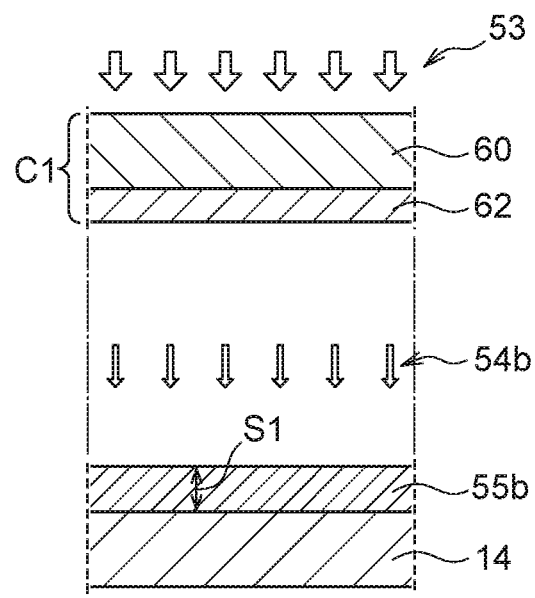

FIG. 8 is a partial plan view illustrating a schematic configuration of a photomask 66 used in the lithography step illustrated in FIGS. 7A and 7B. The exposure value used to expose the photoresist pattern 55 is controlled by portions A1, B1, and C1 provided in the photomask 66. FIGS. 8A, 8B, and 8C are longitudinal sections illustrating a schematic configuration of the portions A1, B1, and C1 of the photomask 66, and illustrate the correspondence relationships between the semiconductor substrate 14 corresponding to the portions A1, B1, and C1 and the photoresist patterns 55a and 55b formed on the semiconductor substrate 14. The arrows 53 represent light from a light source, while the arrows 54a and 54b represent transmitted light that has passed through the photomask 66. The resist on the semiconductor substrate 14 is irradiated by the transmitted light represented by the arrows 54a and 54b.

As illustrated in FIG. 8A, the portion A1 of the photomask 66 is provided with a glass substrate 60, a halftone material 62, and a light shading member 61. In the portion A1, the light designated by the arrows 53 is shaded by the light shading member 61, and therefore the resist on the semiconductor substrate 14 is not irradiated with light. The light shading member 61 contains a light shading material, and the light shading material contains chromium (Cr) or chromium oxide, for example. The light shading member 61 shades light at a transmittance rate of substantially 0 percent. The glass substrate 60 contains a transparent material such as quartz glass, for example. The glass substrate 60 allows light to be transmitted through with little or no reduction. The glass substrate 60 allows light to pass through at a transmittance rate of substantially 100 percent. The halftone material 62 is a semi-transparent film having a transmittance rate greater than 0 percent and less than 100 percent. The halftone material 62 contains a material such as molybdenum (Mo), chromium (Cr), silicon (Si), and their nitrides, for example.

As illustrated in FIG. 8B, the portion B1 includes the glass substrate 60. In the portion B1, because the halftone material 62 and the light shading member 61 are not provided, the light indicated by the arrows 53 passes through the portion B1 and becomes the light indicated by the arrows 54a with little or no reduction, and irradiates the photoresist of the semiconductor substrate 14. By irradiating the photoresist on the semiconductor substrate 14 with the light indicated by the arrows 54a, the photoresist pattern 55a having the thickness S2 is formed.

As illustrated in FIG. 8C, the portion C1 comprises the glass substrate 60 and the halftone material 62. Light passing through the halftone material 62 is reduced. The light transmittance rate of the halftone material 62 can be controlled by adjusting properties such as the composition ratio of the materials contained in the halftone material 62 and the thickness of the halftone material 62. Because the halftone material 62 is provided in the portion C1, the light indicated by the arrows 53 is reduced by the halftone material 62 to become the light indicated by the arrows 54b, and the resist on the semiconductor substrate 14 is irradiated by the light indicated by the arrows 54b. By irradiating the resist on the semiconductor substrate 14 with the light indicated by the arrows 54b, the photoresist pattern 55b having the thickness S1 is formed.

The transmittance rate of the portion A1 of the photomask 66 is lower than the transmittance rate of the portion C1. The transmittance rate of the portion B1 is higher than the transmittance rate of the portion C1. The thickness S2 of the photoresist pattern 55a on the semiconductor substrate 14 corresponding to the portion B1 is larger than the thickness S1 of the photoresist pattern 55b on the semiconductor substrate 14 corresponding to the portion C1.

Figure 8D:
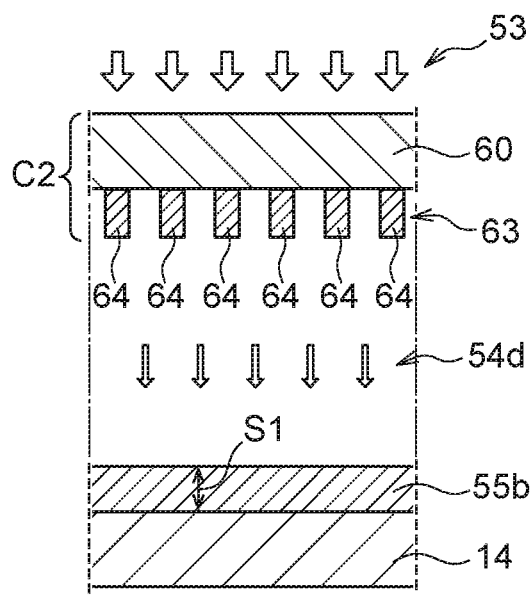
Figure 8E:
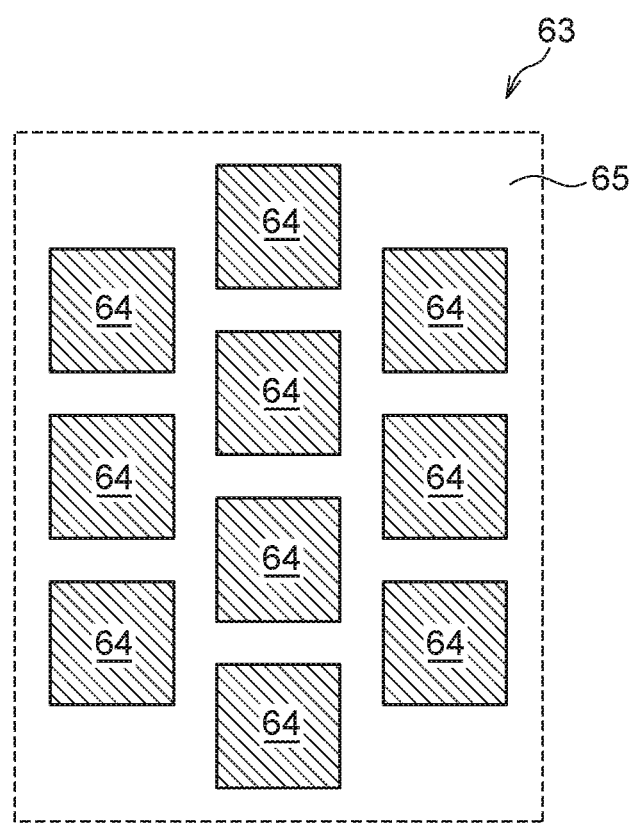
FIG. 8E is a plan view illustrating a schematic configuration of a part of the photomask illustrated in FIG. 8D.

FIGS. 8D and 8E illustrate the portion C2 according to a modification of the portion C1 of the photomask 66. As illustrated in FIG. 8D, the portion C2 comprises the glass substrate 60 and a light transmission part 63. As illustrated in FIGS. 8D and 8E, the light transmission part 63 comprises light shading parts 64 and an open part 65. The light shading parts 64 contain the same material as the light shading member 61 of the portion A1, and shade light. The open part 65 is a region where the light shading parts 64 do not exist and allows light to pass through. By controlling the area ratio of the light shading parts 64 and the open part 65, the light transmittance rate of the light transmission part 63 can be controlled. In FIG. BE, the light shading parts 64 have a staggered arrangement, but may also have a matrix arrangement. The light indicated by the arrows 53 passes through and is reduced by the portion C2, and becomes the light indicated by the arrows 54d. The resist on the semiconductor substrate 14 is irradiated by the light indicated by the arrows 54d. By irradiating the resist on the semiconductor substrate 14 with the light indicated by the arrows 54d, the photoresist pattern 55b having the thickness S1 is formed. The photomask illustrated in FIG. 8D comprises the glass substrate 60 and the light shading member 61. Because the halftone material 62 is not used, the cost of the photomask can be lowered.

The transmittance rate of the portion A1 of the photomask 66 is lower than the transmittance rate of the portion C2. The transmittance rate of the portion B1 is higher than the transmittance rate of the portion C2. The thickness S2 of the photoresist pattern 55a on the semiconductor substrate 14 corresponding to the portion B1 is larger than the thickness S1 of the photoresist pattern 55b on the semiconductor substrate 14 corresponding to the portion C2.

In the lithography step illustrated in FIGS. 7A and 7B, the photomask 66 provided with the above portions A1, B1, and C1 is used. As illustrated in FIGS. 7A and 7B, the portion A1 of the photomask 66 is disposed in correspondence with the portion A, that is, the region where the opening 8 is formed on the semiconductor substrate 14. Because light is shaded by the portion A1 of the photomask 66, photoresist does not remain in the portion A that is the region where the opening 8 is formed. Consequently, the opening 55c is formed.

The portion B1 of the photomask 66 is disposed in correspondence with the portion B, that is, the region where the insulating film 26 is formed on the semiconductor substrate 14. In the portion B that is the region where the insulating film 26 is formed, the light passing through the portion B1 of the photomask 66 is not reduced, and therefore the exposure value increases and the photoresist pattern 55a having the larger thickness S2 is formed. The portion C1 of the photomask 66 is disposed in correspondence with the portion C, that is, the region where the insulating film 6 is formed on the semiconductor substrate 14. In the portion C that is the region where the insulating film 6 is formed, the exposure value due to the transmitted light is reduced, and therefore the photoresist pattern 55b having the thickness S1 smaller than the thickness S2 is formed. Note that the portion C2 of the photomask 66 may also be disposed in correspondence with the portion C that is the region where the insulating film 6 is formed on the semiconductor substrate 14.

Figure 9A:
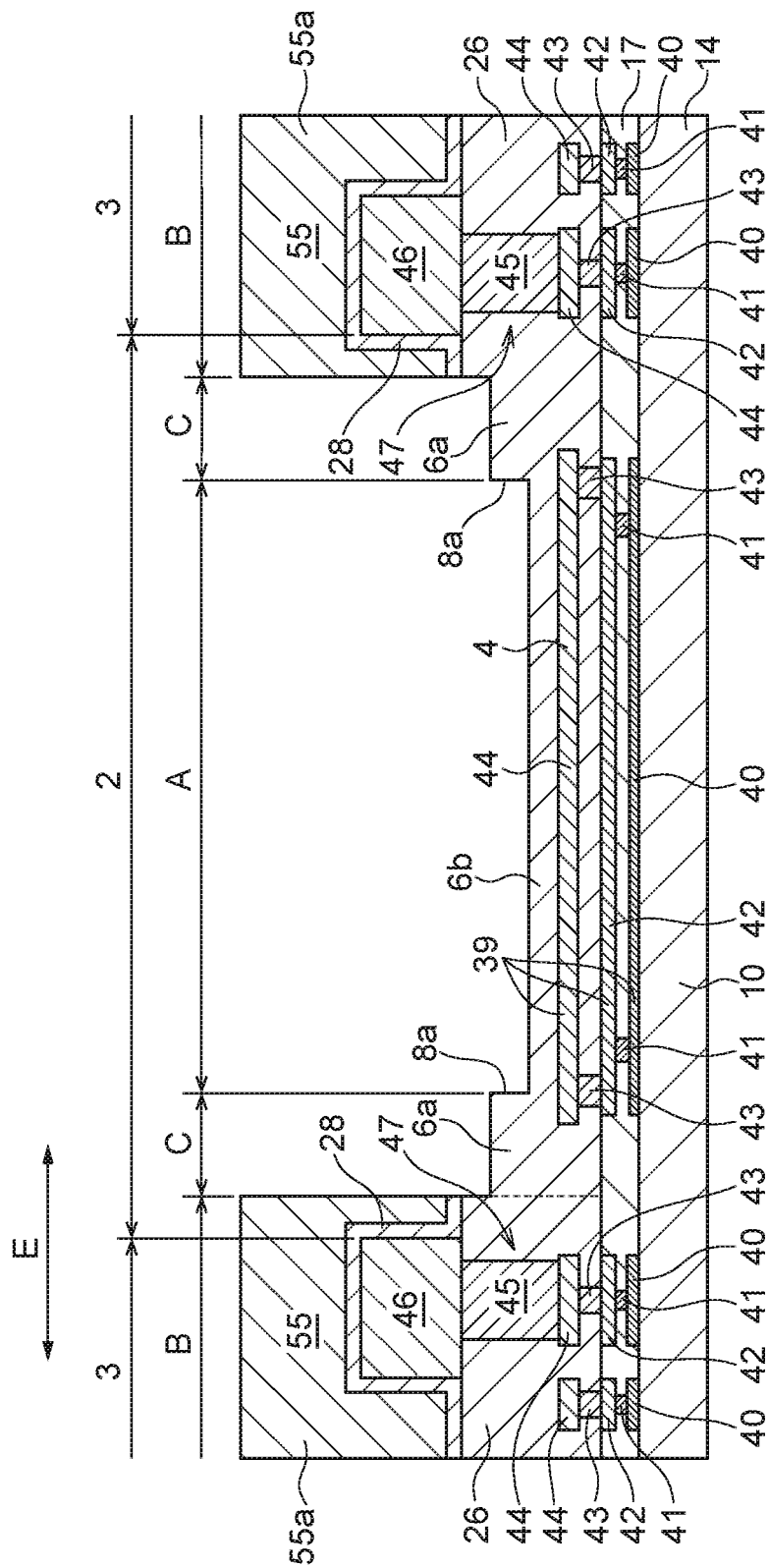
FIGS. 9A and 9B are longitudinal sections illustrating one example of a step partway through a method of forming the semiconductor device according to the first embodiment.
Figure 9B:
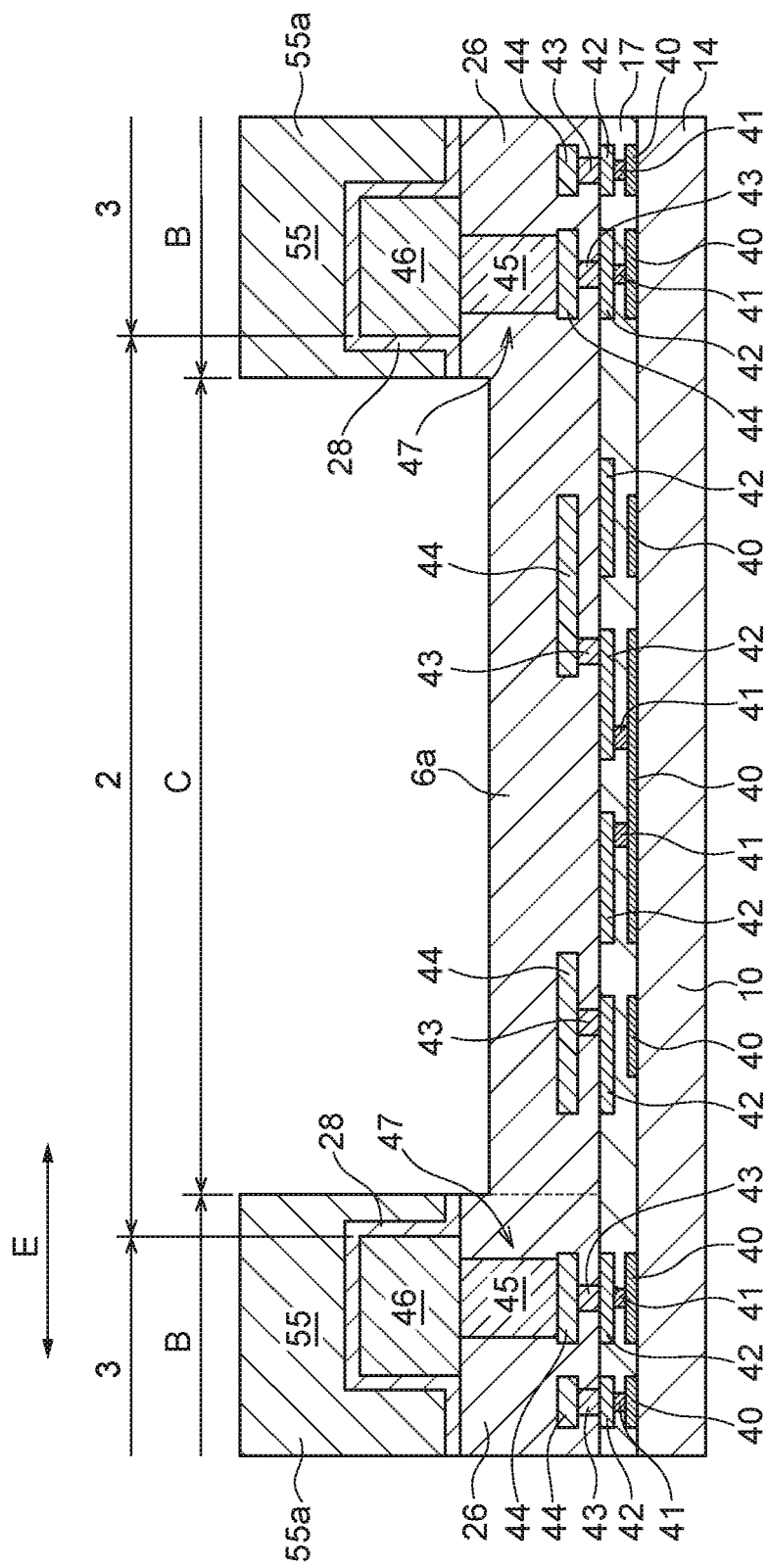

Next, as illustrated in FIGS. 9A and 9B, anisotropic dry etching is performed on the insulating film 28 and the insulating film 26 using the photoresist pattern 55 as an etching mask. With this arrangement, the insulating film 28 and the insulating film 26 are etched in the portion A, that is, the region where the opening 8 is formed. At this time, the etching is controlled such that an insulating film 6b remains on the metal pads 4. Because the photoresist pattern 55b is less thick in the portion C that is the region where the insulating film 6 is provided, the photoresist pattern 55b is eliminated partway through the etching. After the photoresist pattern 55b is eliminated, the insulating film 28 and the insulating film 26 in the portion C are etched, and an insulating film 6a that is thicker than the insulating film 6b but thinner than the insulating film 26 is formed.

Figure 10A:
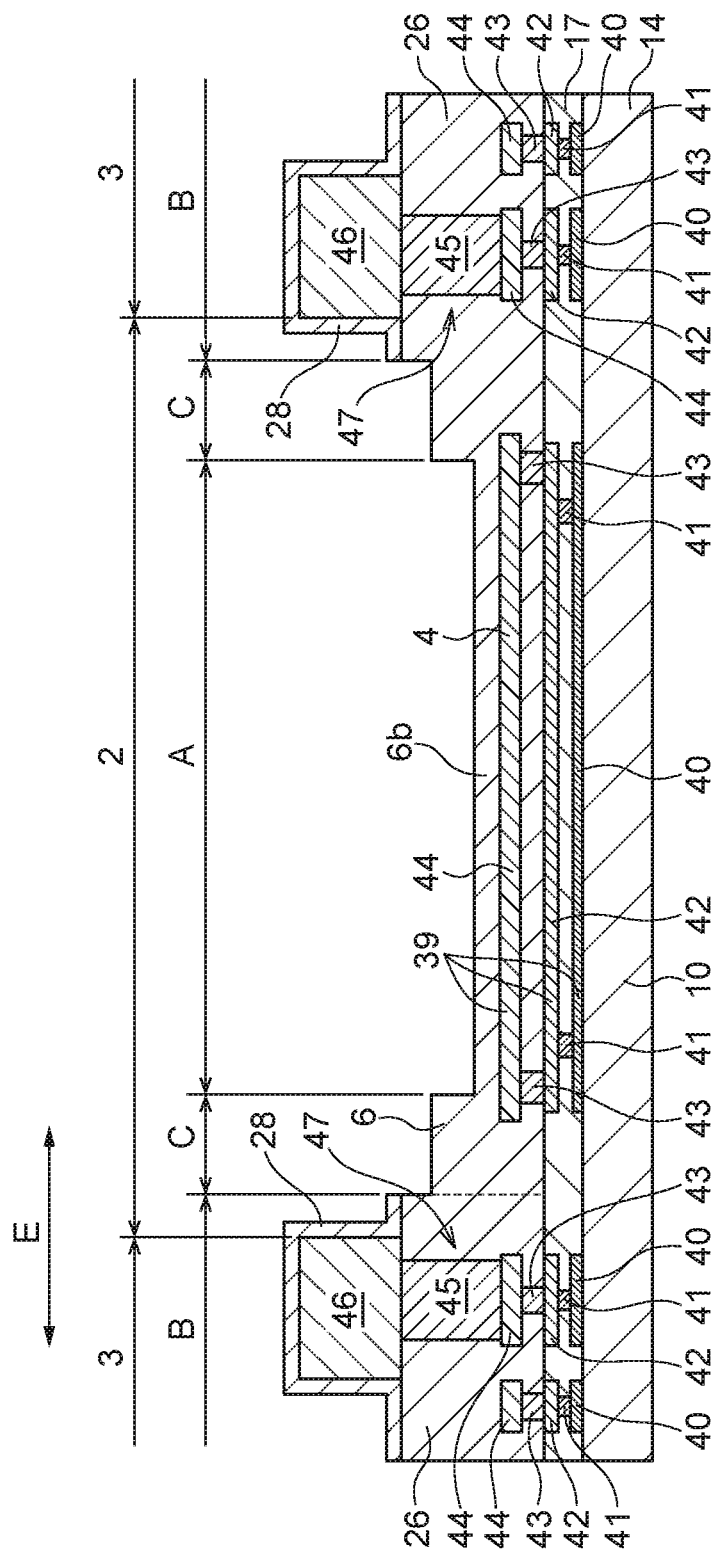
FIGS. 10A and 10B are longitudinal sections illustrating one example of a step partway through a method of forming the semiconductor device according to the first embodiment.
Figure 10B:
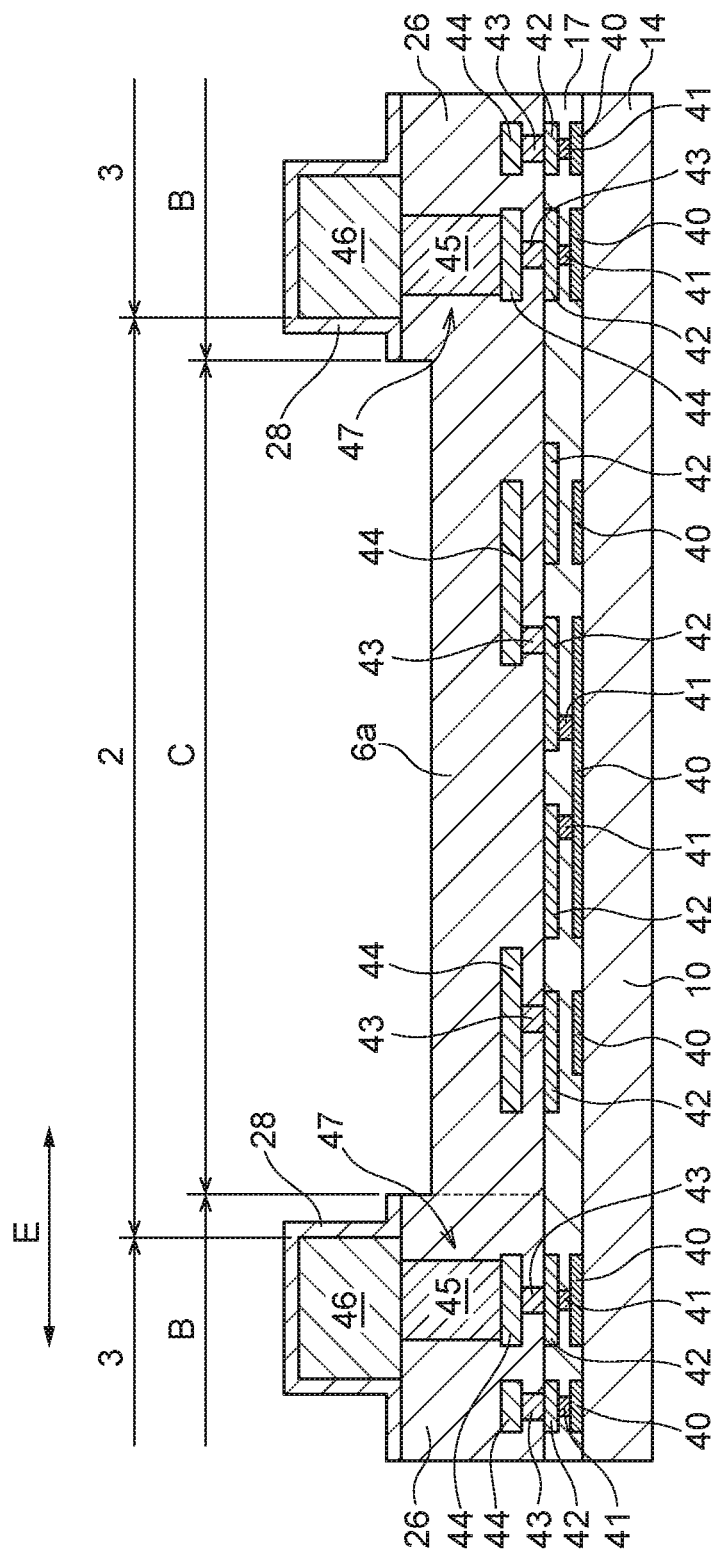
Figure 11A:
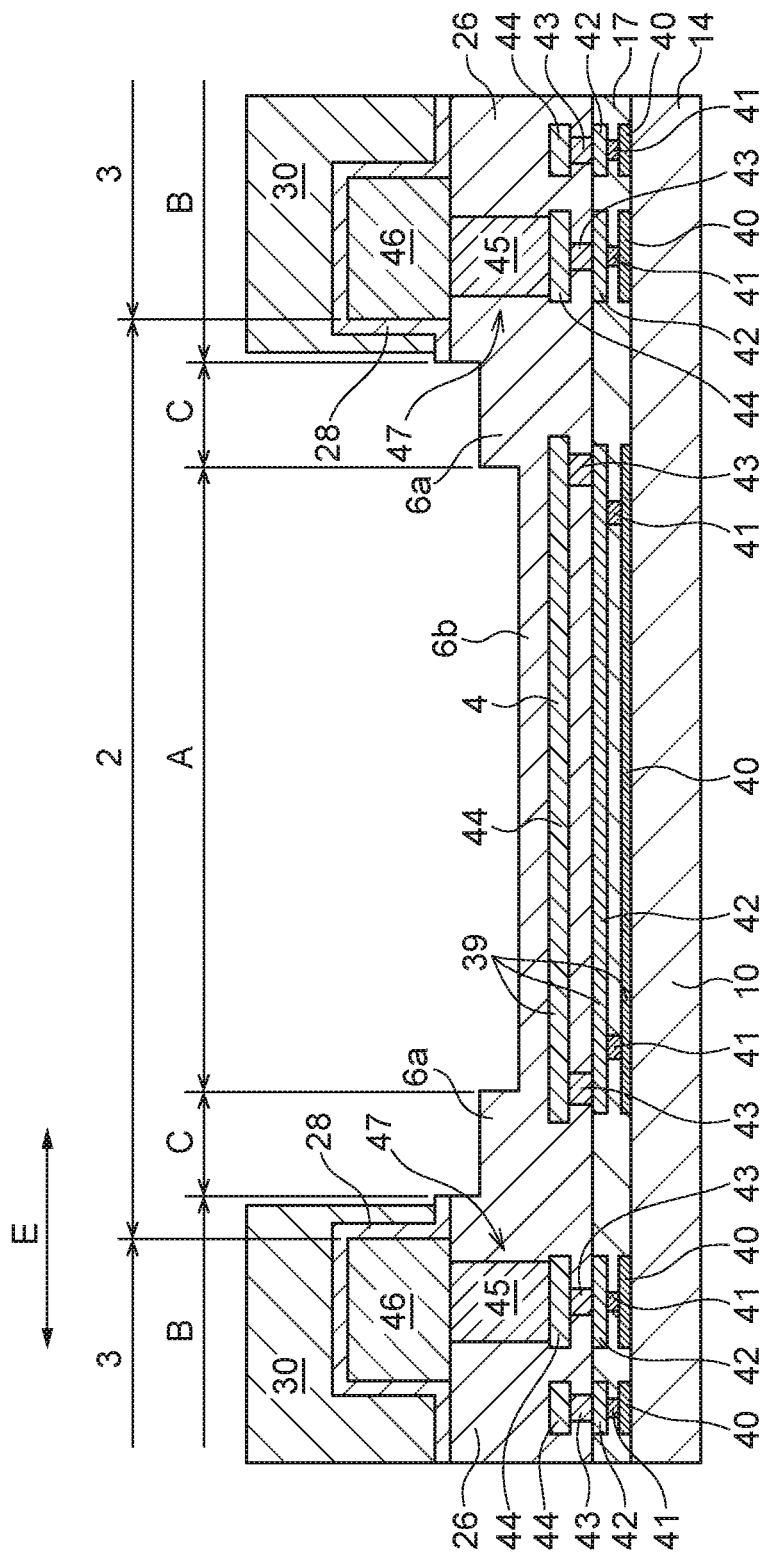
FIGS. 11A and 11B are longitudinal sections illustrating one example of a step partway through a method of forming the semiconductor device according to the first embodiment.
Figure 11B:
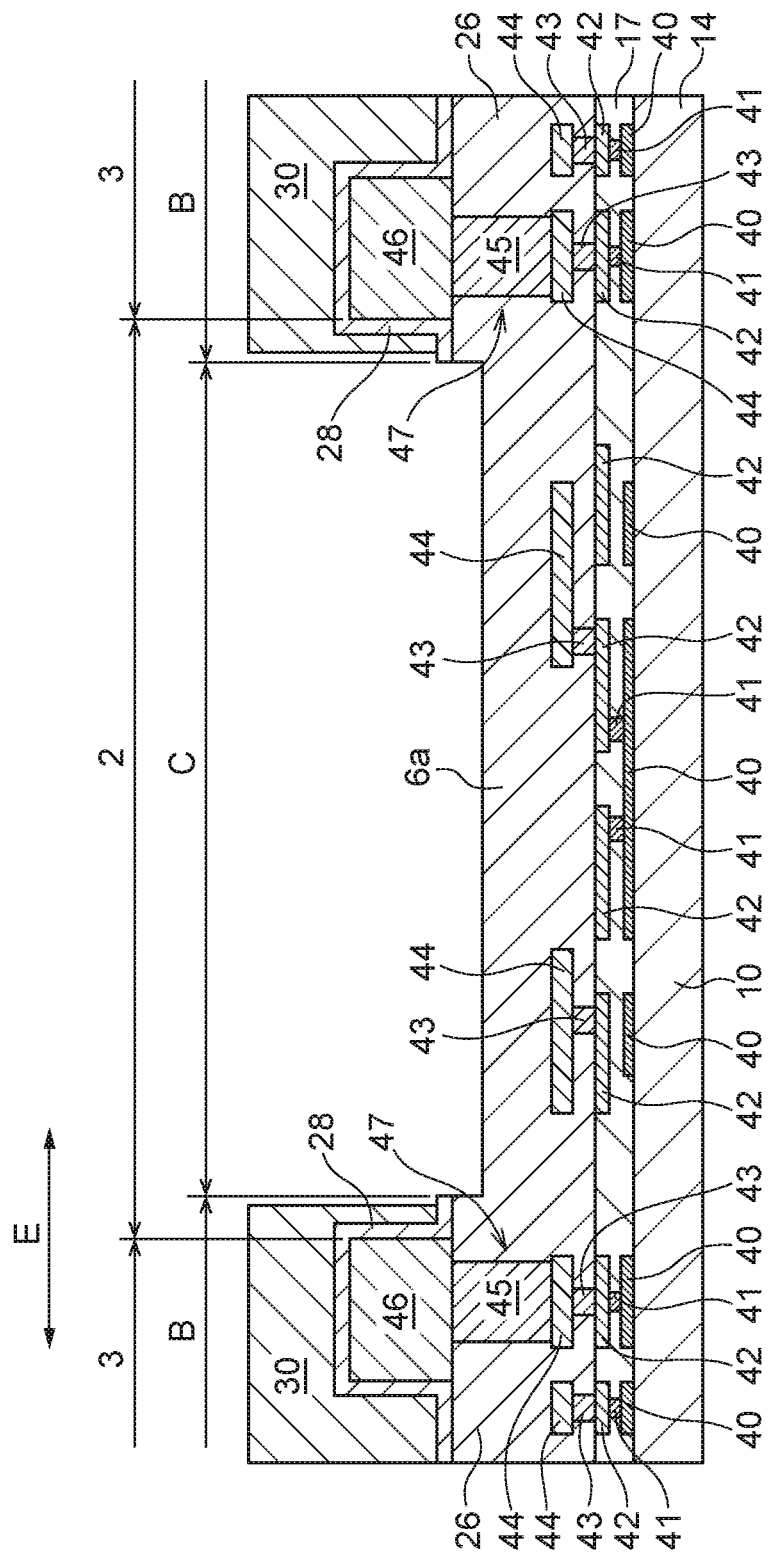

Next, as illustrated in FIGS. 10A and 10B, the photoresist pattern 55 is removed. The photoresist pattern 55 is removed by ashing using an oxygen plasma, for example. Next, as illustrated in FIGS. 11A and 11B, the polyimide film 30 is formed to cover the portion B. The polyimide film 30 contains a negative photosensitive resin, for example. The polyimide film 30 is patterned as follows. A pre-process polyimide varnish is dripped onto the semiconductor substrate 14 and applied by spin coating, and a softbake is performed to evaporate unwanted solvent. Next, the polyimide is patterned by performing exposure and development processes.

Next, as illustrated in FIGS. 4A and 4B, anisotropic etching is performed on the insulating films 6a and 6b using the polyimide film 30 as an etching mask. By this etching, the insulating film 6b on top of the metal pads 4 is removed, leaving the surface of the metal pads 4 exposed. Also, in the portion C, the thickness of the insulating film 6a is reduced by the etching, and the insulating film 6 with the thickness S2 is formed. The portion C is also disposed in the peripheral part of the metal pads 4. For this reason, the insulating film 6a is also provided on the peripheral part of the metal pads 4. Through the above steps, a semiconductor device 1a according to the first embodiment is formed.

According to the semiconductor device 1a and the method for forming the same according to the first embodiment, the following effects are exhibited.

The metal pads 4 provided in the scribe portion 2 are included in the third metal wiring layer 44, which is part of the intermediate metal layer 39. The metal pads 4 are not formed by the thick uppermost metal layer 46, but instead are formed by the thin third metal wiring layer 44. With this arrangement, the occurrence of cracks in the dicing step is suppressed. Also, the insulating film 6 formed in the portion C of the scribe portion 2 is reduced in thickness. This also suppresses the occurrence of cracks in the dicing step.

Furthermore, the stacked structure 47 is provided in the main circuit portions 3 along the boundary with the scribe portion 2. The first metal wiring layer 40, the first connecting portion 41, and the second metal wiring layer 42 are provided with the low-k insulating film 17 in between and on the sides thereof. Laser grooving is used to remove the metal wiring layers 40, 42, 43, and 44, the connecting portions 41 and 43, and the low-k insulating film 17 in the dicing region before dicing. At this time, the stacked structure 47 is disposed to protect the main circuit portions 3 from heat and shock. Furthermore, it is possible to suppress the propagation of cracks produced during dicing into the main circuit portions 3.

In the photoresist pattern 55, the photoresist pattern 55a having the thickness S2 and the photoresist pattern 55b having the thickness S1 smaller than the thickness S2 are formed. The photoresist pattern 55 functions as an etching mask in the step of etching the insulating film 26. The photoresist pattern 55a having the thickness S2 and the photoresist pattern 55b having the thickness S1 smaller than the thickness S2 are achieved as follows. The photomask 66 used in the exposure of the resist is provided with the portions A1, B1, and C1 having different transmittance rates. The portion A1 is provided with the glass substrate 60, the halftone material 62, and the light shading member 61 to shade light. The portion B1 is provided with the glass substrate 60 to allow light to pass through. The portion C1 is provided with the glass substrate 60 and the halftone material 62 to allow a portion of light to pass through.

The light transmittance rates have the following relationship:

Transmittance rate of portion B1>transmittance rate of portion C1>transmittance rate of portion A1.

The portion A1 of the photomask 66 is disposed in correspondence with the portion A on the semiconductor substrate 14. Because the portion A of the semiconductor substrate 14 is not irradiated with light, a resist pattern is not formed. The portion B1 of the photomask 66 is disposed in correspondence with the portion B on the semiconductor substrate 14. The photoresist pattern 55a having the thickness S2 is formed in the portion B of the semiconductor substrate 14. The portion C1 of the photomask 66 is disposed in correspondence with the portion C on the semiconductor substrate 14. Because the portion C of the semiconductor substrate 14 is irradiated by a portion of the light that passes through the portion C1, the photoresist pattern 55b having the thickness S1 smaller than the thickness S2 is formed.

Also, at this point, the photoresist pattern 55b having the thickness S1 is set to a thickness such that the photoresist pattern 55b is eliminated partway through the insulating film etching step. The photoresist pattern 55a having the thickness S2 is set to a thickness such that the photoresist pattern 55a is not eliminated and still remains after the insulating film etching step. With this arrangement, the insulating films 26 and 6 having different remaining thicknesses can be formed. In this way, according to the first embodiment, a resist pattern having different thicknesses can be formed by a single lithography step. Additionally, with this arrangement, the semiconductor device 1a having the insulating films 26 and 6 with different thicknesses can be provided by a single lithography step. Because the number of steps is reduced, it is possible to provide the semiconductor device 1a at a reduced cost.

Second Embodiment

Hereinafter, a semiconductor device 1b and a method of forming the same according to a second embodiment will be described with reference to FIGS. 6A and 6B, FIGS. 8 and 8A to 8C, and FIGS. 12A and 12B to FIGS. 15A and 15B. Note that the items described in FIGS. 1, 2, 3, 5A, and 5B are also applied to the second embodiment.

Figure 12A:
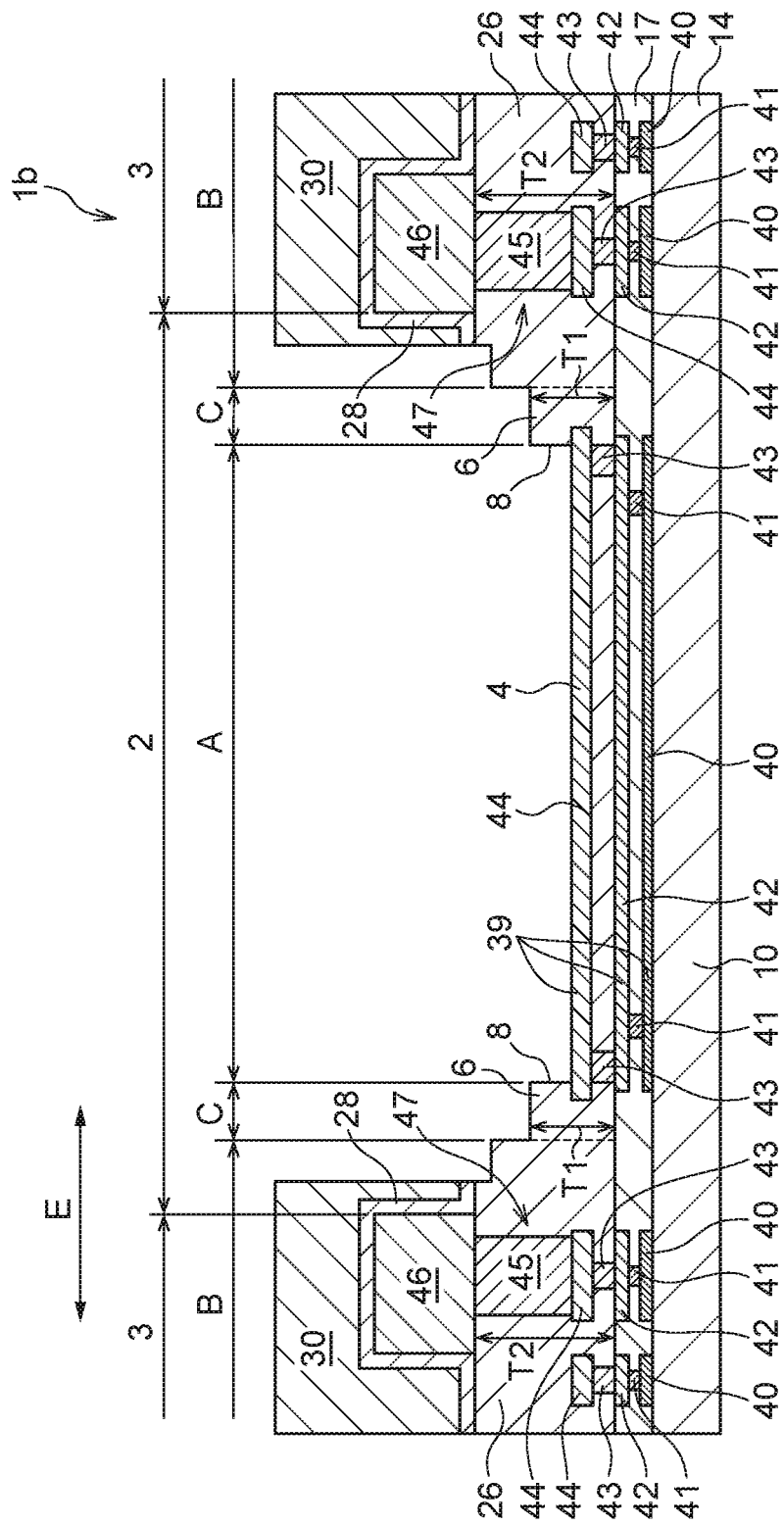
FIGS. 12A and 12B are diagrams illustrating one example of a schematic configuration of a scribe portion of a semiconductor device according to a second embodiment.
Figure 12B:
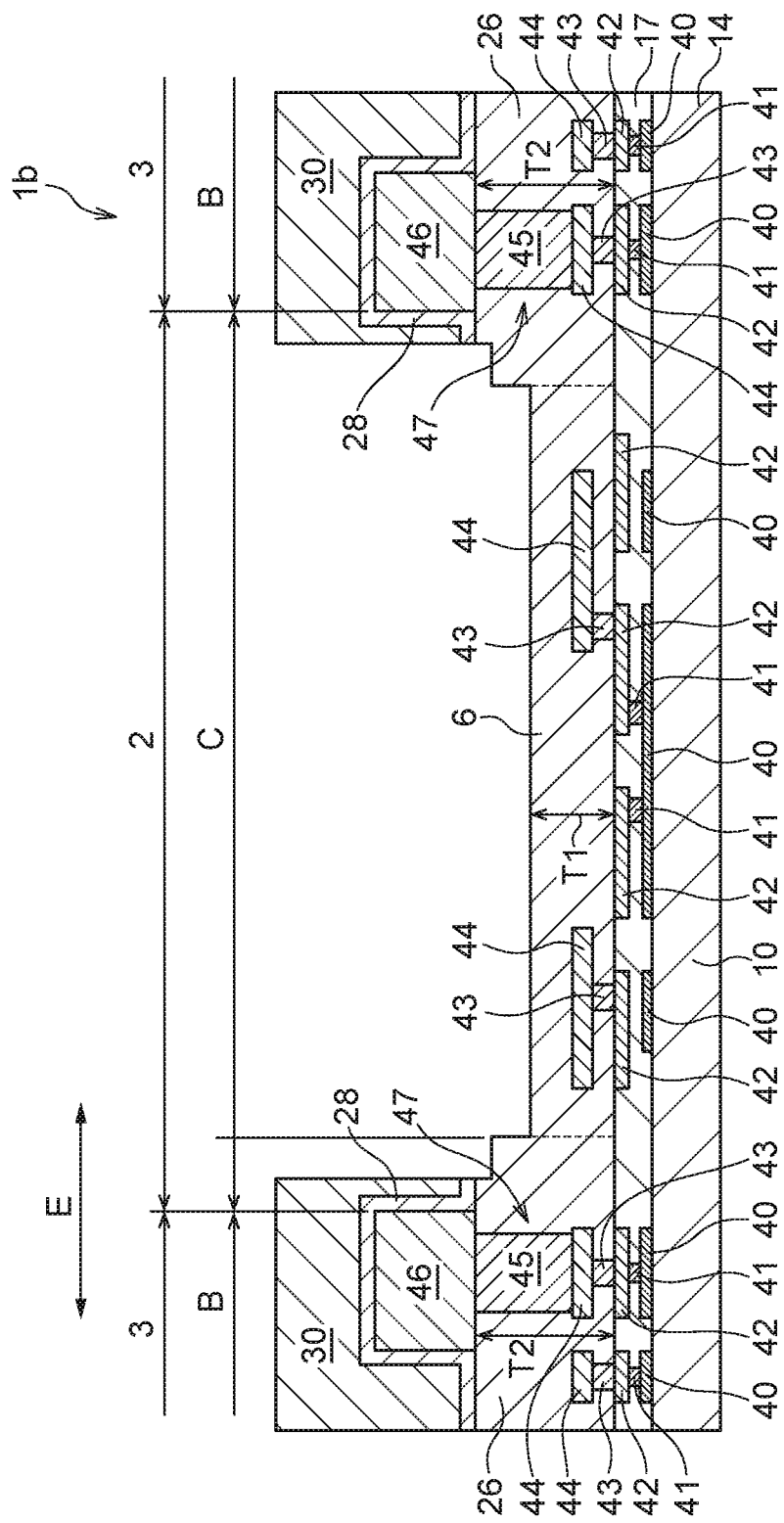

As illustrated in FIGS. 12A and 12B, in the semiconductor device 1b according to the second embodiment, like the semiconductor device 1a according to the first embodiment, the metal pads 4 provided in the scribe portion 2 are included in the third metal wiring layer 44, which is part of the intermediate metal layer 39. The metal pads 4 are not formed by the thick uppermost metal layer 46, but instead are formed by the thin third metal wiring layer 44.

Also, the insulating film 6 formed in the portion C of the scribe portion 2 is reduced in thickness. Furthermore, each main circuit portion 3 is provided with the stacked structure 47 that includes the first metal wiring layer 40, the first connecting portion 41, the second metal wiring layer 42, the second connecting portion 43, the third metal wiring layer 44, the second connecting portion 45, and the uppermost metal layer 46 in a location near the scribe portion 2. The first metal wiring layer 40, the first connecting portion 41, and the second metal wiring layer 42 are provided with the low-k insulating film 17 in between and on the sides thereof. The rest of the configuration is substantially the same as the semiconductor device 1a according to the first embodiment.

A method of forming the semiconductor device 1b according to the second embodiment will be described with reference to FIGS. 12A and 12B to FIGS. 15A and 15B, FIGS. 6A and 6B, and FIGS. 8 and 8A to 8C.

Figure 13A:
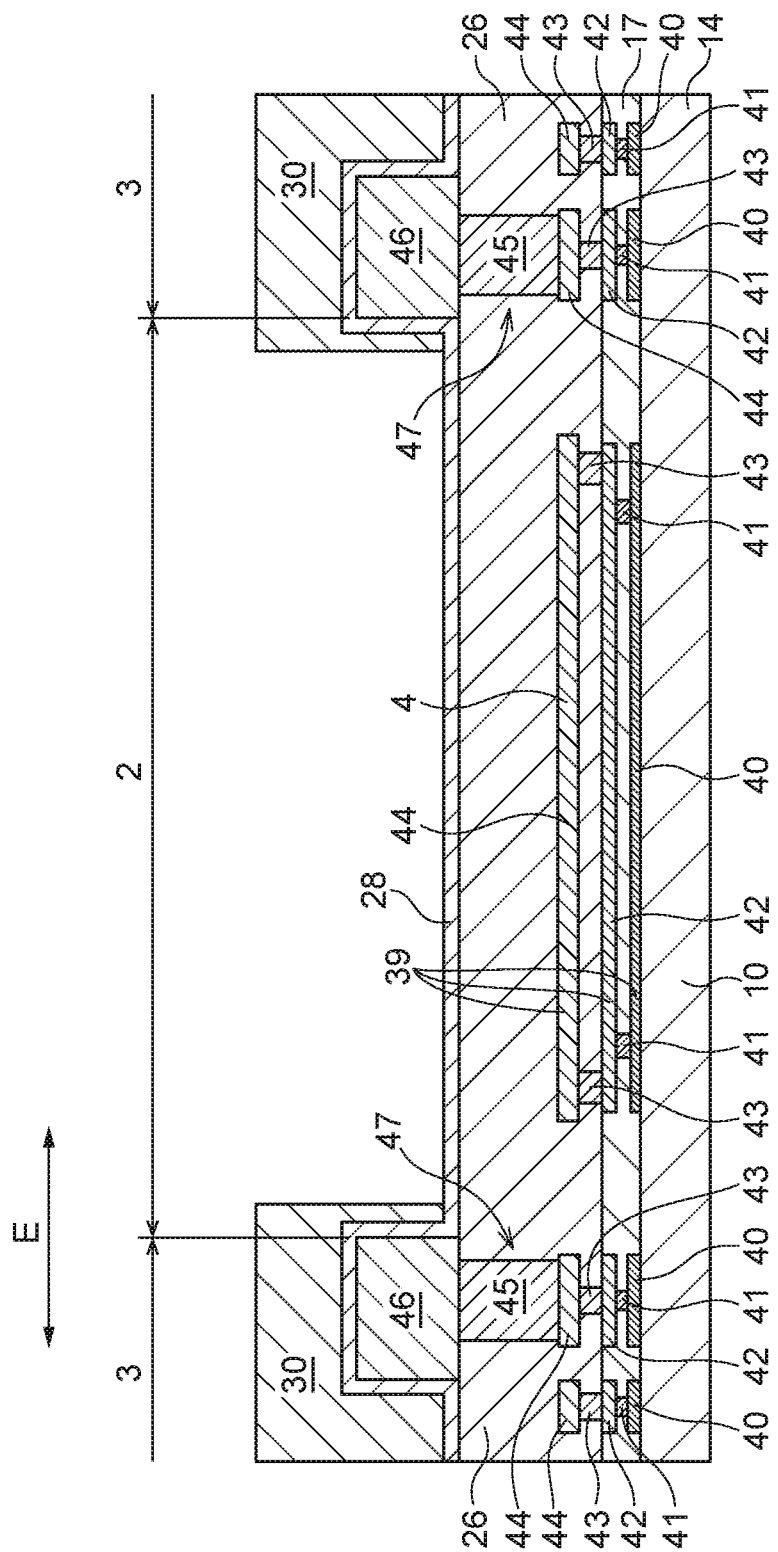
FIGS. 13A and 13B are longitudinal sections illustrating one example of a step partway through a method of forming the semiconductor device according to the second embodiment.
Figure 13B:
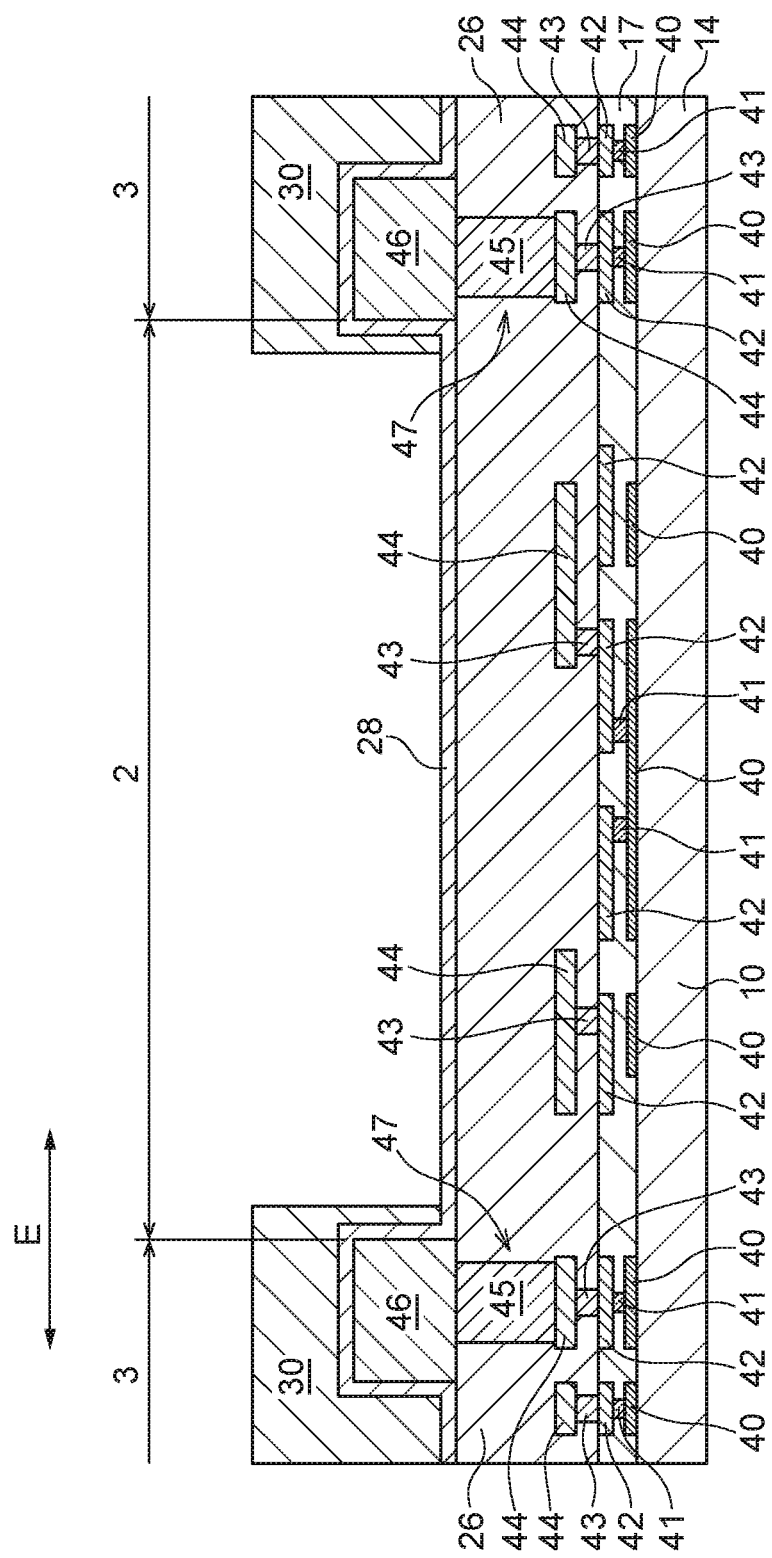

First, the step illustrated in FIGS. 6A and 6B is performed similarly to the first embodiment. Next, as illustrated in FIGS. 13A and 13B, the polyimide film 30 is formed to cover the stacked structure 47 and the main circuit portions 3. The polyimide film 30 contains a negative photosensitive resin, for example. The patterning method of the polyimide film 30 is similar to the first embodiment.

Figure 14A:
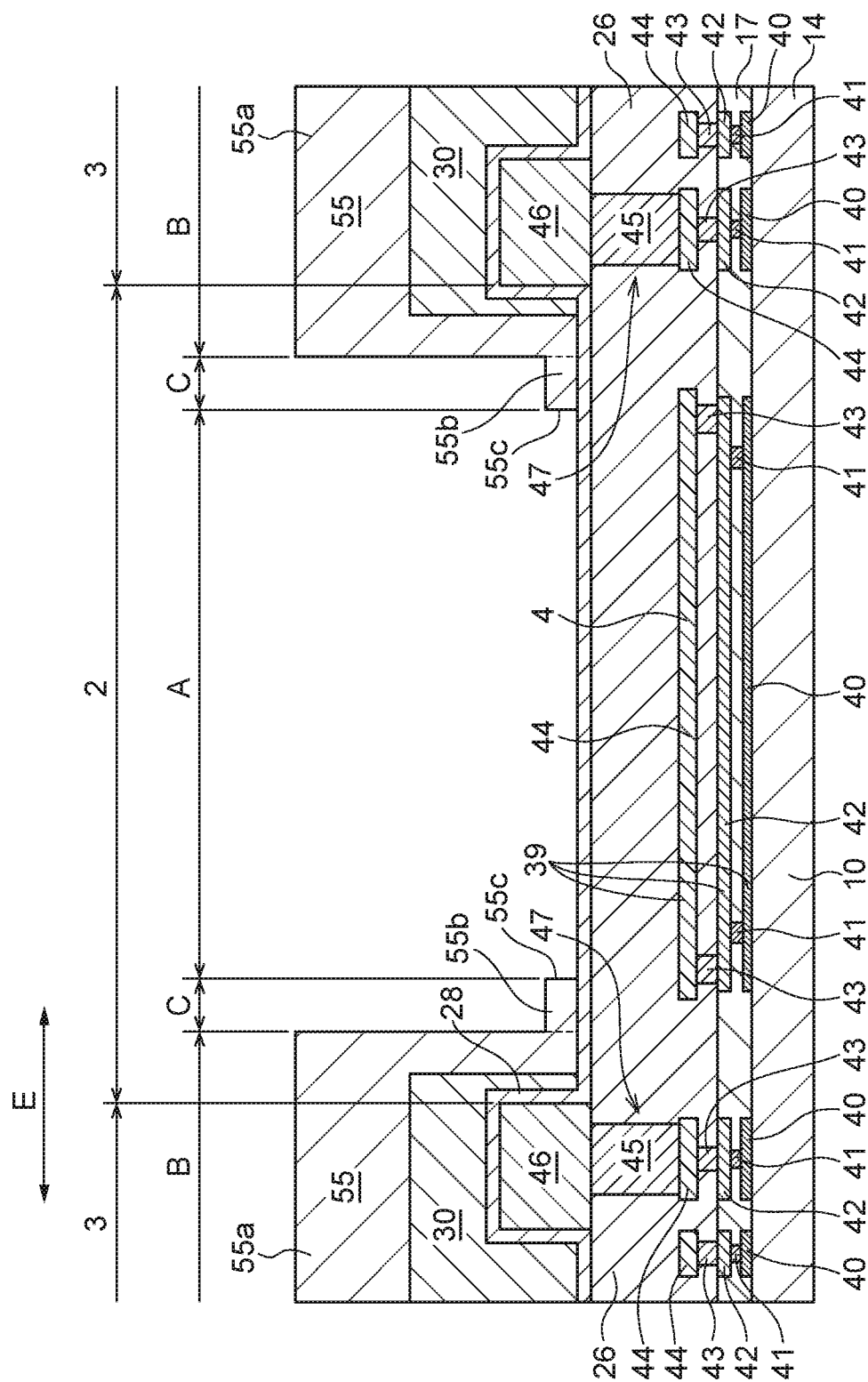
FIGS. 14A and 14B are diagrams illustrating one example of a schematic configuration of a scribe portion of a semiconductor device according to the second embodiment.
Figure 14B:
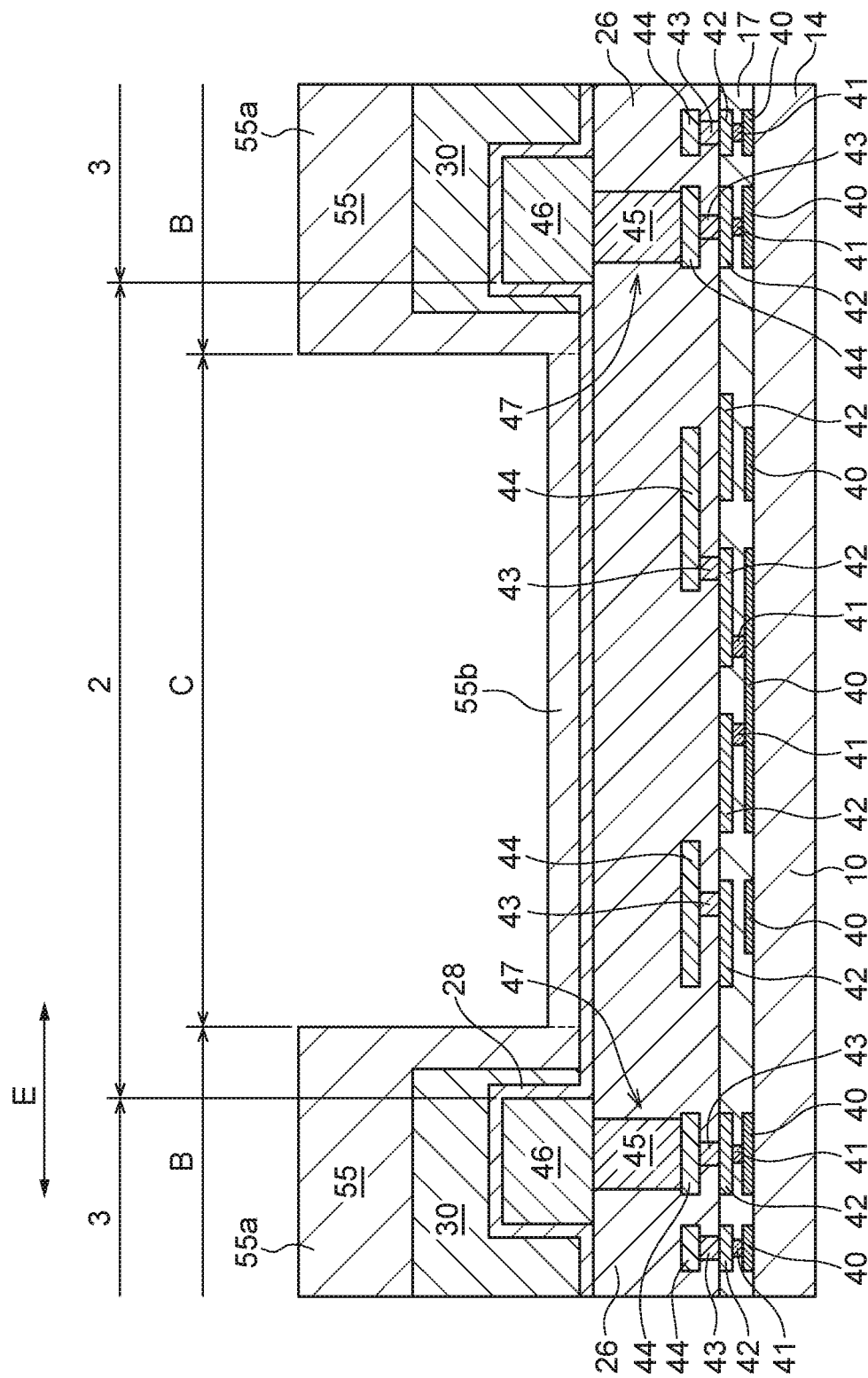

Next, as illustrated in FIGS. 14A and 14B, the photoresist pattern 55 covering the portions B and C is formed. The photoresist pattern 55 is provided with the photoresist pattern 55a having a large resist thickness and the photoresist pattern 55b having a small resist thickness. In addition, the photoresist pattern 55 is provided with the opening 55c. The photoresist pattern 55 contains a negative photosensitive resin, for example.

In the lithography step illustrated in FIGS. 14A and 14B, the photomask 66 provided with the portions A1, B1, and C1 illustrated in FIG. 8 is used as an exposure mask. As illustrated in FIGS. 14A and 14B, FIG. 8, and FIGS. 8A to 8C, the portion A1 of the photomask 66 is disposed in correspondence with the portion A of the semiconductor substrate 14. Because light is shaded by the portion A1 of the photomask 66, the portion A is not irradiated with light. Consequently, in the portion A, the photoresist pattern 55 is not formed, and instead, the opening 55c is formed.

The portion B1 of the photomask 66 is disposed in correspondence with the portion B of the semiconductor substrate 14. In the portion B, the light passing through the portion B1 of the photomask 66 is not reduced, and therefore the exposure value increases and the photoresist pattern 55a having the larger thickness S2 is formed. The portion C1 of the photomask 66 is disposed in correspondence with the portion C of the semiconductor substrate 14. In the portion C, the exposure value is smaller because of the reduction in the transmitted light, and therefore the photoresist pattern 55b having the thickness S1 smaller than the thickness S2 is formed.

Figure 15A:
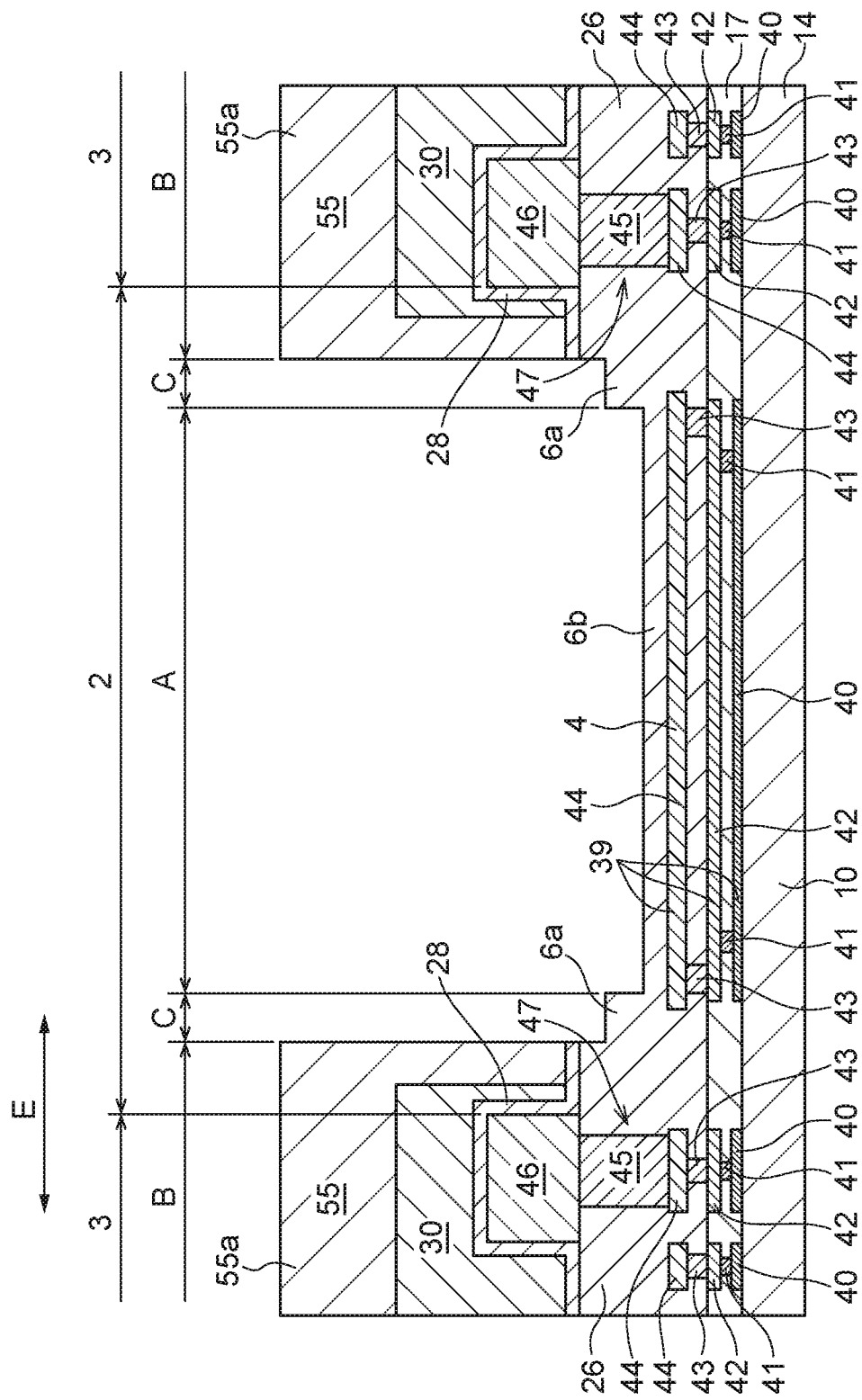
FIGS. 15A and 15B are diagrams illustrating one example of a schematic configuration of a scribe portion of a semiconductor device according to the second embodiment.
Figure 15B:
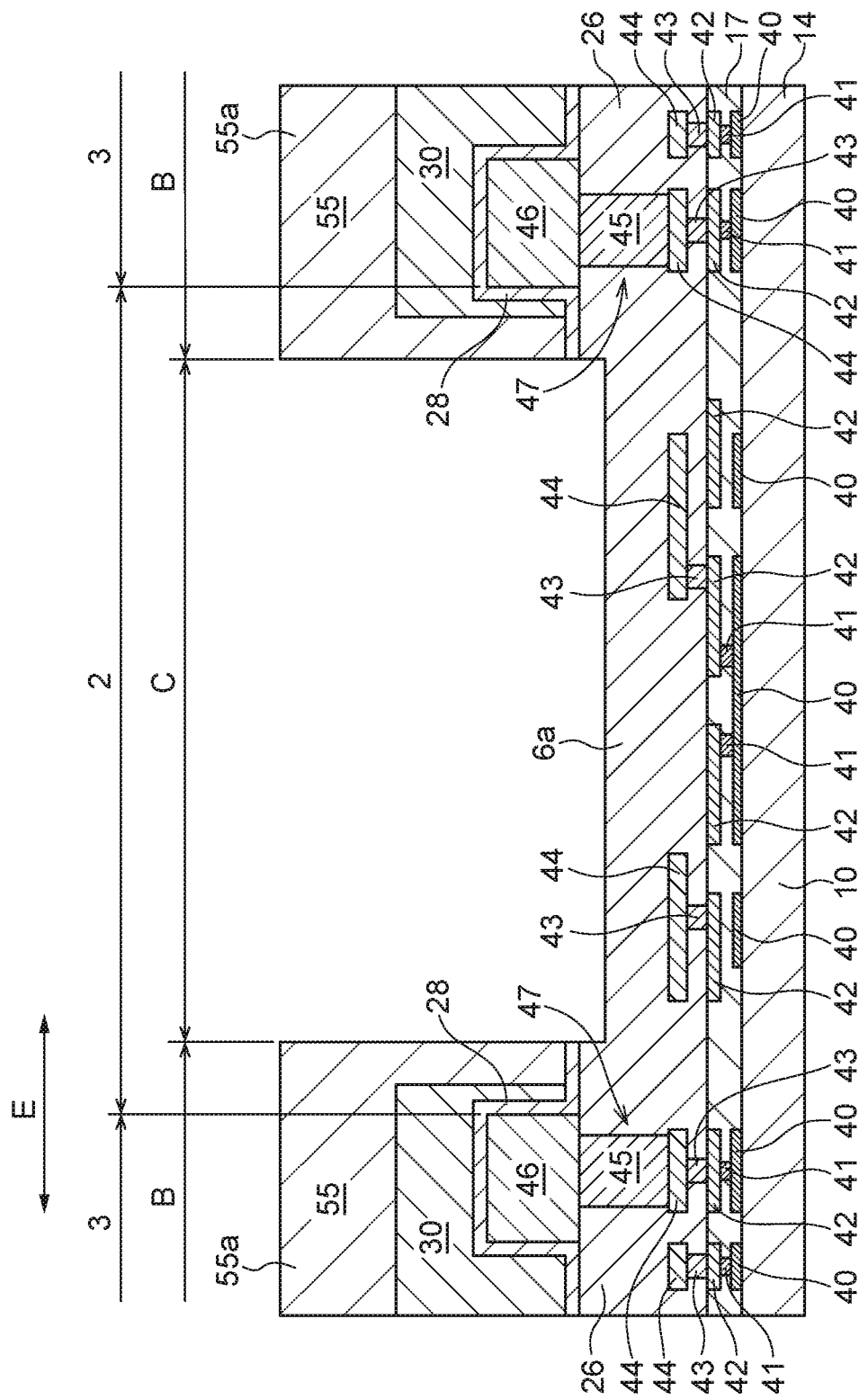

Next, as illustrated in FIGS. 15A and 15B, anisotropic dry etching is performed on the insulating film 28 and the insulating film 26 using the photoresist pattern 55 as an etching mask. With this arrangement, in the portion A, the insulating film 28 and the insulating film 26 are etched. At this time, the etching is controlled such that the insulating film 6b remains on the metal pads 4. Because the photoresist pattern 55b is less thick in the portion C, the photoresist pattern 55b is eliminated partway through the etching. After the photoresist pattern 55b is eliminated, the insulating film 28 and the insulating film 26 in the portion C are etched, and an insulating film 6a that is thicker than the insulating film 6b but thinner than the insulating film 26 is formed.

Next, as illustrated in FIGS. 12A and 12B, the photoresist pattern 55 is removed. The photoresist pattern 55 is removed by a solvent such as thinner after a plasma treatment with a gas containing oxygen, for example. The polyimide film 30 is not removed. Through the above steps, the semiconductor device 1b according to the second embodiment is formed.

According to the semiconductor device 1b and the method of forming the same according to the second embodiment, effects similar to the semiconductor device 1a and the method of forming the same according to the first embodiment can be obtained.

Third Embodiment

Hereinafter, a semiconductor device 1c and a method of forming the same according to a third embodiment will be described with reference to FIGS. 6A and 6B, FIGS. 8 and 8A to 8C, and FIGS. 16A and 16B to FIGS. 22A and 22B. Note that the items described in FIGS. 1, 2, 3, 5A, and 5B are also applied to the third embodiment.

In the semiconductor device 1c according to the third embodiment, a portion D is provided between the portion C that is the region where the insulating film 6 is provided and the portion B that is the region where the insulating film 26 is formed. A groove 70 is provided in the portion D. The groove 70 is disposed in the scribe portion 2. The groove 70 is disposed between the metal pads 4 and the main circuit portions 3. The groove 70 is disposed in the scribe portion 2 along the boundary between the scribe portion 2 and the main circuit portions 3. The groove 70 is disposed to extend substantially parallel to the longitudinal direction F of the scribe portion 2. The groove 70 provided in the portion D is rectangular in cross-section, and penetrates through the low-k insulating film 17 from the top face of the insulating film 6. A bottom face 70a of the groove 70 is positioned below the bottom face of the low-k insulating film 17. The low-k insulating film 17 is penetrated by the groove 70 and divided in the width direction E. The rest of the configuration is similar to the semiconductor devices 1a and 1b according to the first and second embodiments.

Next, a method of forming the semiconductor device 1c according to the third embodiment will be described. In the description of the third embodiment, the sign 55c is used to refer to a second opening 55c.

Figure 17A:
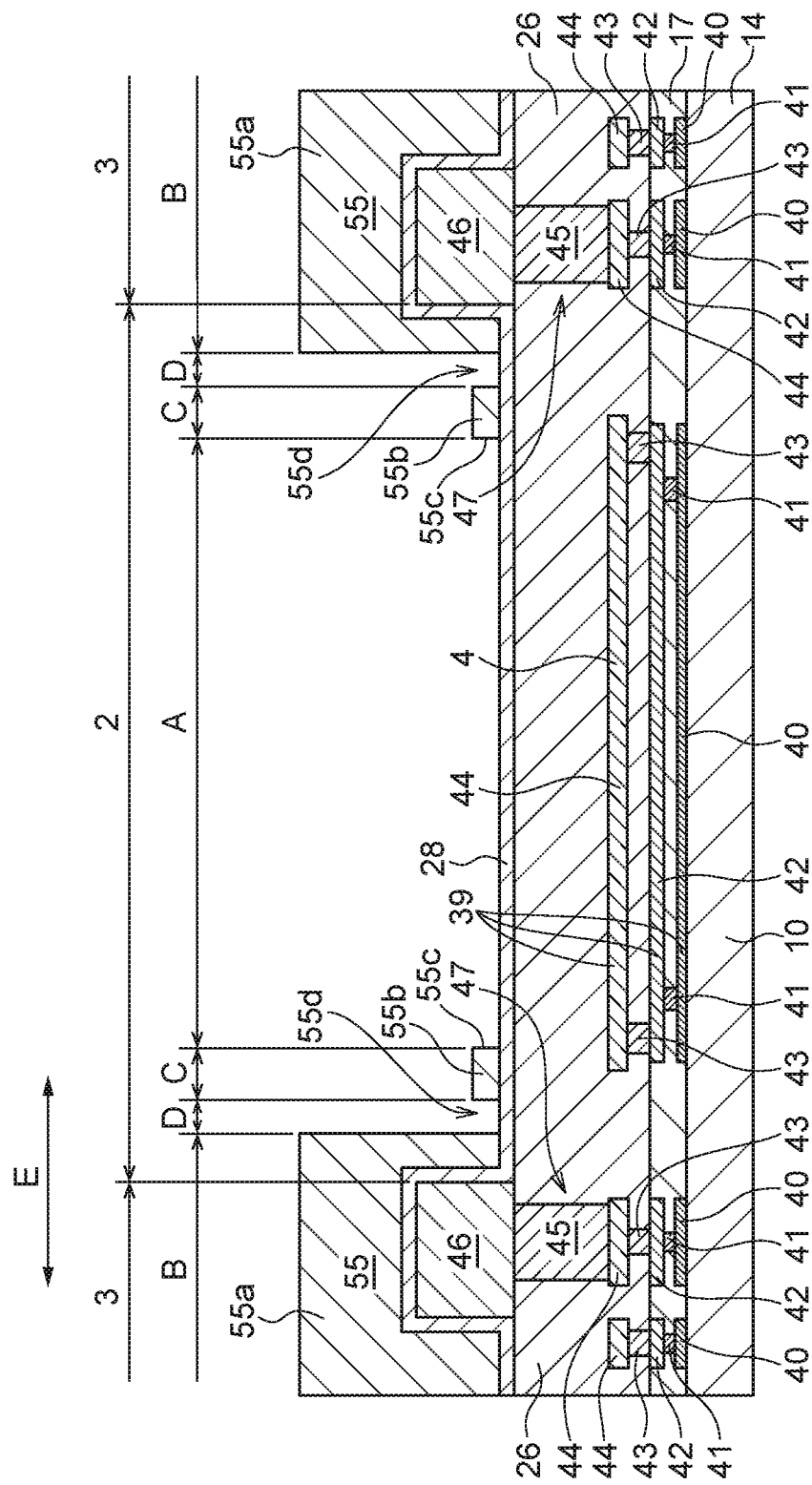
FIGS. 17A and 17B are longitudinal sections illustrating one example of a step partway through a method of forming the semiconductor device according to the third embodiment.
Figure 17B:
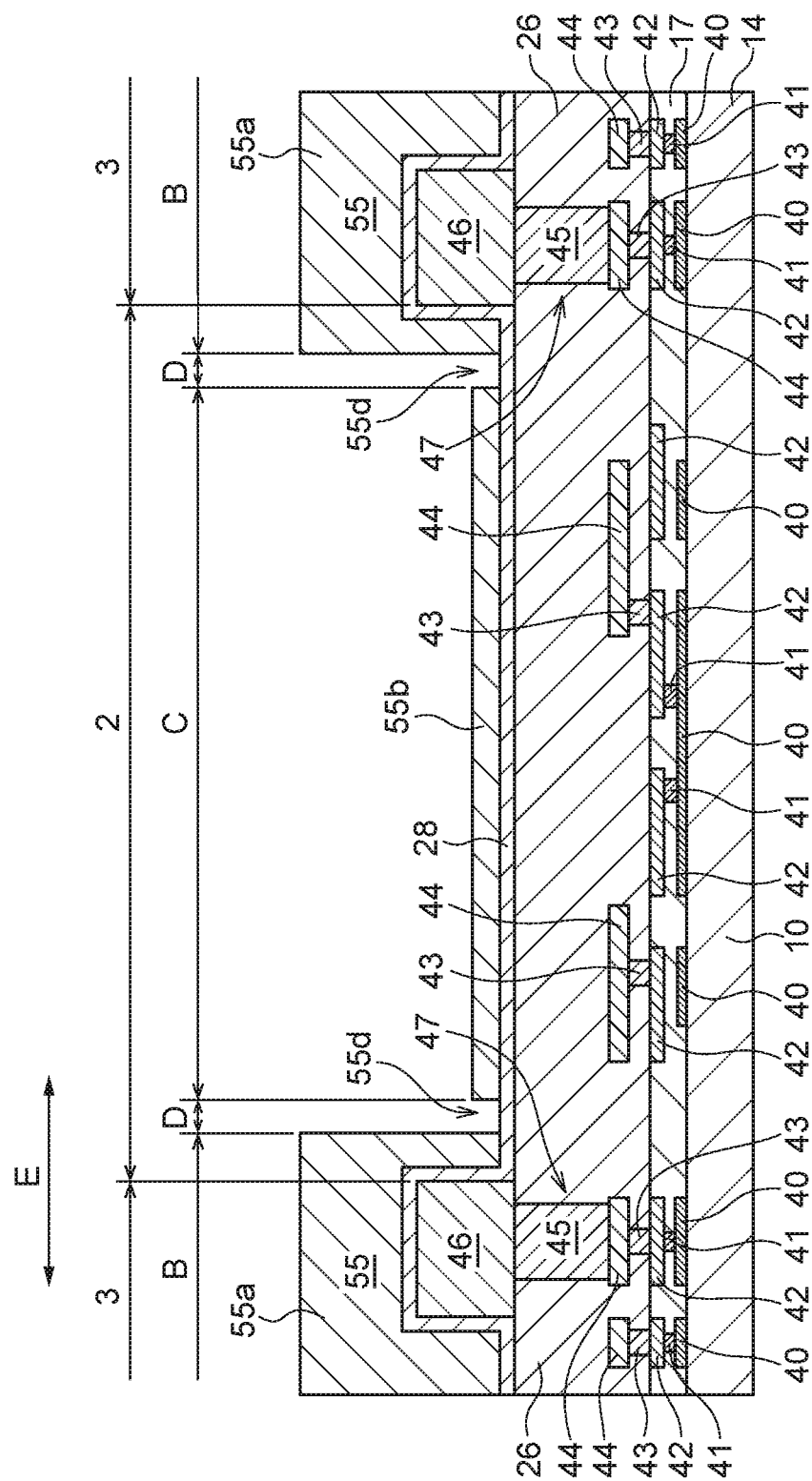

First, the step illustrated in FIGS. 6A and 6B is performed similarly to the first embodiment. Next, as illustrated in FIGS. 17A and 17B, the photoresist pattern 55 covering the portions B and C is formed. The photoresist pattern 55 is provided with the photoresist pattern 55a having a large resist thickness and the photoresist pattern 55b having a small resist thickness. The photoresist pattern 55 is provided with a first opening 55d between the photoresist pattern 55a and the photoresist pattern 55b. In addition, the photoresist pattern 55 is provided with a second opening 55c. The photoresist pattern 55 contains a negative photosensitive resin, for example. The first opening 55d corresponds to the groove 70. The second opening 55c corresponds to the opening 8 on the metal pads 4.

Figure 17C:
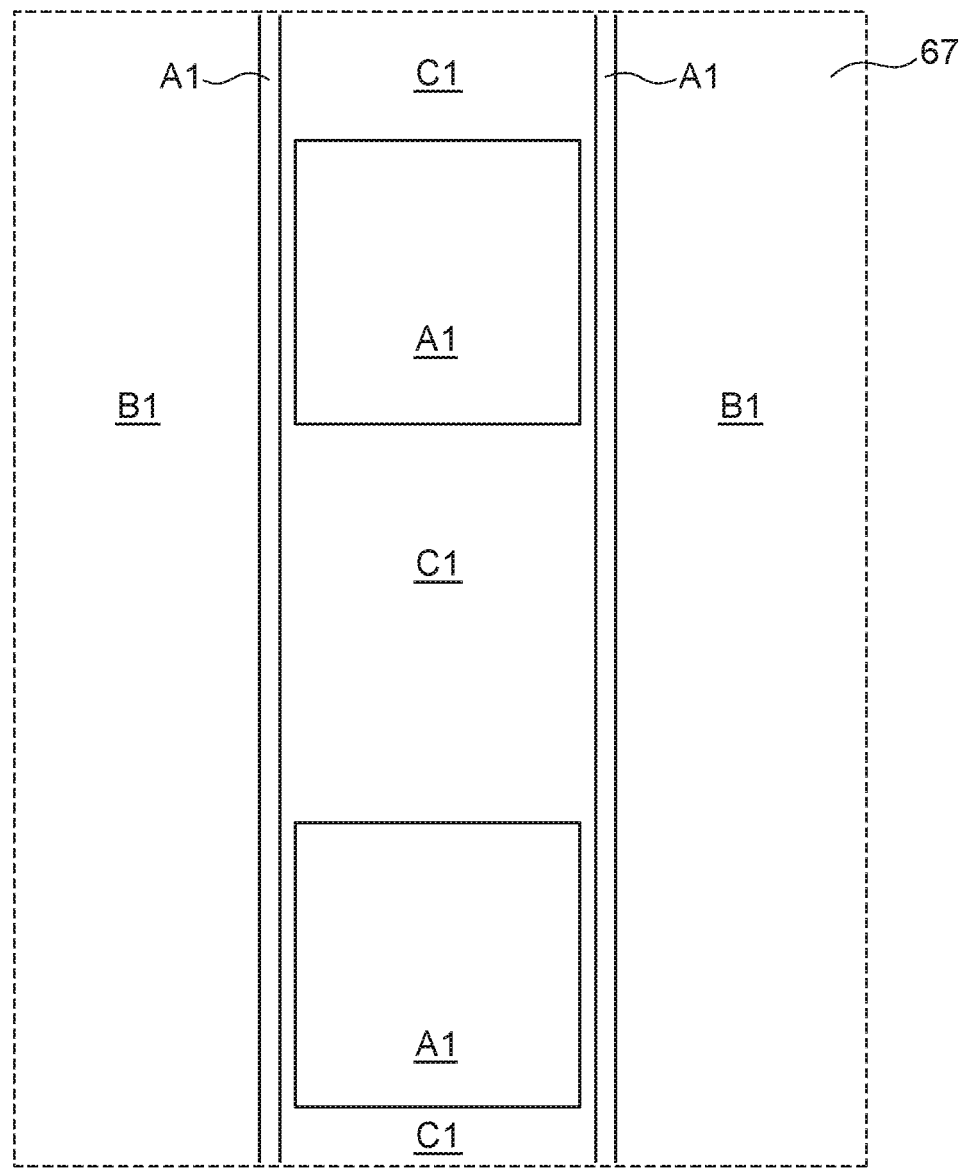
FIG. 17C is an enlarged partial plan view illustrating a schematic configuration of a photomask used in the step illustrated in FIGS. 17A and 17B.

In the lithography step illustrated in FIGS. 17A and 17B, a photomask 67 provided with the portions A1, B1, and C1 illustrated in FIG. 17C is used as an exposure mask. The structure of the portions A1, B1, and C1 is illustrated in FIGS. 8A to 8C. As illustrated in FIGS. 17A, 17B, 17C, and 8A to 8C, the portion A1 of the photomask 67 is disposed in correspondence with the portion A where the opening 8 is formed and the portion D where the groove 70 is formed on the semiconductor substrate 14. Because light is shaded by the portion A1 of the photomask 67, the portion A where the opening 8 is formed and the portion D where the groove 70 is formed are not irradiated with light. For this reason, the photoresist pattern 55 is not formed, and the first opening 55d and the second opening 55c are formed.

The portion B1 of the photomask 67 is disposed in correspondence with the portion B of the semiconductor substrate 14. In the portion B, the light passing through the portion B1 of the photomask 67 is not reduced, and therefore the exposure value increases and the photoresist pattern 55a having the larger thickness is formed. The portion C1 of the photomask 67 is disposed in correspondence with the portion C of the semiconductor substrate 14. In the portion C, the exposure value is smaller because of the reduction in the transmitted light, and therefore the photoresist pattern 55b having the thickness that is smaller than the thickness of the photoresist pattern 55a is formed.

Figure 18A:
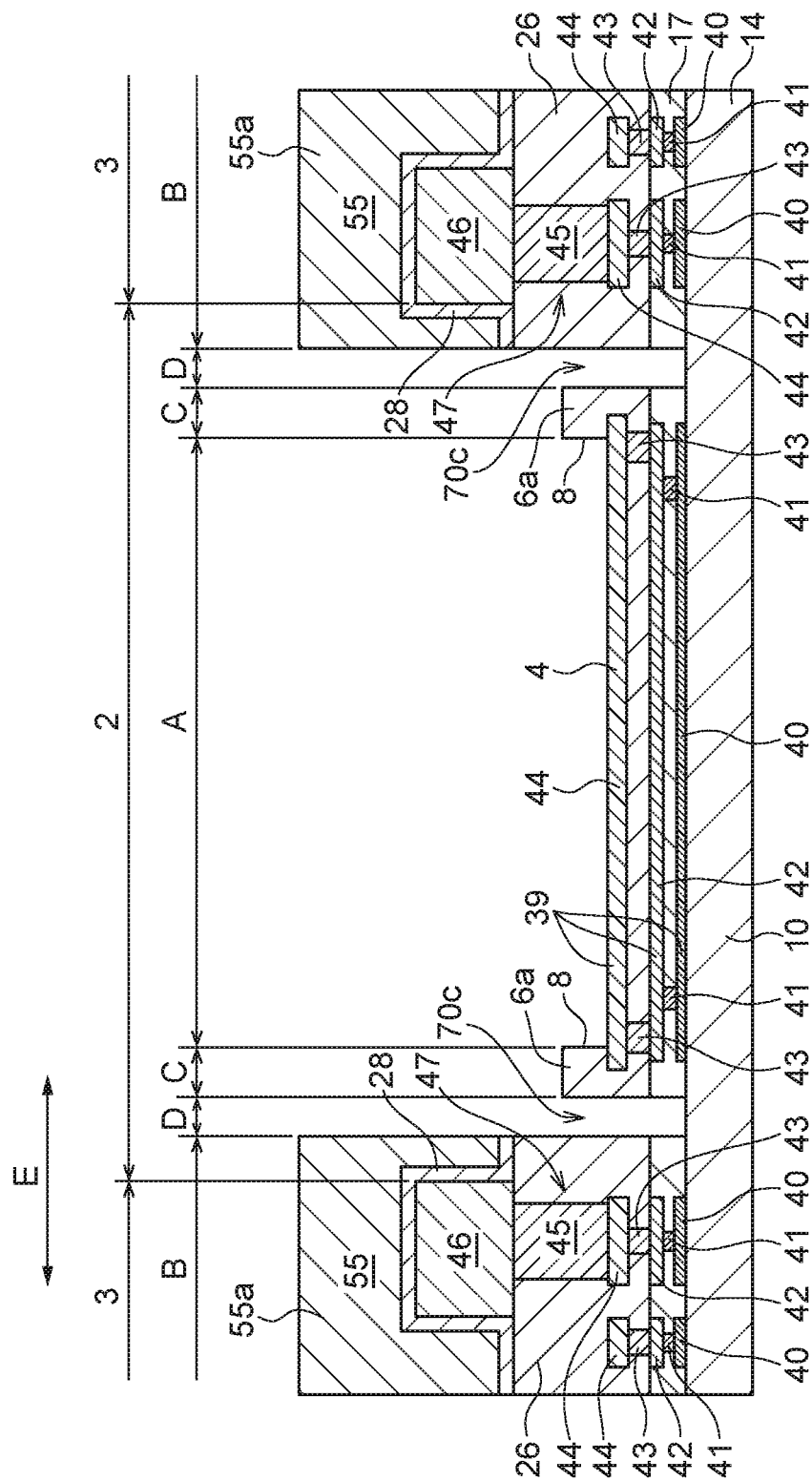
FIGS. 18A and 18B are longitudinal sections illustrating one example of a step partway through a method of forming the semiconductor device according to the third embodiment.
Figure 18B:
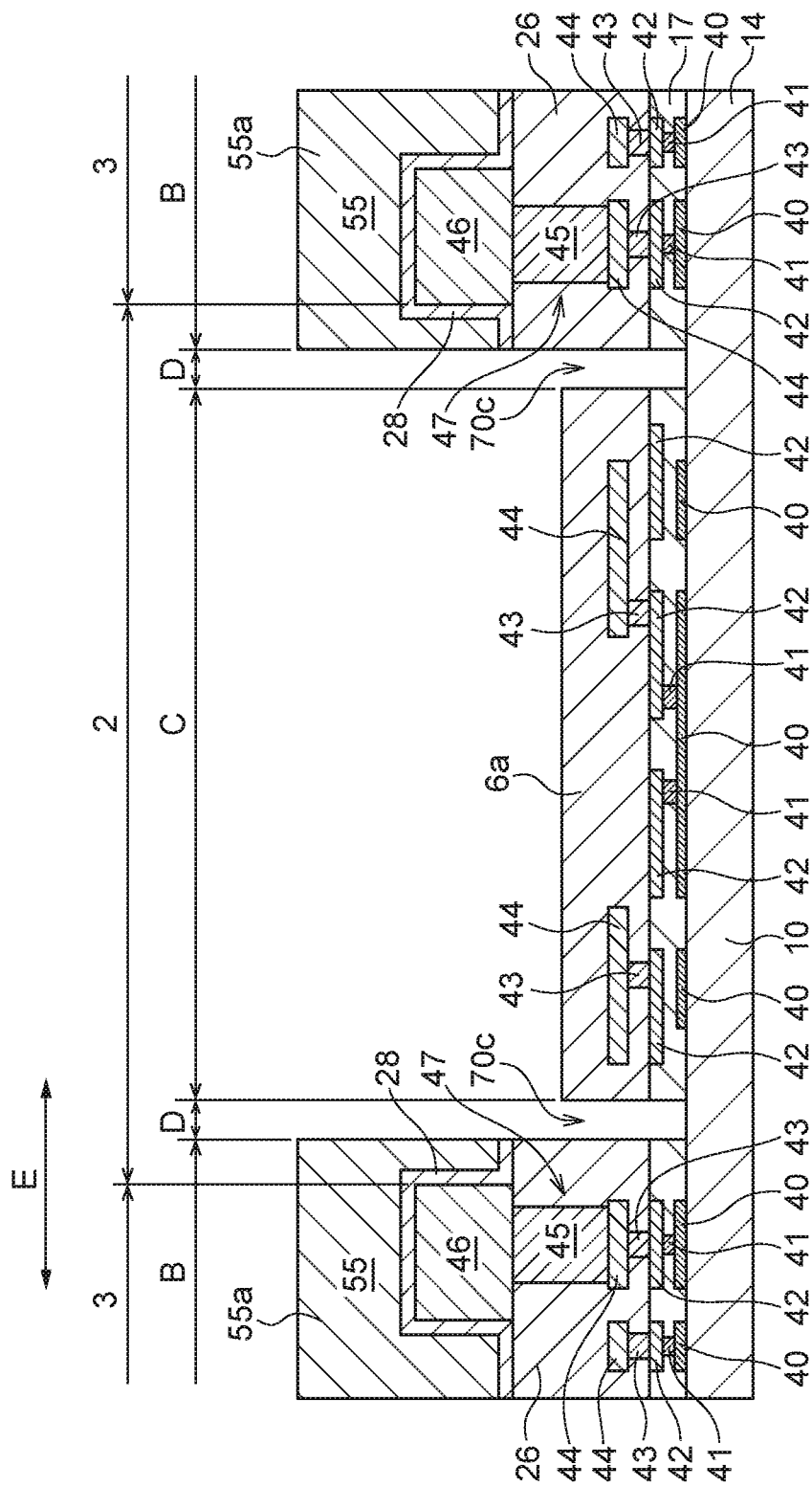

Next, as illustrated in FIGS. 18A and 18B, anisotropic dry etching is performed on the insulating film 28 and the insulating film 26 using the photoresist pattern 55 as an etching mask. With this arrangement, because the resist that acts as the etching mask does not exist in the portion D that is the region where the first opening 55d is formed, the insulating film 28, the insulating film 26, and the low-k insulating film 17 are successively etched. The etching is performed such that the film material is etched away to the bottom face of the low-k insulating film 17. In this way, a groove 70c reaching the bottom face of the low-k insulating film 17 is formed in the portion D.

Because the resist that acts as the etching mask does not exist in the portion A, the insulating film 28 and the insulating film 26 are etched, and the second opening 55c is formed. At this time, the etching advances little or not at all on the metal pads 4. For this reason, the etching ends in a state in which the insulating film 26 on the metal pads 4 has been removed, leaving the top surface of the metal pads 4 exposed. Because the photoresist pattern 55b is less thick in the portion C, the photoresist pattern 55b is eliminated partway through the etching. In the portion C, the etching of the insulating film 28 and the insulating film 26 does not advance while the photoresist pattern 55b exists. After the photoresist pattern 55b is eliminated, the etching of the insulating film 28 and the insulating film 26 in the portion C advances, and the insulating film 6a that is thinner than the insulating film 26 in the portion B is formed.

Figure 16A:
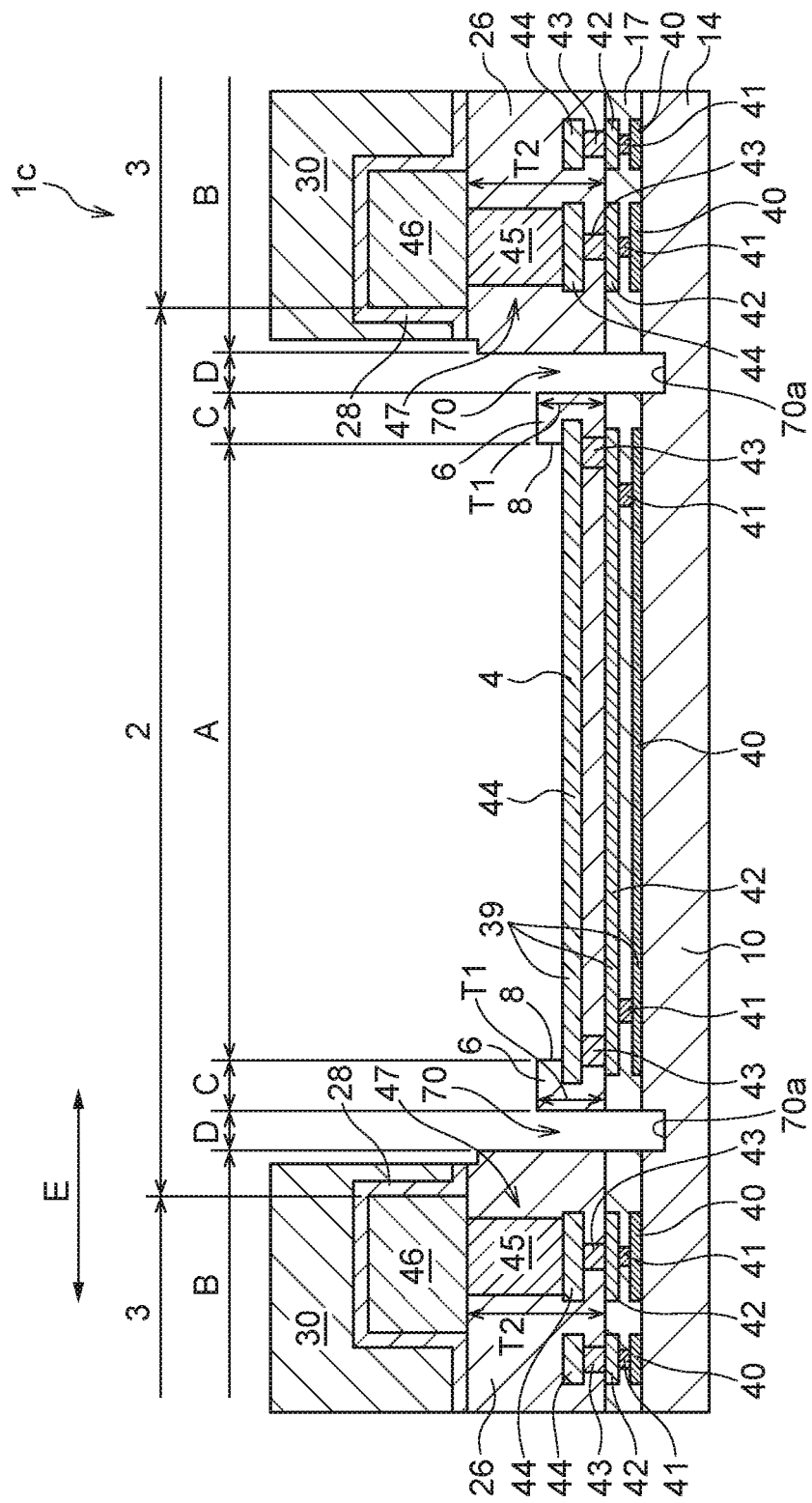
FIGS. 16A and 16B are diagrams illustrating one example of a schematic configuration of a scribe portion of a semiconductor device according to a third embodiment.
Figure 16B:
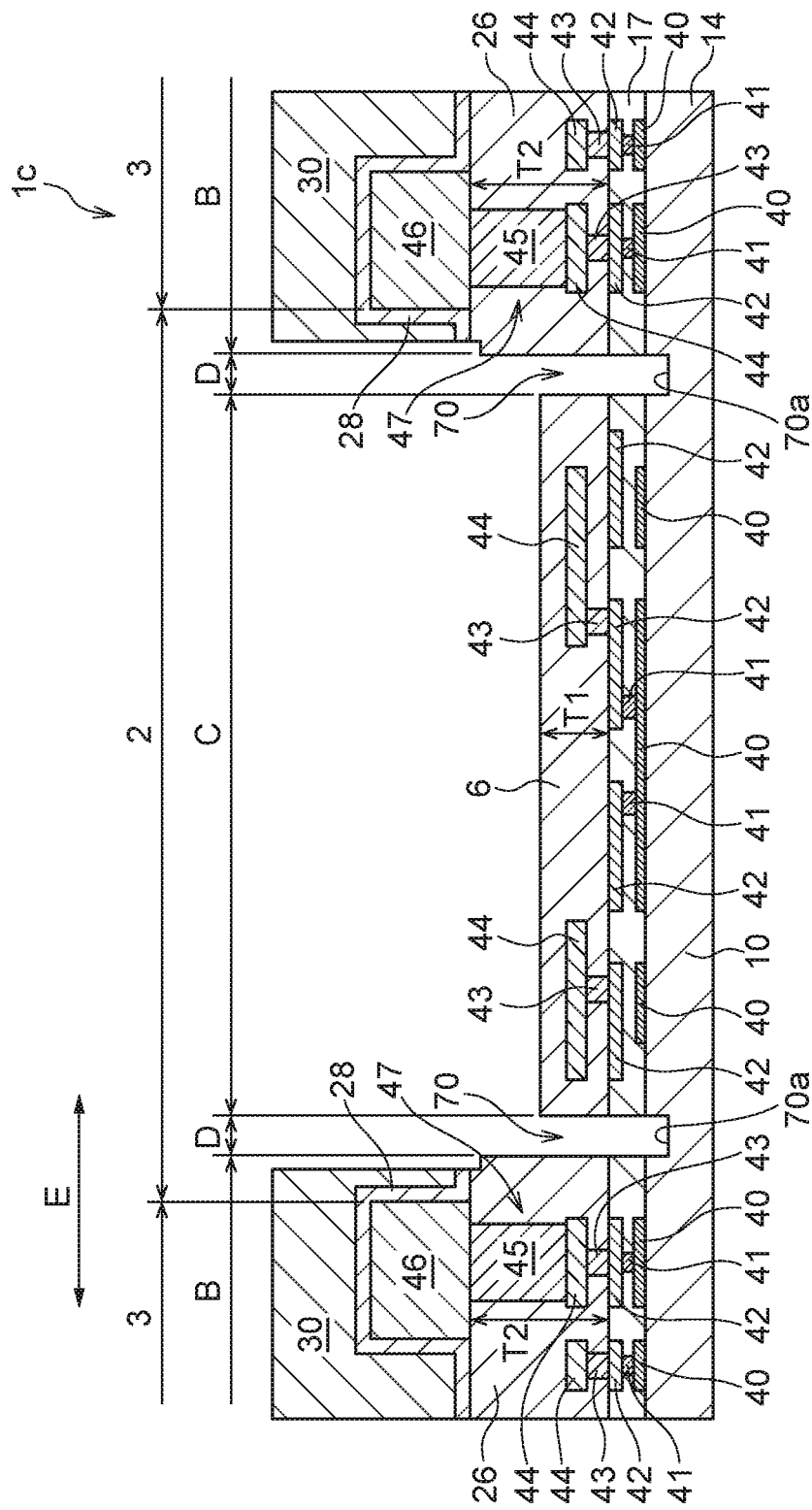
Figure 19A:
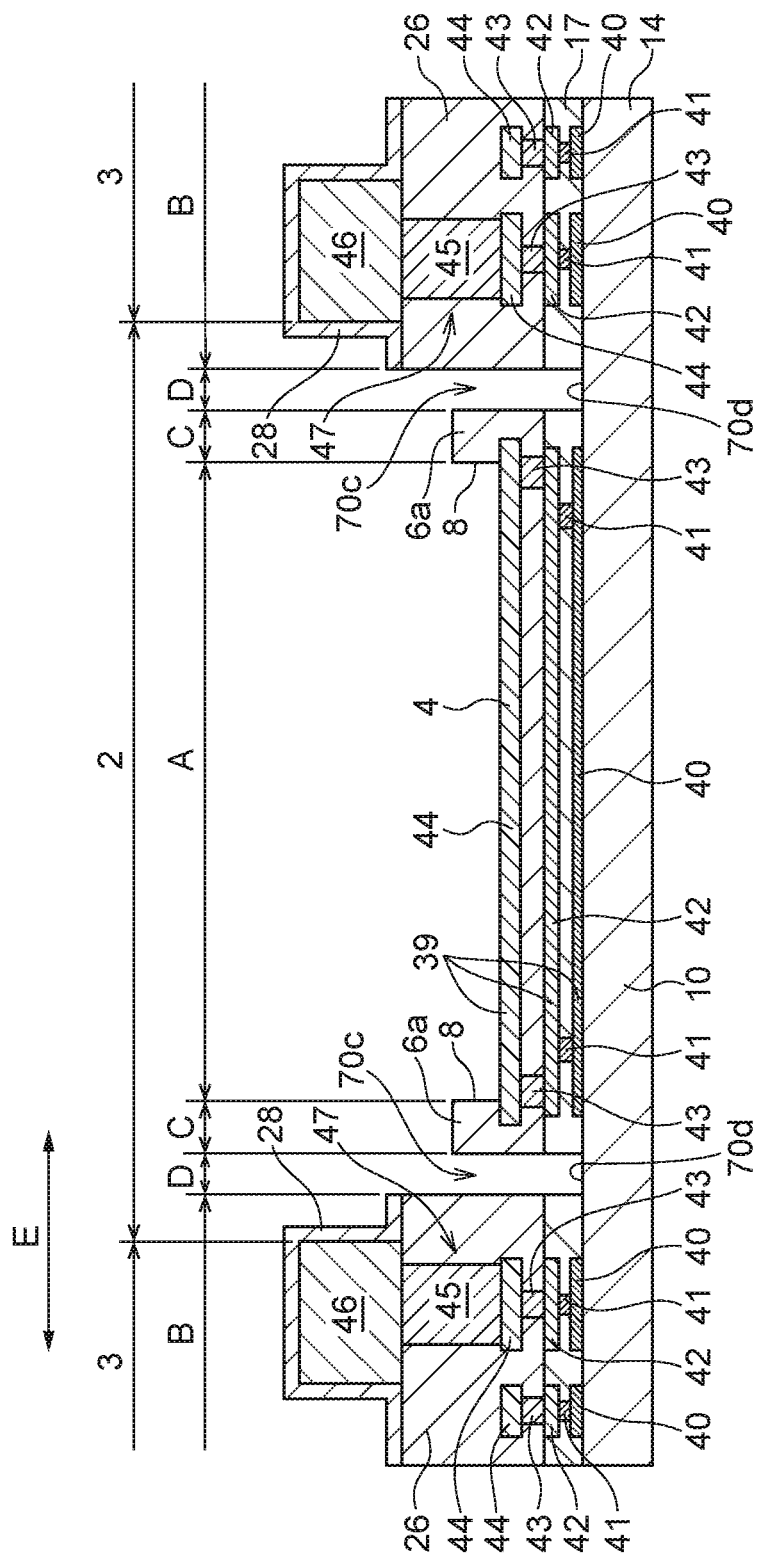
FIGS. 19A and 19B are longitudinal sections illustrating one example of a step partway through a method of forming the semiconductor device according to the third embodiment.
Figure 19B:
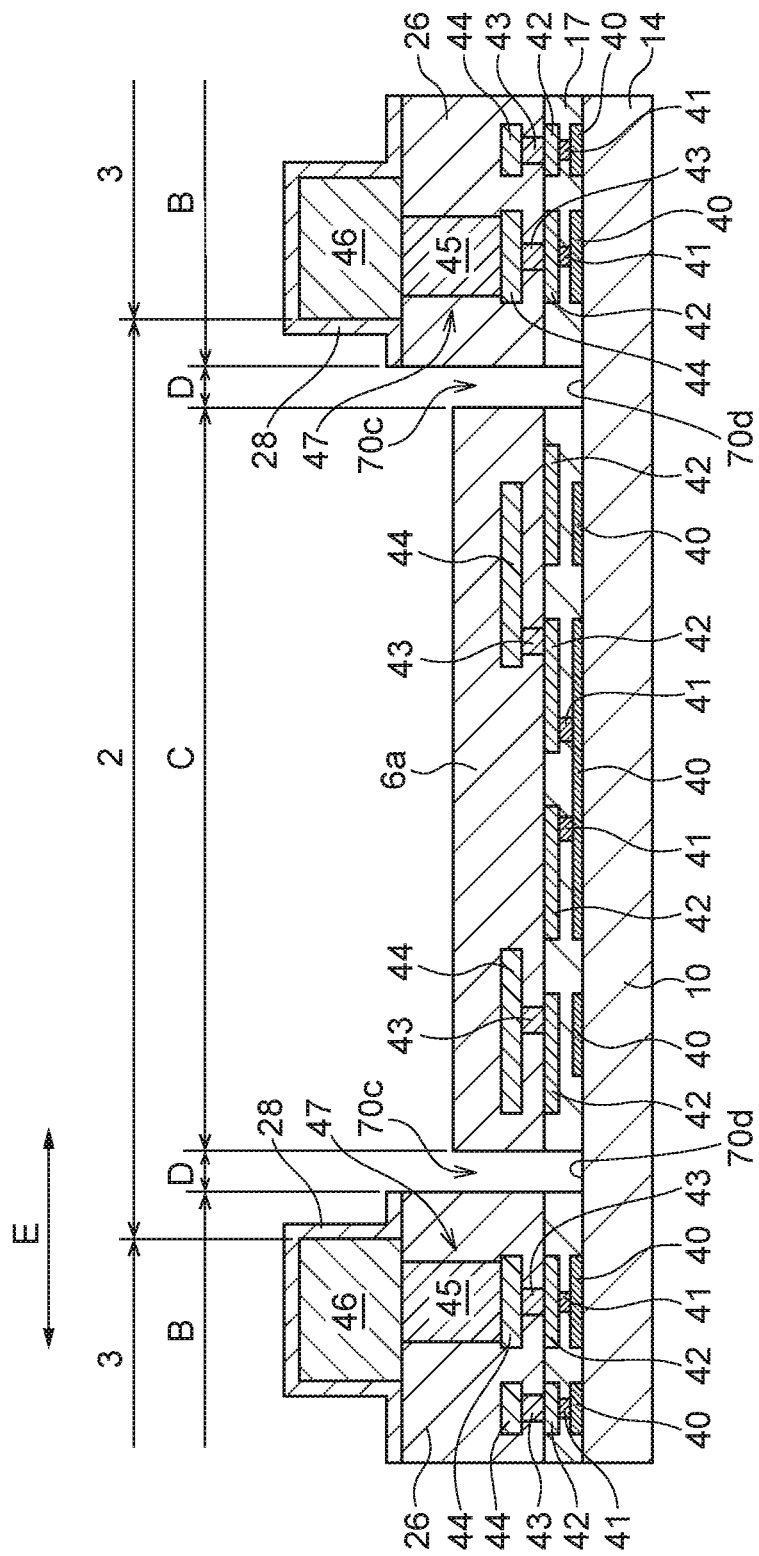
Figure 20B:
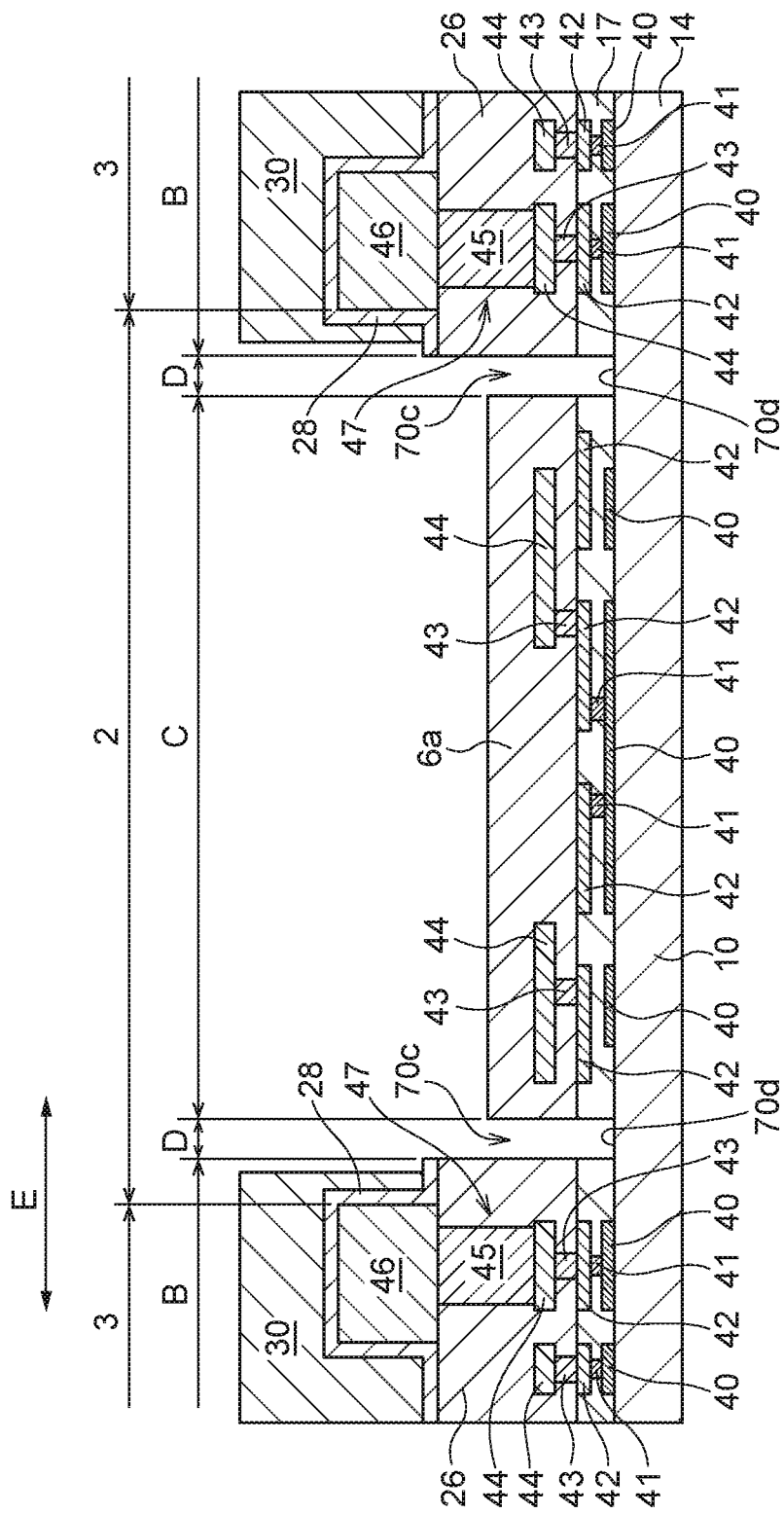

Next, as illustrated in FIGS. 19A and 19B, the photoresist pattern 55 is removed. The photoresist pattern 55 is removed by ashing using an oxygen plasma, for example. Next, as illustrated in FIGS. 20A and 20B, the polyimide film 30 is formed in the portion B. Thereafter, if the insulating film is etched using the polyimide film 30 as an etching mask, the thickness of the insulating film 6a is reduced and the insulating film 6 is formed, as illustrated in FIGS. 16A and 16B. Additionally, the groove 70 having a bottom face 70a that is deeper than the bottom face of the low-k insulating film 17 is formed. Through the above steps, the semiconductor device 1c according to the third embodiment is formed.

According to the semiconductor device 1c and the method of forming the same according to the third embodiment, effects similar to the semiconductor devices 1a and 1b as well as the methods of forming the same according to the first and second embodiments can be obtained.

Figure 21A:
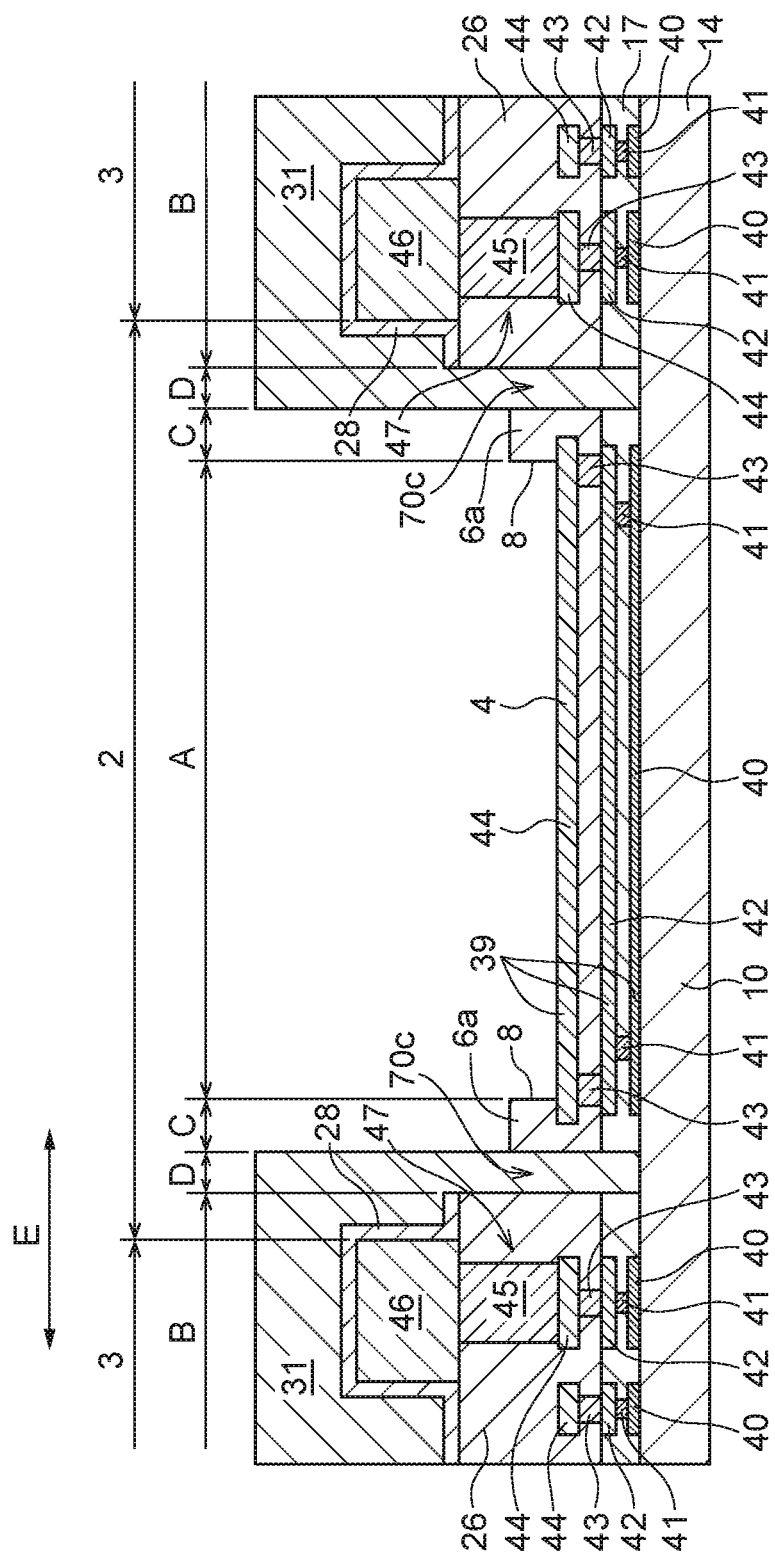
FIGS. 21A and 21B are longitudinal sections illustrating one example of a step partway through a modification of the method of forming the semiconductor device according to the third embodiment.
Figure 21B:
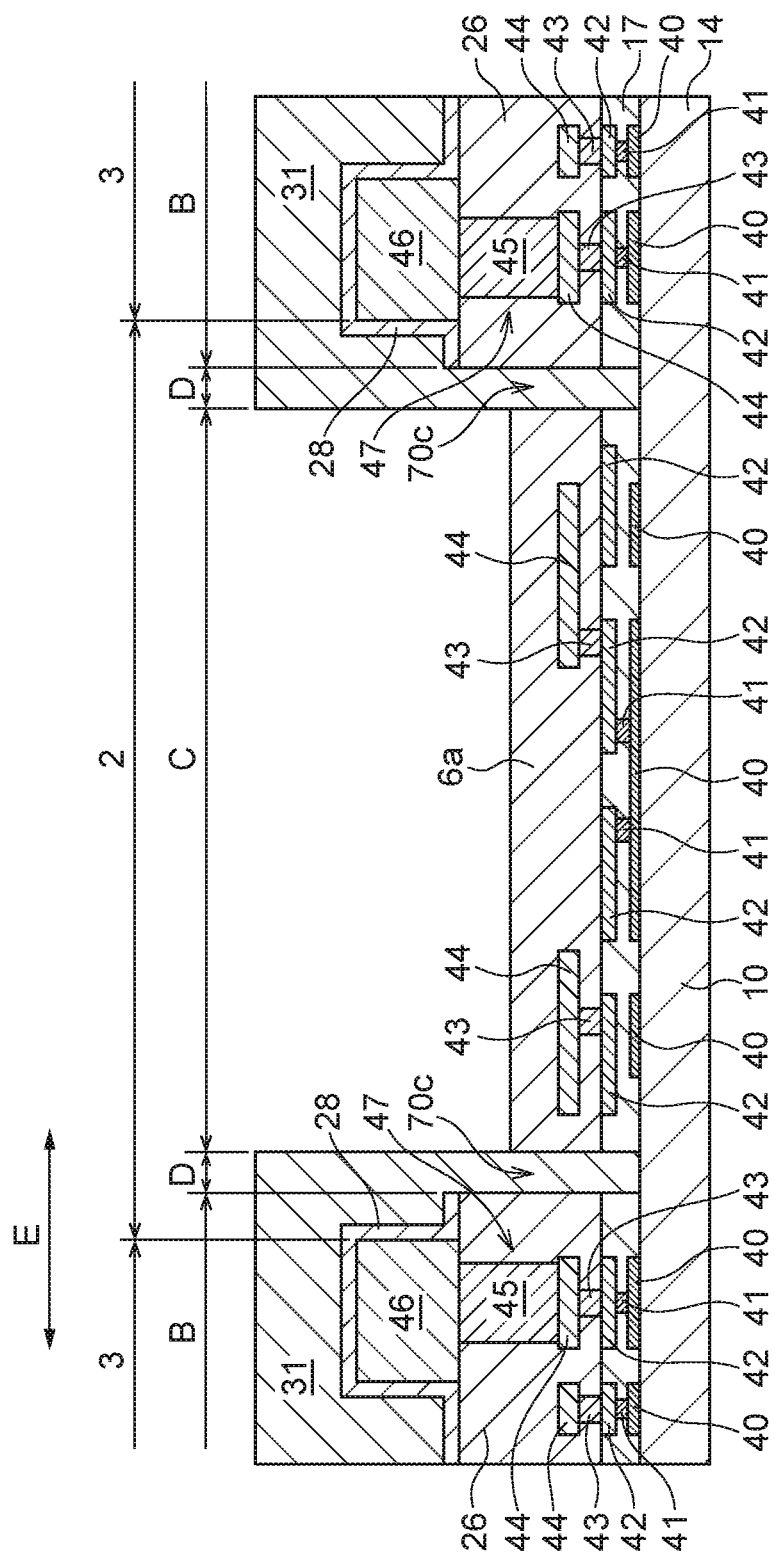

Hereinafter, FIGS. 21A, 21B, 22A, and 22B will be referenced to describe a modification of the third embodiment. FIGS. 21A and 21B illustrate a step following FIGS. 19A and 19B. The modification of the third embodiment expands the formation region of the polyimide film 30 to the groove 70c. As illustrated in FIGS. 21A and 21B, a polyimide film 31 is formed to cover the portion B and the portion D. The rest of the configuration is similar to FIGS. 20A and 20B.

Figure 22A:
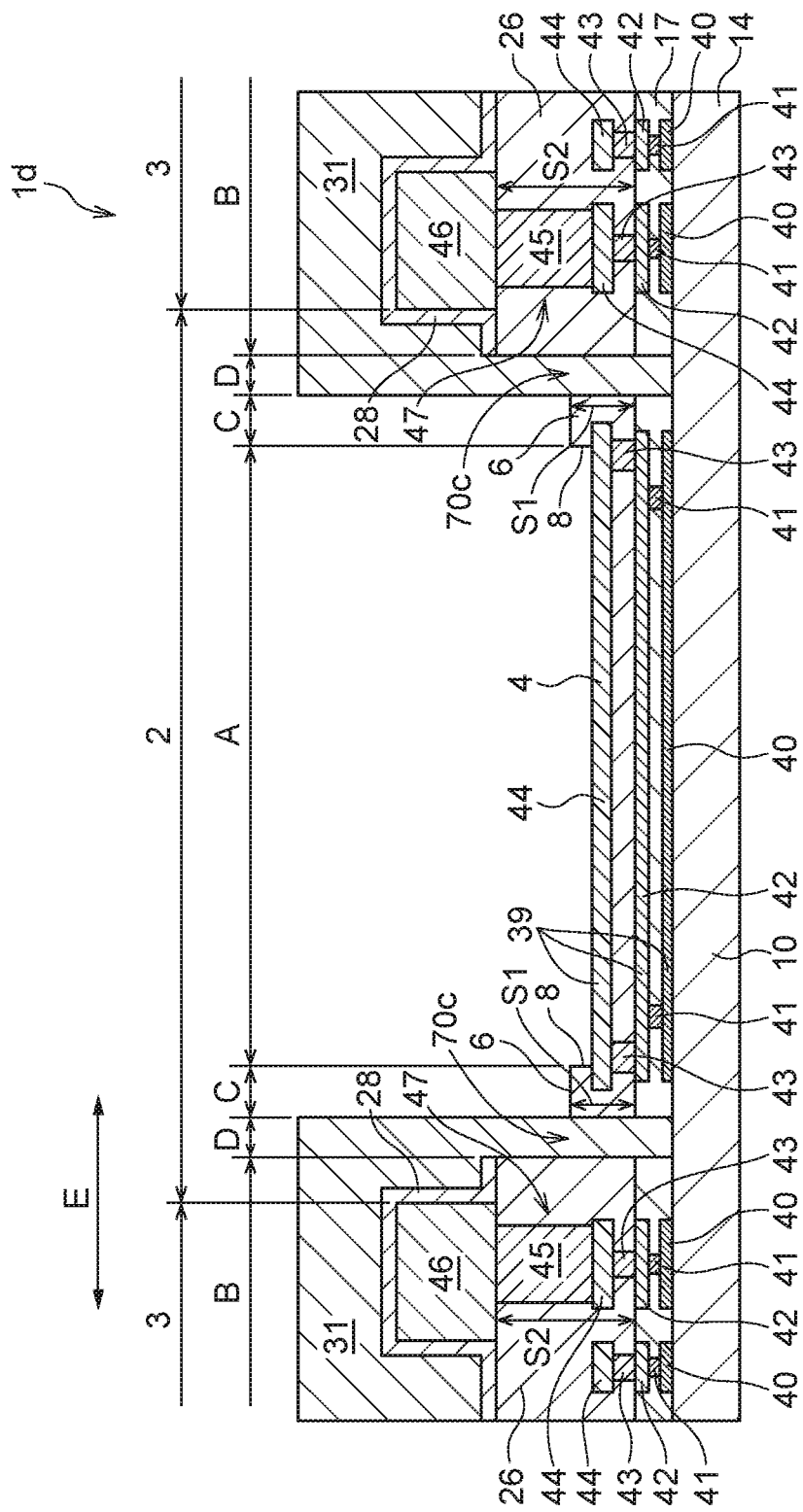
FIGS. 22A and 22B are longitudinal sections illustrating one example of a step partway through a modification of the method of forming the semiconductor device according to the third embodiment.
Figure 22B:
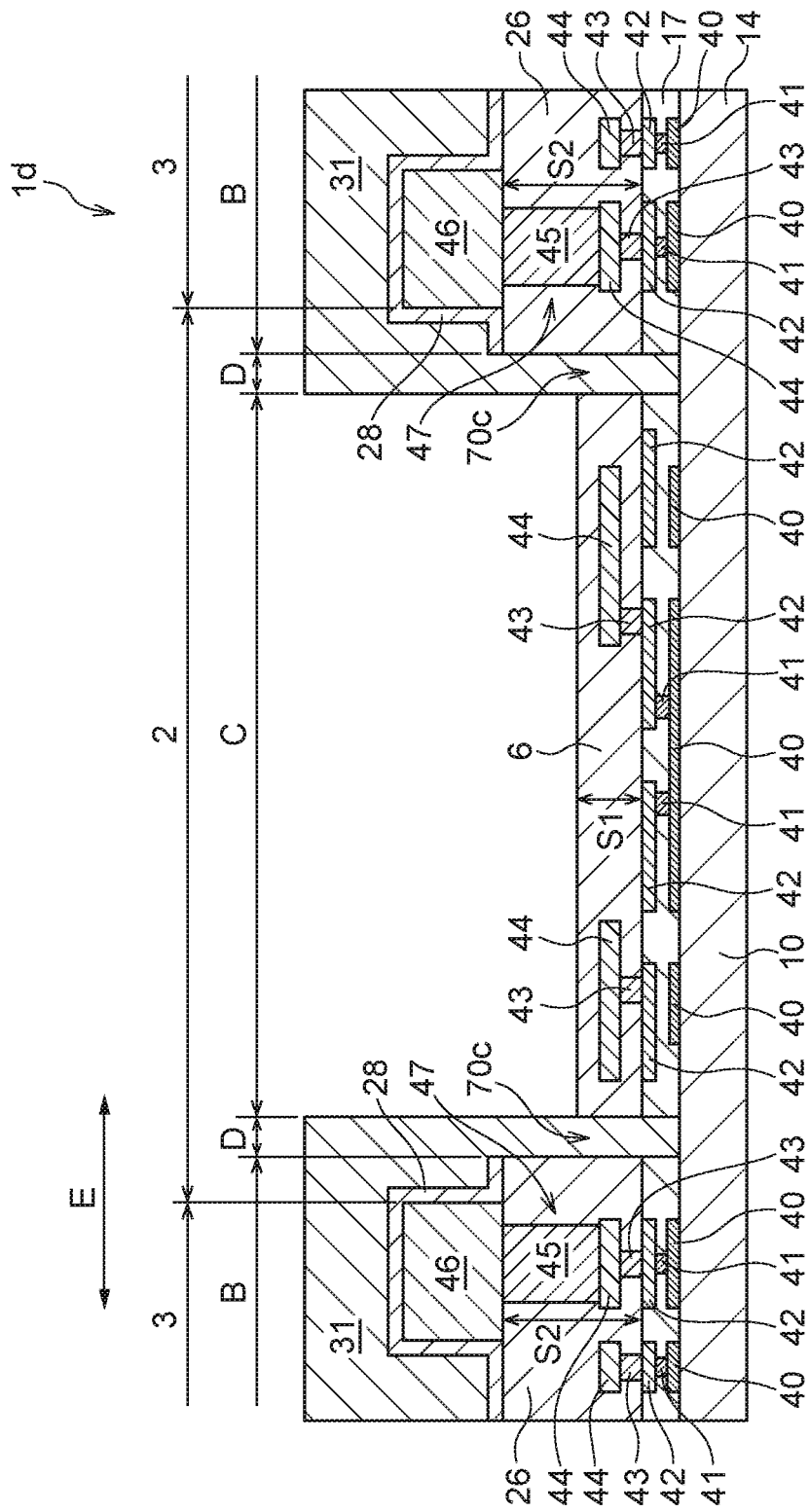

Next, as illustrated in FIGS. 22A and 22B, by etching the insulating film using the polyimide film 31 as an etching mask, the thickness of the insulating film 6a is reduced. Through the above steps, a semiconductor device 1d according to the modification of the third embodiment is formed, as illustrated in FIGS. 16A and 16B. According to the semiconductor device 1d and the method of forming the same according to the modification of the third embodiment, effects similar to the semiconductor device 1a and the method of forming the same according to the first embodiment are obtained.

Also, an extremely high exposure value is necessary in the polyimide exposure to remove the polyimide film inside the groove 70c. According to the semiconductor device 1d and the method of forming the same according to the modification of the third embodiment, by burying the polyimide film inside the groove 70c, an extremely high exposure value for removing the polyimide inside the groove 70c in the polyimide exposure is not necessary.

Fourth Embodiment

Hereinafter, a semiconductor device 1e and a method of forming the same according to a fourth embodiment will be described with reference to FIGS. 6A and 6B, FIGS. 8A to 8C, FIG. 17C, and FIGS. 23A and 23B to FIGS. 26A and 26B. Note that the items described in FIGS. 1, 2, 3, 5A, and 5B are also applied to the fourth embodiment.

Figure 23A:
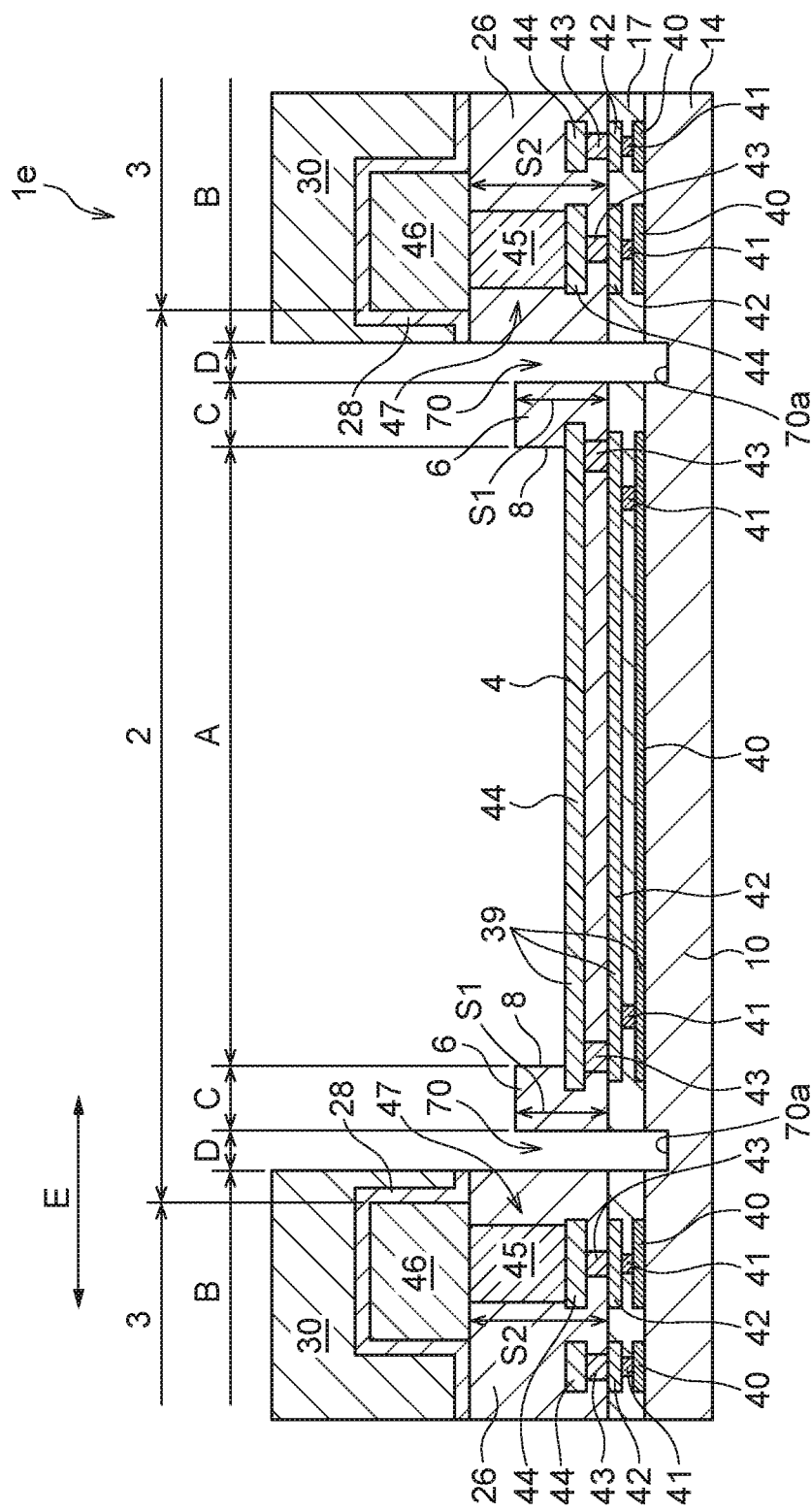
FIGS. 23A and 23B are diagrams illustrating one example of a schematic configuration of a scribe portion of a semiconductor device according to a fourth embodiment.
Figure 23B:
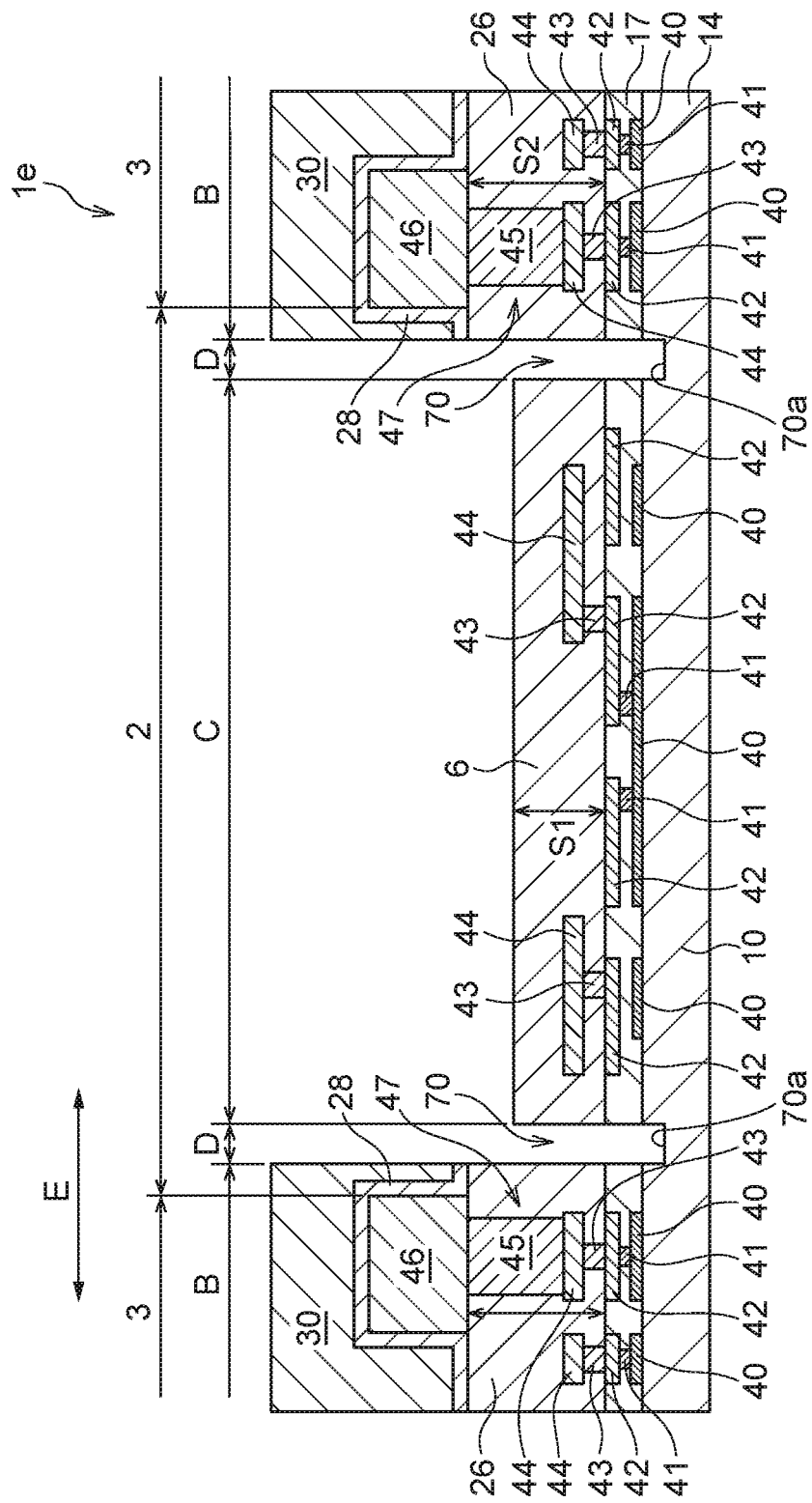

As illustrated in FIGS. 23A and 23B, the configuration of the semiconductor device 1e according to the fourth embodiment is similar to the semiconductor device 1c according to the third embodiment.

Next, a method of forming the semiconductor device 1e according to the fourth embodiment will be described with reference to FIGS. 23A and 23B to FIGS. 26A and 26B, FIGS. 6A and 6B, and FIGS. 8 and 8A to 8C. In the description of the fourth embodiment, the sign 55c is used to refer to a second opening 55c.

Figure 24A:
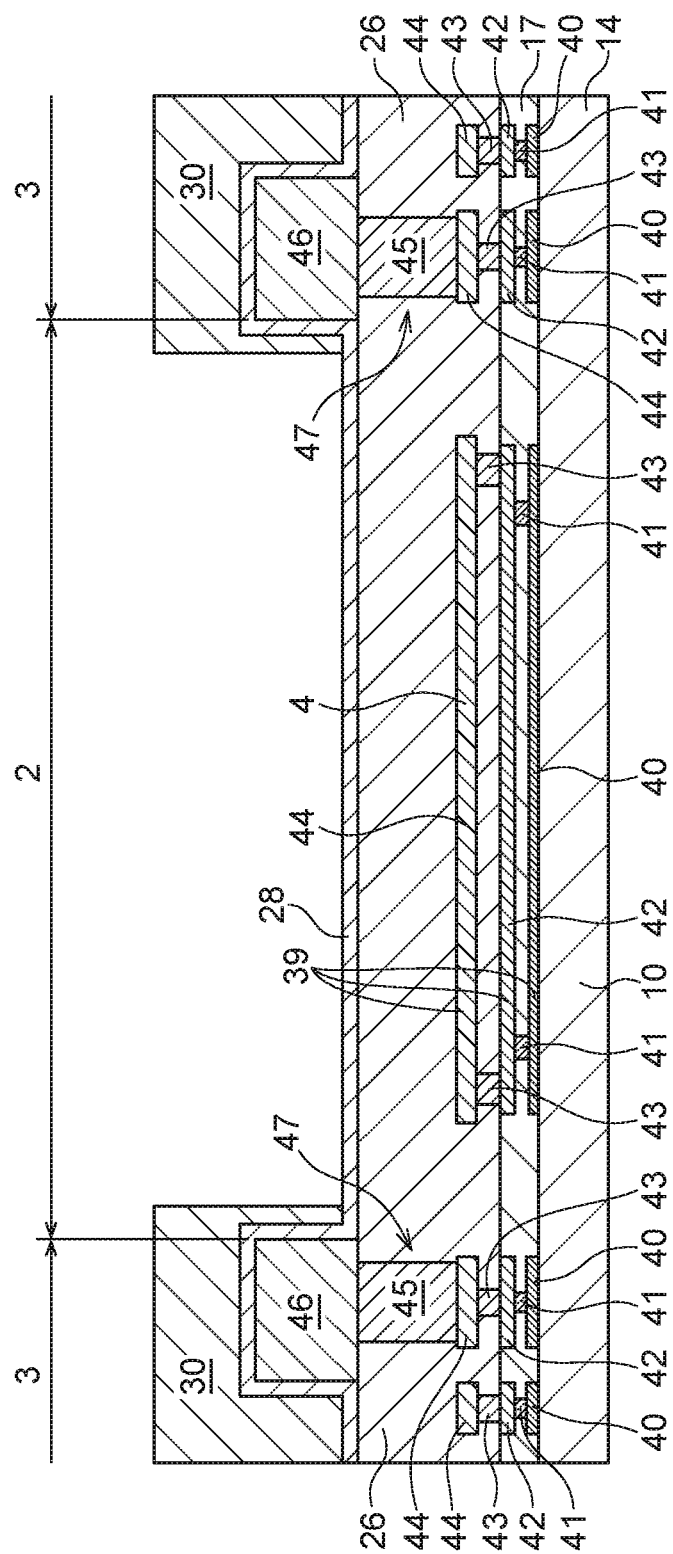
FIGS. 24A and 24B are longitudinal sections illustrating one example of a step partway through a method of forming the semiconductor device according to the fourth embodiment.
Figure 24B:
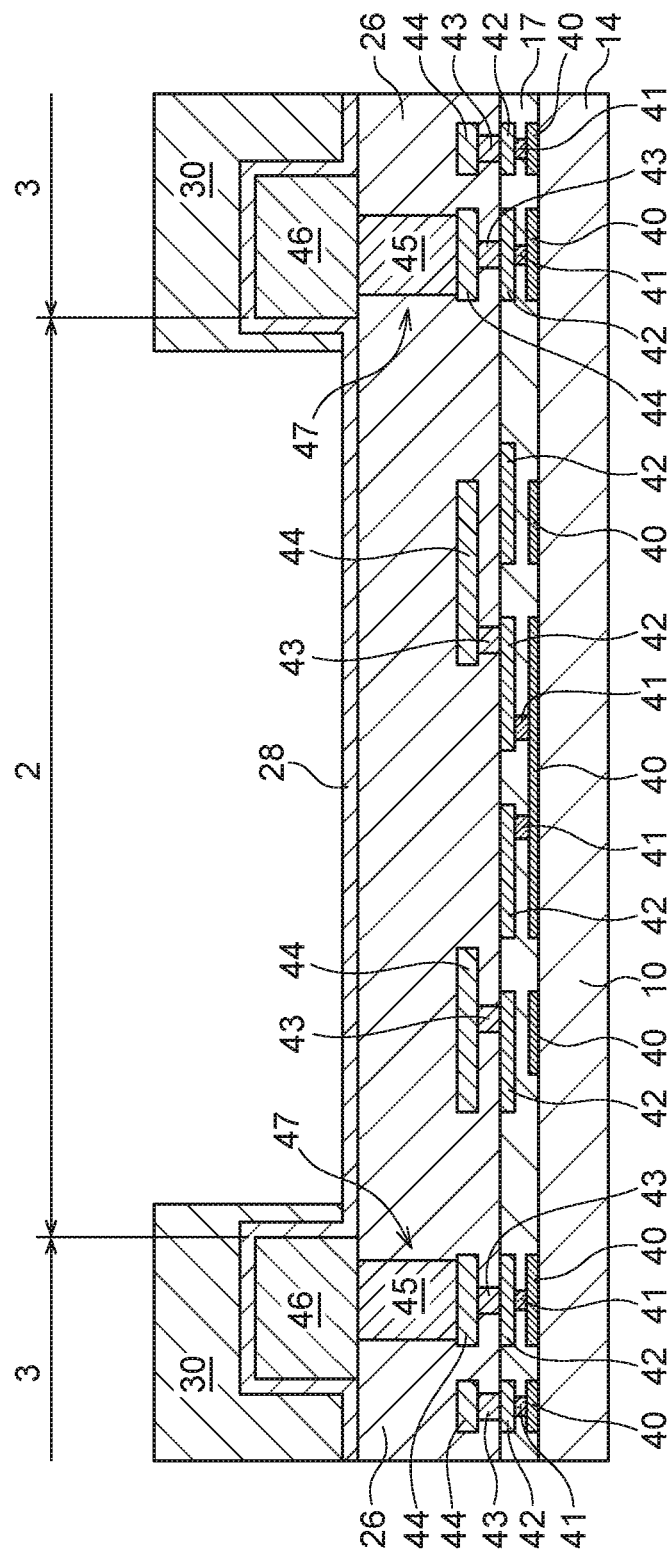

First, the step illustrated in FIGS. 6A and 6B is performed similarly to the first embodiment. Next, as illustrated in FIGS. 24A and 24B, the polyimide film 30 is formed to cover the stacked structure 47 and the main circuit portions 3. The method of forming the polyimide film 30 is similar to the first embodiment.

Figure 25A:
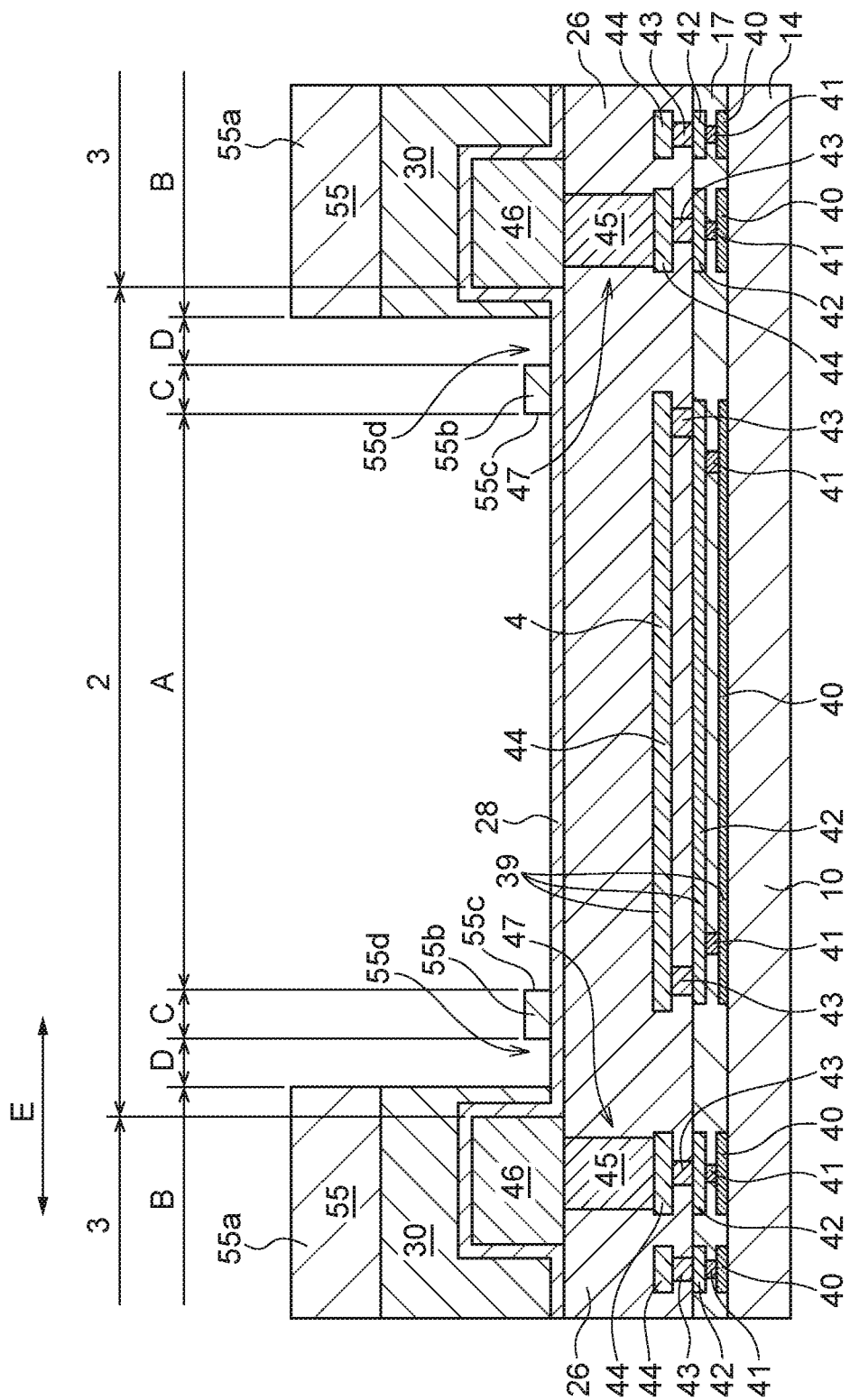
FIGS. 25A and 25B are longitudinal sections illustrating one example of a step partway through a method of forming the semiconductor device according to the fourth embodiment.
Figure 25B:
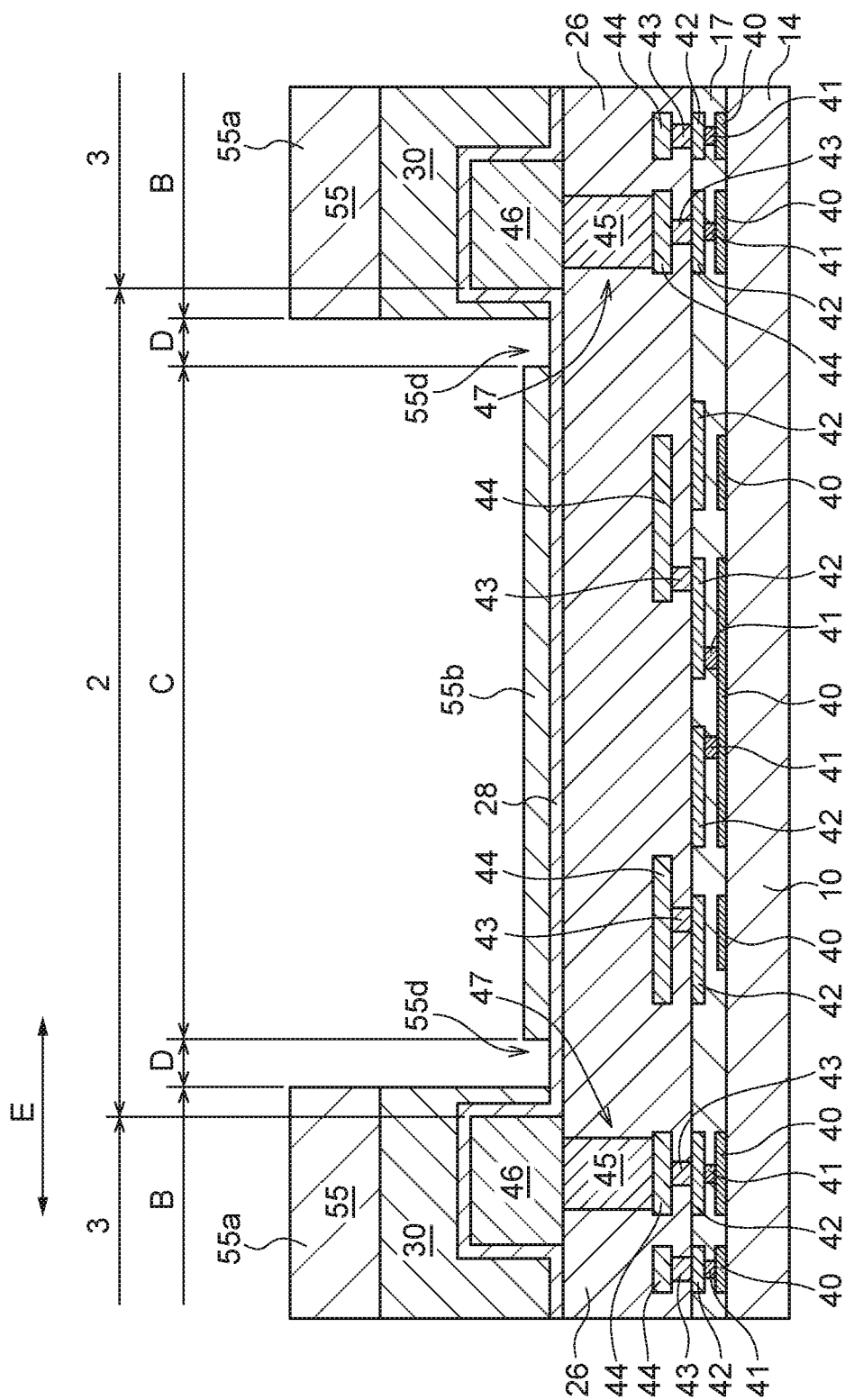

Next, as illustrated in FIGS. 25A and 25B, the photoresist pattern 55 covering the portions B and C is formed. The photoresist pattern 55 is provided with the photoresist pattern 55a having a large resist thickness and the photoresist pattern 55b having a small resist thickness. The photoresist pattern 55 is provided with a first opening 55d between the photoresist pattern 55a and the photoresist pattern 55b. In addition, the photoresist pattern 55 is provided with a second opening 55c. The photoresist pattern 55 contains a negative photosensitive resin, for example. The first opening 55d corresponds to the groove 70. The second opening 55c corresponds to the opening 8 on the metal pads 4.

In the lithography step illustrated in FIGS. 25A and 25B, a photomask 67 provided with the portions A1, B1, and C1 illustrated in FIG. 17C is used as an exposure mask. The configuration of the photomask 67 is similar to the photomask 67 in the third embodiment.

As illustrated in FIGS. 25A and 25B, FIG. 17C, and FIGS. 8A to 8C, the portion A1 of the photomask 67 is disposed in correspondence with the portion A where the opening 8 is formed and the portion D where the groove 70 is formed on the semiconductor substrate 14. Because light is shaded by the portion A1 of the photomask 67, the portion A where the opening 8 is formed and the portion D where the groove 70 is formed are not irradiated with light. For this reason, the photoresist pattern 55 is not formed, and the first opening 55d and the second opening 55c are formed.

The portion B1 of the photomask 67 is disposed in correspondence with the portion B of the semiconductor substrate 14. In the portion B, the light passing through the portion B1 of the photomask 67 is not reduced, and therefore the exposure value increases and the photoresist pattern 55a having the larger thickness is formed. The portion C1 of the photomask 67 is disposed in correspondence with the portion C of the semiconductor substrate 14. In the portion C, the exposure value is smaller because of the reduction in the transmitted light, and therefore the photoresist pattern 55b having the thickness that is smaller than the thickness of the photoresist pattern 55a is formed.

Figure 26A:
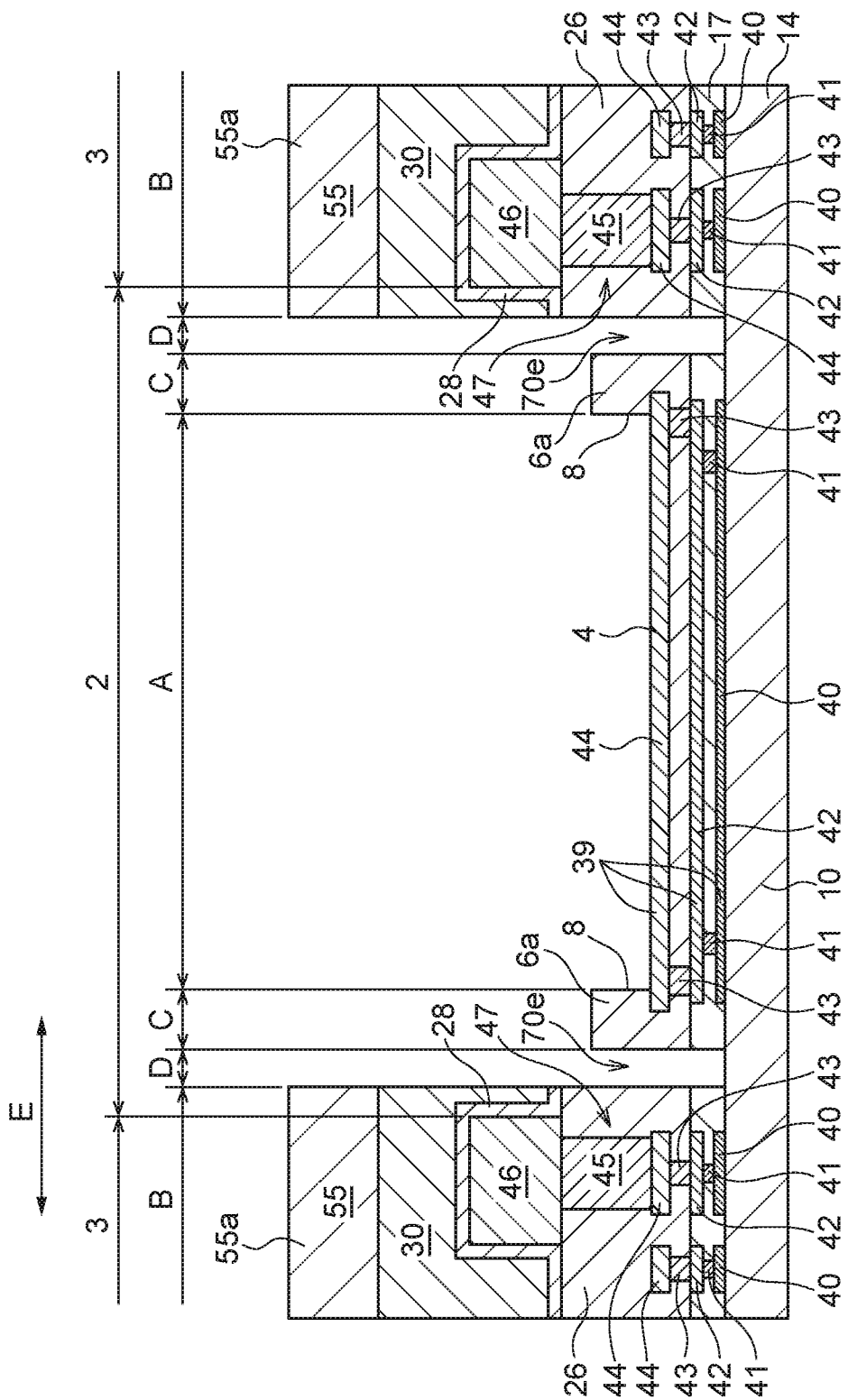
FIGS. 26A and 26B are longitudinal sections illustrating one example of a step partway through a method of forming the semiconductor device according to the fourth embodiment.
Figure 26B:
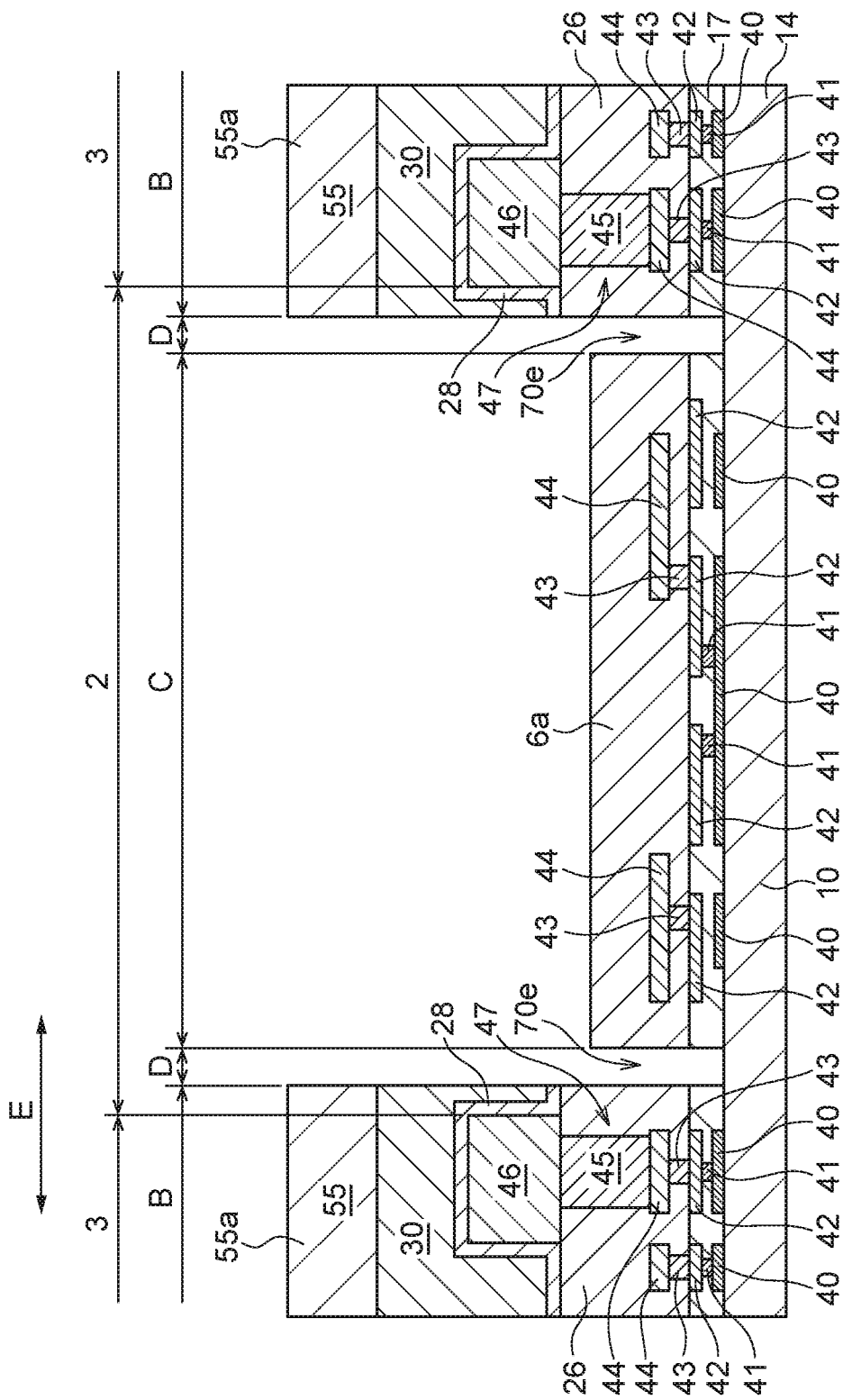

Next, as illustrated in FIGS. 26A and 26B, anisotropic dry etching is performed on the insulating film 28 and the insulating film 26 using the photoresist pattern 55 as an etching mask. Because the resist that acts as the etching mask does not exist in the portion D, the insulating film 28, the insulating film 26, and the low-k insulating film 17 are successively etched. The etching is performed such that the film material is etched away to the bottom face of the low-k insulating film 17. In this way, a groove 70d reaching the bottom face of the low-k insulating film 17 is formed in the portion D.

Because the resist that acts as the etching mask does not exist in the portion A, the etching of the insulating film 28 and the insulating film 26 advances. At this time, the etching advances little or not at all on the metal pads 4. For this reason, the etching ends in a state in which the insulating film 26 on the metal pads 4 has been removed, leaving the top surface of the metal pads 4 exposed. Because the photoresist pattern 55b is less thick in the portion C, the photoresist pattern 55b is eliminated partway through the etching. In the portion C, the etching of the insulating film 28 and the insulating film 26 does not advance while the photoresist pattern 55b exists. After the photoresist pattern 55b is eliminated, the insulating film 28 and the insulating film 26 in the portion C are etched, and the insulating film 6a that is thinner than the insulating film 26 in the portion B is formed.

Next, as illustrated in FIGS. 26A and 26B, the photoresist pattern 55 is removed. The photoresist pattern 55 is removed by a solvent such as thinner after a plasma treatment with a gas containing oxygen, for example. Thereafter, the insulating film is etched using the polyimide film 30 as an etching mask. Through the above steps, the thickness of the insulating film 6a is reduced and the insulating film 6 is formed, as illustrated in FIGS. 23A and 23B. Additionally, the groove 70 having a bottom face 70a that is deeper than the bottom face of the low-k insulating film 17 is formed. Through the above steps, the semiconductor device 1e according to the fourth embodiment is formed.

According to the semiconductor device 1e and the method of forming the same according to the fourth embodiment, effects similar to the semiconductor device 1a and the method of forming the same according to the first embodiment can be obtained.

In the plurality of embodiments described above, a case of using a negative photoresist is given as an example, but a positive photoresist can also be used. In the case of using a positive photoresist, the light and dark patterns of the photomasks 66 and 67 used as the exposure masks are inverted.

As above, DRAM is described as an example of the semiconductor device according to various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device. Furthermore, devices other than memory, including logic ICs such as a microprocessor and an application-specific integrated circuit (ASIC) for example are also applicable as the semiconductor device according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A semiconductor device, comprising:
a semiconductor substrate; and
a multilevel wiring structure on the semiconductor substrate, the multilevel wiring structure including at least an intermediate metal layer over the semiconductor substrate and an uppermost metal layer over the intermediate metal layer, and the multilevel wiring structure being divided into a main circuit portion and a scribe portion surrounding the main circuit portion, wherein
the intermediate metal layer comprises:
a plurality of wiring layers stacked on each other, the plurality of wiring layers comprising a first metal wiring layer, a second metal wiring layer, and a third metal wiring layer,
a plurality of low-k insulating films between at least some of the wiring layers of the intermediate metal layer, wherein the plurality of low-k insulating films comprises:
a first interlayer insulating film between the first metal wiring layer and the second metal wiring layer, and
a second interlayer insulating film between the second metal wiring layer and the third metal wiring layer, and wherein
the scribe portion of the multilevel wiring structure includes at least a metal pad included and exposed in an uppermost wiring layer of the intermediate metal layer, and wherein
the uppermost metal layer over the intermediate metal layer is a redistribution layer, and the metal pad included and exposed in the uppermost wiring layer of the intermediate metal layer is not covered by the redistribution layer.

2. The semiconductor device of claim 1, further comprising a groove in the scribe portion, the groove disposed between the metal pad and the main circuit portion in the scribe portion.

3. The semiconductor device of claim 2, wherein
the groove penetrates at least through the plurality of low-k insulating films.

4. The semiconductor device of claim 3, wherein a bottom face of the groove is positioned below a bottom face of the plurality of low k insulating films.

5. The semiconductor device of claim 3, wherein the groove reaches a bottom face of the plurality of low k insulating films.

6. The semiconductor device of claim 1, wherein at least one of the wiring layers of the intermediate metal layer comprises copper.

7. The semiconductor device of claim 1, further comprising a stacked structure arranged in the main circuit portion along a boundary with the scribe portion, the stacked structure including the intermediate metal layer and the uppermost metal layer.

8. The semiconductor device of claim 1, further comprising an insulating film covering the plurality of low-k insulating films over the scribe portion and the main circuit portion, wherein
a thickness of the insulating film of the scribe portion is smaller than a thickness of the insulating film of the main circuit portion.

9. The semiconductor device of claim 8, wherein the uppermost metal layer is over the insulating film of the main circuit portion.

10. A semiconductor device, comprising:
a semiconductor substrate; and
a multilevel wiring structure on the semiconductor substrate, the multilevel wiring structure including at least an intermediate metal layer over the semiconductor substrate and an uppermost metal layer over the intermediate metal layer, the multilevel wiring structure being divided into a main circuit portion and a scribe portion surrounding the main circuit portion, wherein
the intermediate metal layer includes at least first, second and third wiring layers on top of each other with connecting portions therebetween, the third wiring layer being an uppermost layer exposed in the scribe portion of the multilevel wiring structure, a plurality of low-k insulating films including a first interlayer insulating film between the first wiring layer and the second wiring layer, and a second interlayer insulating film between the second wiring layer and the third wiring layer, and
the exposed uppermost layer includes a metal pad exposed on a surface thereof, and
the uppermost metal layer over the intermediate metal layer is a redistribution layer, and the exposed metal pad on the surface of the exposed uppermost layer of the intermediate metal layer is not covered by the redistribution layer.

11. The semiconductor device of claim 10, further comprising a groove between the metal pad and the main circuit portion in the scribe portion, the groove penetrating at least the plurality of low-k insulating films.

12. The semiconductor device of claim 10, further comprising an insulating film over the plurality of low-k insulating films in the scribe portion and the main circuit portion, wherein
a first portion of the insulating film in the scribe portion is thinner in size than a second portion of the insulating film in the main circuit portion.

13. The semiconductor device of claim 12, wherein the first portion covers at least a peripheral portion of the metal pad.

14. The semiconductor device of claim 10, further comprising a stacked structure in the main circuit portion along a boundary with the scribe portion, the stacked structure including at least part of the intermediate metal layer and the uppermost metal layer.

* * * * *